US010592810B2

(12) United States Patent
Blair et al.

(10) Patent No.: US 10,592,810 B2
(45) Date of Patent: Mar. 17, 2020

(54) SELECTING A WINDOW TREATMENT FABRIC

(71) Applicant: Lutron Technology Company LLC, Coopersburg, PA (US)

(72) Inventors: Edward J. Blair, Telford, PA (US); Samuel F. Chambers, Gwynedd Valley, PA (US); Laura M. Gabriel, Harleysville, PA (US); Michelle L. Greene, Bethlehem, PA (US); Andrew J. Lawler, Macungie, PA (US); Joseph Roy Parks, Emmaus, PA (US); Brent Protzman, Easton, PA (US); Staci L. Quirk, Oxford, NJ (US)

(73) Assignee: Lutron Technology Company LLC, Coopersburg, PA (US)

( * ) Notice: Subject to any disclaimer, the term of this patent is extended or adjusted under 35 U.S.C. 154(b) by 1081 days.

(21) Appl. No.: 14/677,937

(22) Filed: Apr. 2, 2015

(65) Prior Publication Data

US 2015/0286939 A1    Oct. 8, 2015

Related U.S. Application Data

(60) Provisional application No. 61/973,959, filed on Apr. 2, 2014, provisional application No. 62/002,666, filed on May 23, 2014.

(51) Int. Cl.
*G06F 19/00* (2018.01)
*G06N 5/04* (2006.01)
(Continued)

(52) U.S. Cl.
CPC ............... *G06N 5/04* (2013.01); *E06B 9/24* (2013.01); *E06B 9/68* (2013.01); *G05B 15/02* (2013.01);
(Continued)

(58) Field of Classification Search
CPC combination set(s) only.
See application file for complete search history.

(56) References Cited

U.S. PATENT DOCUMENTS 4,902,953 A * 2/1990 Kraft .................... E06B 9/32
160/DIG. 17
5,248,919 A   9/1993 Hanna et al.
(Continued)

FOREIGN PATENT DOCUMENTS

CN         103370490 A     10/2013

OTHER PUBLICATIONS

Textinergie—Energy Savings with Textile Blinds; 2008.
(Continued)

*Primary Examiner* — Kidest Bahta
(74) *Attorney, Agent, or Firm* — Condo Roccia Koptiw LLP

(57) ABSTRACT

A fabric selection tool provides an automated procedure for recommending and/or selecting a fabric for a window treatment to be installed in a building. The recommendation may be made to optimize the performance of the window treatment in which the fabric may be installed. The recommended fabric may be selected based on performance metrics associated with each fabric in an environment. The fabrics may be ranked based upon the performance metrics of one or more of the fabrics. One or more of the fabrics, and/or their corresponding ranks, may be displayed to a user for selection. The recommended fabrics may be determined based on combinations of fabrics that provide performance metrics for various façades of the building. Using the ranking system provided by the fabric selection tool, the user may obtain a fabric sample and/or order one or more of the recommended fabrics.

40 Claims, 23 Drawing Sheets

(51) Int. Cl.
    *E06B 9/24*     (2006.01)
    *G06F 17/50*     (2006.01)
    *E06B 9/68*     (2006.01)
    *G05B 15/02*     (2006.01)
    *G06N 7/00*     (2006.01)
    *E06B 9/32*     (2006.01)

(52) U.S. Cl.
    CPC ......... *G06F 17/5009* (2013.01); *G06N 7/005* (2013.01); *E06B 9/32* (2013.01); *E06B 2009/6809* (2013.01); *E06B 2009/6818* (2013.01); *E06B 2009/6827* (2013.01); *Y02T 10/82* (2013.01)

(56) References Cited

U.S. PATENT DOCUMENTS

| | | | |
|---|---|---|---|
| 5,275,219 A * | 1/1994 | Giacomel | E06B 9/307 |
| | | | 160/176.1 R |
| 7,391,297 B2 | 6/2008 | Cash et al. | |
| 7,684,022 B2 | 3/2010 | Berman et al. | |
| 8,009,042 B2 | 8/2011 | Steiner et al. | |
| 8,199,010 B2 | 6/2012 | Sloan et al. | |
| 8,228,184 B2 | 7/2012 | Blakeley et al. | |
| 8,255,282 B2 | 8/2012 | Hathaway et al. | |
| 8,288,981 B2 * | 10/2012 | Zaharchuk | E05F 17/00 |
| | | | 318/285 |
| 8,319,956 B2 | 11/2012 | Berman et al. | |
| 8,410,706 B2 | 4/2013 | Steiner et al. | |
| 8,417,388 B2 | 4/2013 | Altonen et al. | |
| 8,438,071 B2 | 5/2013 | Hathaway et al. | |
| 8,451,116 B2 | 5/2013 | Steiner et al. | |
| 8,482,724 B2 | 7/2013 | Berman et al. | |
| 8,620,766 B2 | 12/2013 | Spellich et al. | |
| 9,194,167 B2 | 11/2015 | Gassion | |
| 9,679,696 B2 | 6/2017 | Bhutani et al. | |
| 9,754,076 B2 | 9/2017 | Biegert et al. | |
| 9,773,274 B2 * | 9/2017 | Curry | G06Q 30/0643 |
| 2005/0091008 A1 * | 4/2005 | Green | G06Q 99/00 |
| | | | 703/1 |
| 2005/0110416 A1 | 5/2005 | Veskovic | |
| 2006/0184884 A1 * | 8/2006 | Chaturvedi | G06Q 10/10 |
| | | | 715/751 |
| 2006/0185799 A1 * | 8/2006 | Kates | E06B 9/32 |
| | | | 160/5 |
| 2006/0207730 A1 | 9/2006 | Berman et al. | |
| 2007/0291252 A1 * | 12/2007 | Berman | E06B 9/32 |
| | | | 356/73 |
| 2008/0092075 A1 | 4/2008 | Jacob et al. | |
| 2009/0206983 A1 | 8/2009 | Knode et al. | |
| 2010/0157427 A1 * | 6/2010 | Berman | E06B 9/32 |
| | | | 359/597 |
| 2011/0035061 A1 | 2/2011 | Altonen et al. | |
| 2011/0203754 A1 * | 8/2011 | Mullet | E06B 9/42 |
| | | | 160/405 |
| 2013/0030589 A1 | 1/2013 | Pessina et al. | |
| 2013/0057937 A1 | 3/2013 | Berman et al. | |
| 2013/0075050 A1 | 3/2013 | Colledge | |
| 2013/0275174 A1 | 10/2013 | Bennett et al. | |
| 2014/0209254 A1 | 7/2014 | Birru et al. | |
| 2014/0249830 A1 | 9/2014 | Gallopyn et al. | |
| 2014/0262057 A1 | 9/2014 | Chambers et al. | |
| 2014/0265568 A1 | 9/2014 | Crafts et al. | |
| 2015/0066539 A1 | 3/2015 | Sheffer et al. | |
| 2015/0286941 A1 | 10/2015 | Blair et al. | |
| 2016/0210427 A1 | 7/2016 | Mynhier et al. | |
| 2016/0321426 A1 | 11/2016 | Bhatt et al. | |
| 2016/0350487 A1 | 12/2016 | Plunkett et al. | |
| 2017/0116388 A1 | 4/2017 | Robinson | |
| 2017/0293270 A1 | 10/2017 | Marik et al. | |

OTHER PUBLICATIONS

Solar Shading for Low Energy Buildings; European Solar Shading Organization; Feb. 2012 Edition 1.
Study on Three-Dimensional Simulated Display of Realistic Woven Fabrics, 40 pages.

* cited by examiner

Fig. 4

| Selections | LOCATION | | SUNNY HOURS | FACADE ORIENTATION | | BUFFER ZONE | | WINDOW SIZE | | GLASS TYPE | | SPACE TYPE | | | ROOM COLORS |
|---|---|---|---|---|---|---|---|---|---|---|---|---|---|---|---|
| | LAT deg | LON deg | hrs | Selections | ORIENTATION deg | Selections | ft | Selections | WWR % | Selections | Tv % | Selections | MAX DGP % | DGP HOURS % | Selections |
| Atlanta, GA | 33.8 | 84.4 | 2638 | North | 0 | No aisle | 2 | Curtain wall | 90% | Single pane (clear) | 70% | Office area | 30% | 0 | Bright 3 |
| Portland, OR | 45.5 | 122.7 | 2341 | South | 180 | Small aisle | 4 | Mostly glass | 70% | Double pane (clear) | 60% | Transition area | 35% | 0 | Medium 2 |
| Helena, MT | 46.6 | 112 | 2584 | East | 90 | Large aisle | 6 | Half glass | 50% | Triple pane (clear) | 50% | Social area | 35% | 32.6% | Dark 1 |
| Salt Lake City, UT | 40.8 | 111.9 | 3029 | West | -90 | MAX input | 10 | Some glass | 30% | Medium tint | 30% | MAX input | 45% | 0 | |
| Las Vegas, NV | 36 | 115.2 | 3825 | Northeast | 45 | MIN input | 0 | MAX input | 100% | High tint | 20% | MIN input | 30% | 0 | |
| Albuquerque, NM | 35.1 | 106.6 | 3329 | Northwest | -45 | | | MIN input | 10% | MAX input | 100% | | | | |
| El Paso, TX | 31.8 | 106.4 | 3679 | Southeast | -135 | | | | | MIN input | 5% | | | | |
| Bismarck, ND | 46.8 | 100.8 | 2584 | Southwest | 135 | | | | | | | | | | |
| Omaha, NE | 41.3 | 96 | 2628 | MAX input | 180 | | | | | | | | | | |
| Duluth, MN | 46.8 | 92.1 | 2278 | MIN input | -179 | | | | | | | | | | |
| San Antonio, TX | 29.4 | 98.5 | 2629 | | | | | | | | | | | | |
| Fort Worth, TX | 32.8 | 97.3 | 2672 | | | | | | | | | | | | |
| St. Louis, MO | 38.6 | 90.2 | 2594 | | | | | | | | | | | | |
| Detroit, MI | 42.3 | 83 | 2436 | | | | | | | | | | | | |
| Jackson, MS | 32.3 | 90.2 | 2678 | | | | | | | | | | | | |
| Columbus, OH | 40 | 83 | 2183 | | | | | | | | | | | | |
| Nashville, TN | 36.2 | 86.8 | 2510 | | | | | | | | | | | | |
| Tallahassee, FL | 30.5 | 84.3 | 2800 | | | | | | | | | | | | |
| Buffalo, NY | 42.9 | 78.8 | 2207 | | | | | | | | | | | | |
| Columbia, SC | 34 | 81 | 2803 | | | | | | | | | | | | |
| Boston, MA | 42.4 | 71 | 2634 | | | | | | | | | | | | |
| Billings, MT | 45.8 | 108.5 | 2628 | | | | | | | | | | | | |
| Boise, ID | 43.6 | 116.2 | 2803 | | | | | | | | | | | | |
| Chicago, IL | 41.8 | 87.6 | 2365 | | | | | | | | | | | | |
| Denver, CO | 39.7 | 105 | 3022 | | | | | | | | | | | | |
| Houston, TX | 29.8 | 95.4 | 2584 | | | | | | | | | | | | |
| Kansas City, MO | 39.1 | 94.6 | 2628 | | | | | | | | | | | | |
| Los Angeles, CA | 34 | 118.3 | 3197 | | | | | | | | | | | | |
| Miami, FL | 25.8 | 80.2 | 3066 | | | | | | | | | | | | |
| Minneapolis, MN | 45 | 93.3 | 2540 | | | | | | | | | | | | |
| New York, NY | 40.7 | 73.9 | 2540 | | | | | | | | | | | | |
| Phoenix, AZ | 33.6 | 112 | 3723 | | | | | | | | | | | | |
| Richmond, VA | 38.9 | 77.4 | 2759 | | | | | | | | | | | | |
| San Francisco, CA | 37.8 | 122.4 | 2891 | | | | | | | | | | | | |
| Seattle, WA | 47.6 | 122.3 | 2059 | | | | | | | | | | | | |
| MAX input | 90 | 180 | 4380 | | | | | | | | | | | | |
| MIN input | -90 | -180 | 0 | | | | | | | | | | | | |

SELECTING A WINDOW TREATMENT FABRIC

CROSS-REFERENCE TO RELATED APPLICATIONS

This application claims the benefit of U.S. Provisional Application No. 61/973,959, filed Apr. 2, 2014, and U.S. Provisional Application No. 62/002,666, filed on May 23, 2014, both of which are incorporated by reference herein in their entireties.

This application is related to commonly assigned U.S. patent application Ser. No. 14/677,936, filed Apr. 2, 2015, entitled SELECTING A WINDOW TREATMENT FABRIC, issued as U.S. Pat. No. 10,037,492 on Jul. 31, 2018; commonly assigned U.S. patent application Ser. No. 14/677,941, filed Apr. 2, 2015, entitled SELECTING A WINDOW TREATMENT FABRIC, issued as U.S. Pat. No. 10,032,112 on Jul. 24, 2018; and commonly assigned U.S. patent application Ser. No. 14/677,939, filed Apr. 2, 2015, entitled SELECTING A WINDOW TREATMENT FABRIC, issued as U.S. Pat. No. 10,043,132 on Aug. 7, 2018, the contents of each are hereby incorporated by reference herein in their entireties.

BACKGROUND

A typical window treatment, such as a roller shade, a drapery, a roman shade, and/or a venetian blind, may be mounted in front of a window or opening to control an amount of light that may enter a user environment and/or to provide privacy. A covering material (e.g., a shade fabric) on the window treatment may be adjusted to control the amount of daylight from entering the user environment and/or to provide privacy. The covering material may be manually controlled and/or automatically controlled using a motorized drive system to provide energy savings and/or increased comfort for occupants. For example, the covering material may be raised to allow light to enter the user environment and allow for reduced use of lighting systems. The covering material may also be lowered to reduce the occurrence of sun glare.

While current window treatments may be adjusted to provide energy savings and/or increased comfort for occupants, the type of fabric or covering material selected for installation with the window treatment is generally given little to no consideration. Instead, fabrics or covering materials are generally selected based solely on visual aesthetics.

SUMMARY

As described herein, a fabric selector tool may be used to assist a user in determining fabrics for automated or manual window treatment that, when implemented in an environment (e.g., building, office, home, etc.), may reduce an amount of power used by a load control system and/or increase the comfort of occupants in the environment. Different types of fabrics may be used with a window treatment. To choose a recommended fabric for implementation in a window treatment, the fabric selector tool may consider fabric characteristics, the environment in which the window treatment may be installed, and/or the performance of various fabrics in the environment in which the window treatment may be installed. The environment, for example, may include a building or a location in the building in which the window treatment may be installed.

A fabric selection wizard module may be implemented for collecting and/or computing input data. The input data may include the characteristics of the environment in which the window treatment may be installed. For example, the environmental characteristics associated with the building or the location in the building in which the recommended fabric may be installed may comprise a location of the building, a latitude of the building, a longitude of the building, an orientation of the building, at least one façade of the building on which the window treatment is to be installed, a buffer zone between a window in the building and an occupant's work space, a window size associated with a window in the building, a glass type associated with a window in the building, a window-to-wall ratio for a room in the building, a visible light transmittance for a window in the building, a daylight glare probability value that indicates an amount of time that daylight glare is probable at a location during a period of time or a maximum probable daylight glare intensity at a location over a period of time, a maximum daylight glare probability value that indicates a maximum threshold for the daylight glare probability value, a room color, depth of room in which the recommended fabric is to be installed, a type of space in the building in which the recommended fabric is to be installed, and/or automated window treatment control information. The fabric selection wizard module may receive some of the environmental characteristics as input data (e.g., from a user interface) and may compute fabric performance input data for determining performance characteristics based on these environmental characteristics. For example, the latitude and longitude of the building may be calculated based on the location of the building, the window-to-wall ratio may be calculated based on the window size, the visible light transmittance for the window may be calculated based on the glass type of the window in the building, and/or the daylight glare probability value or the maximum daylight glare probability value may be calculated based on the type of space in the building in which the recommended fabric is to be installed. The input data may be used to calculate fabric performance metrics at the fabric selection wizard module or another entity, such as a fabric performance engine module, for example. The performance metrics may be predicted based on environmental characteristics of the interior space in which the window treatment may be installed and/or fabric characteristics of the fabric used for the window treatment. The fabric performance metrics may be included in a fabric performance matrix or other output. The fabric performance metrics may indicate the performance of various types of fabric having various characteristics. The fabric performance metrics may be calculated by analyzing the characteristics of a fabric to determine the predicted performance of the fabric in various environments. The fabric characteristics may include an openness factor associated with the fabric that may indicate an amount of open space in the fabric, a visible light transmittance associated with the fabric that may indicate an amount of visible light allowed through the fabric, a solar heat gain associated with a fabric, combined solar heat gain coefficient associate with a combination of the solar heat gain for a glass and a fabric, a color group associated with the fabric, and/or a view clarity rating that may indicate an amount of visibility available through the fabric. The performance metrics for the fabric that may be calculated based on one or more of these characteristics may include the daylight glare probability value that indicates a maximum daylight glare intensity over a period of time, the maximum daylight glare probability value that indicates a predefined maximum threshold for the daylight glare probability, a spatial daylight autonomy value that may indicate an amount of floor space in the building where daylight alone may provide light over a period of time, a spatial daylight autonomy limit value that may indicate the maximum spatial daylight autonomy value for the fabrics with a glare summary score higher than zero, a view rating value that may indicate an amount (e.g., percentage) of the window that may be unobstructed by the fabric, a view limit rating value that may indicate the maximum spatial daylight autonomy value for the fabrics with a glare summary score higher than zero, a view clarity value that may indicate an amount of visibility available through the fabric, a view preservation rating value that may be based on a view rating of the fabric and may indicate an amount of the window that may be unobstructed by the window treatment and a view clarity rating of the fabric that indicates an amount of visibility available through the fabric, a direct glare score that may indicate the reduction in glare based on the fabric, and/or the minimum incident angle of the sun for each façade across the year.

The fabric selection wizard module may receive the predicted fabric performance metrics. The fabric selection wizard module may use the fabric performance metrics to determine a ranking of one or more fabrics for which the performance metrics are received. The ranking may be based on the fabric performance metrics corresponding to the environment in which the window treatment may be installed (e.g., indicated by the input data). The fabrics may be ranked based on a glare score that indicates a predicted amount of glare resulting in a building from use of at least one fabric in the window treatment, a daylight score that indicates a predicted amount of daylight resulting in the interior space from use of the fabric in the window treatment, and/or a view score that indicates an occupant's predicted amount of view out of the at least one window when the window treatment is installed. The fabrics may be ranked based on predefined window treatment recommendation criteria. The fabric selection wizard module may output one or more recommended fabrics and/or their ranking. For example, the fabric selection wizard may display one or more of the top-ranked fabrics.

Predefined window-treatment recommendation criteria may be used to calculate rankings. The predefined window-treatment recommendation criteria may be criteria that affect the amount of energy and/or comfort for an occupant in a load control environment. The predefined window-treatment recommendation criteria may be criteria for window treatments against which the performance of a window treatment may be compared. For example, the predefined window-treatment recommendation criteria may be threshold levels for the predefined predicted performance metrics and/or summary scores. The predefined window treatment recommendation criteria may be system and/or user defined. For example, the system and/or the user may select a threshold value or relative weighting criteria for one or more predefined window-treatment recommendation criteria. The system may use the performance summary scores to determine relative weighting criteria, for example, by computing a weighted average summary score with each performance rating weighted based on either room type or user defined weightings.

The fabric selection wizard module may determine combinations of fabrics that provide the performance metrics for various façades of the building, and use these combinations to rank the fabrics. For example, the environmental characteristics may indicate one or more façades of the building and the fabric performance may be predicted for each façade. Similarly, predicted performance metrics may be calculated for multiple façades. The fabric performance for each façade may be combined to get an overall score for multiple façades of the building. Fabric set scores may be calculated, for example, for different sets of fabrics for multiple facades. The fabric set score may indicate a performance of a set of fabrics when each fabric is used in a window treatment on a different façade of the building. Each fabric in a set of fabrics may have characteristics that are the same of different. For example, the fabrics in a set of fabrics may be of the same family or color group. If the same fabric or fabric family, color group, color and/or openness factor are used for the facades, the scores across the facades may be calculated, for example, when combining multiple facades. A fabric family may comprise a plurality of fabrics with the same material, same texture, or same manufacturer. A color group may comprise a plurality of fabrics with varying shades of a same color or a plurality of fabrics with a combination of colors including at least one color that is the same color. If the same fabric color is used for the facades, an openness factor (e.g., the best openness factor) may be selected by each façade, and the summary scores may be calculated across the facades, for example, when combining multiple facades. After the fabric selection wizard module ranks the plurality of different fabrics and displays one or more of the fabrics, the user may obtain a fabric sample and/or order the fabric.

The recommended fabric may comprises an openness factor that comprises an amount of open space within the fabric material and a visible light transmittance that comprises an amount of visible light allowed to transmit through the fabric material. The openness factor and the visible light transmittance of the fabric material may affect the daylight glare probability that may result from use of the fabric. The openness factor and the visible light transmittance of the recommended fabric may result in a daylight glare probability of less than 35% or 45%. For example, the openness factor and the visible light transmittance of the fabric material may result in a daylight glare probability of less than 35%. As the openness factor may vary from fabric to fabric, the recommended fabric material may comprises an openness tolerance of 1% or less (e.g., 0.5%) for variance of the openness factor. This may be to prevent a fabric having a selected openness factor of 35% or less from raising above 45%.

The recommended fabrics may optimize the automated operation and/or performance of the window treatment (e.g., to increase energy savings and/or improve occupant comfort). While various examples are provided herein for recommending fabrics or other covering materials for a window treatment, the examples are not meant to be limiting.

BRIEF DESCRIPTION OF THE DRAWINGS

FIG. 4 is an example of a database that may be used to lookup input data and/or calculate input data.

DETAILED DESCRIPTION

The foregoing summary, as well as the following detailed description, is better understood when read in conjunction with the appended drawings. The drawings are shown for purposes of illustration and are non-limiting.

Figure 1:
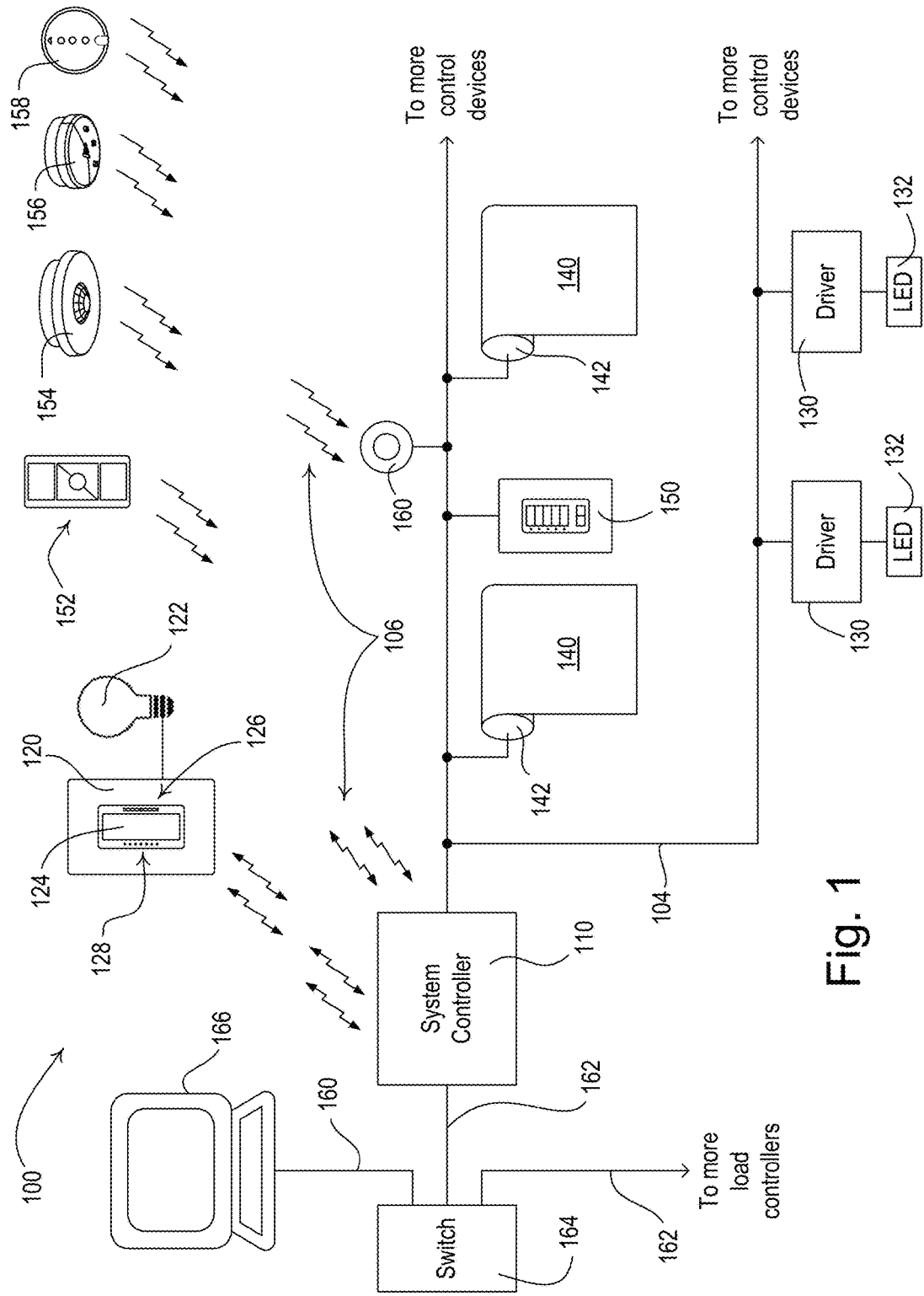
FIG. 1 is a simplified block diagram of a load control system having load control devices and motorized window treatments.

FIG. 1 is a simple diagram of an example load control system for controlling the amount of power delivered from an alternating-current (AC) power source (not shown) to one or more electrical loads. The load control system 100 may comprise a system controller 110 (e.g., a load controller or a central controller) operable to transmit and/or receive digital messages via a wired and/or a wireless communication link. For example, the system controller 110 may be coupled to one or more wired control devices via a wired digital communication link 104. The system controller 110 may be configured to transmit and/or receive wireless signals, e.g., radio-frequency (RF) signals 106, to communicate with one or more wireless control devices. The load control system 100 may comprise a number of control-source devices and/or a number of control-target devices for controlling an electrical load. The control-source devices may be input devices operable to transmit digital messages configured to control an electrical load via a control-target device. For example, control-source devices may transmit the digital messages in response to user input, occupancy/vacancy conditions, changes in measured light intensity, or other input information. The control-target devices may be load control devices operable to receive digital messages and control respective electrical loads in response to the received digital messages. A single control device of the load control system 100 may operate as both a control-source and a control-target device. The system controller 110 may be configured to receive digital messages from the control-source devices and transmit digital messages to the control-target devices in response to the digital messages received from the control-source devices. The control-source devices and the control-target devices may also, or alternatively, communicate directly.

The load control system 100 may comprise a load control device, such as a dimmer switch 120, for controlling a lighting load 122. The dimmer switch 120 may be adapted to be wall-mounted in a standard electrical wallbox. The dimmer switch 120 may comprise a tabletop or plug-in load control device. The dimmer switch 120 may comprise a toggle actuator 124 (e.g., a button) and/or an intensity adjustment actuator 126 (e.g., a rocker switch). Successive actuations of the toggle actuator 124 may toggle, e.g., turn off and on, the lighting load 122. Actuations of an upper portion or a lower portion of the intensity adjustment actuator 126 may respectively increase or decrease the amount of power delivered to the lighting load 122 and increase or decrease the intensity of the lighting load from a minimum intensity (e.g., approximately 1%) to a maximum intensity (e.g., approximately 100%). The dimmer switch 120 may further comprise a plurality of visual indicators 128, e.g., light-emitting diodes (LEDs), which may be arranged in a linear array and/or may be illuminated to provide feedback of the intensity of the lighting load 122. Examples of wall-mounted dimmer switches are described in greater detail in U.S. Pat. No. 5,248,919, issued Sep. 28, 1993, entitled LIGHTING CONTROL DEVICE, and U.S. patent application Ser. No. 13/780,514, filed Feb. 28, 2013, entitled WIRELESS LOAD CONTROL DEVICE, the entire disclosures of which are hereby incorporated by reference.

The dimmer switch 120 may be configured to receive digital messages from the system controller 110 via the RF signals 106 and to control the lighting load 122 in response to the received digital messages. Examples of dimmer switches operable to transmit and receive digital messages is described in greater detail in U.S. patent application Ser. No. 12/033,223, filed Feb. 19, 2008, entitled COMMUNICATION PROTOCOL FOR A RADIO-FREQUENCY LOAD CONTROL SYSTEM, the entire disclosure of which is hereby incorporated by reference. The dimmer switch 120 may also, or alternatively, be coupled to the wired digital communication link 104.

The load control system 100 may further comprise one or more remotely-located load control devices, such as light-emitting diode (LED) drivers 130 for driving respective LED light sources 132 (e.g., LED light engines). The LED drivers 130 may be located remotely, for example, in the lighting fixtures of the respective LED light sources 132. The LED drivers 130 may be configured to receive digital messages from the system controller 110 via the digital communication link 104 and to control the respective LED light sources 132 in response to the received digital messages. The LED drivers 130 may be coupled to a separate digital communication link, such as an Ecosystem® or digital addressable lighting interface (DALI) communication link, and the load control system 100 may include a digital lighting controller coupled between the digital communication link 104 and the separate communication link. The LED drivers 132 may include internal RF communication circuits or be coupled to external RF communication circuits (e.g., mounted external to the lighting fixtures, such as to a ceiling) for transmitting and/or receiving the RF signals 106. The load control system 100 may further comprise other types of remotely-located load control devices, such as, for example, electronic dimming ballasts for driving fluorescent lamps.

The load control system 100 may further comprise a plurality of daylight control devices, e.g., motorized window treatments, such as motorized roller shades 140, to control the amount of daylight entering the building in which the load control system may be installed. A motorized roller shades 140 may comprise a covering material (e.g., a shade fabric). The covering material may be wound around a roller tube for raising and/or lowering the shade fabric. The motorized roller shades 140 may comprise electronic drive units 142. The electronic drive units 142 may be located inside the roller tube of the motorized roller shade. The electronic drive units 142 may be coupled to the digital communication link 104 for transmitting and/or receiving digital messages. The electronic drive units 142 may include a control circuit. The control circuit may be configured to adjust the position of a window treatment fabric, for example, in response to digital messages received from the system controller 110 via the digital communication link 104. Each of the electronic drive units 142 may include memory for storing association information for associations with other devices and/or instructions for controlling the motorized roller shade 140. The electronic drive units 142 may comprise an internal RF communication circuit. The electronic drive units 142 may also, or alternatively, be coupled to an external RF communication circuit (e.g., located outside of the roller tube) for transmitting and/or receiving the RF signals 106. The load control system 100 may comprise other types of daylight control devices, such as, for example, a cellular shade, a drapery, a Roman shade, a Venetian blind, a Persian blind, a pleated blind, a tensioned roller shade systems, an electrochromic or smart window, and/or other suitable daylight control device.

The load control system 100 may comprise one or more other types of load control devices, such as, for example, a screw-in luminaire including a dimmer circuit and an incandescent or halogen lamp; a screw-in luminaire including a ballast and a compact fluorescent lamp; a screw-in luminaire including an LED driver and an LED light source; an electronic switch, a controllable circuit breaker, or other switching device for turning an appliance on and off; a plug-in load control device, a controllable electrical receptacle, or a controllable power strip for controlling one or more plug-in loads; a motor control unit for controlling a motor load, such as a ceiling fan or an exhaust fan; a drive unit for controlling a motorized window treatment or a projection screen; motorized interior or exterior shutters; a thermostat for a heating and/or cooling system; a temperature control device for controlling a setpoint temperature of a heating, ventilation, and air conditioning (HVAC) system; an air conditioner; a compressor; an electric baseboard heater controller; a controllable damper; a variable air volume controller; a fresh air intake controller; a ventilation controller; hydraulic valves for use in radiators and radiant heating systems; a humidity control unit; a humidifier; a dehumidifier; a water heater; a boiler controller; a pool pump; a refrigerator; a freezer; a television or computer monitor; a video camera; an audio system or amplifier; an elevator; a power supply; a generator; an electric charger, such as an electric vehicle charger; and/or an alternative energy controller.

The load control system 100 may comprise one or more input devices, e.g., such as a wired keypad device 150, a battery-powered remote control device 152, an occupancy sensor 154, a daylight sensor 156, and/or a shadow sensor 158. The wired keypad device 150 may be configured to transmit digital messages to the system controller 110 via the digital communication link 104 in response to an actuation of one or more buttons of the wired keypad device. The battery-powered remote control device 152, the occupancy sensor 154, the daylight sensor 156, and/or the shadow sensor 158 may be wireless control devices (e.g., RF transmitters) configured to transmit digital messages to the system controller 110 via the RF signals 106 (e.g., directly to the system controller). For example, the battery-powered remote control device 152 may be configured to transmit digital messages to the system controller 110 via the RF signals 106 in response to an actuation of one or more buttons of the battery-powered remote control device 152. The occupancy sensor 154 may be configured to transmit digital messages to the system controller 110 via the RF signals 106 in response to detection of occupancy and/or vacancy conditions in the space in which the load control system 100 may be installed. The daylight sensor 156 may be configured to transmit digital messages to the system controller 110 via the RF signals 106 in response to detection of different amounts of natural light intensity. The shadow sensor 158 may be configured to transmit digital messages to the system controller 110 via the RF signals 106 in response to detection of an exterior light intensity coming from outside the space in which the load control system 100 may be installed. The system controller 110 may be configured to transmit one or more digital messages to the load control devices (e.g., the dimmer switch 120, the LED drivers 130, and/or the motorized roller shades 140) in response to the received digital messages, e.g., from the wired keypad device 150, the battery-powered remote control device 152, the occupancy sensor 154, the daylight sensor 156, and/or the shadow sensor 158. While the system controller 110 may receive digital messages from the input devices and/or transmit digital messages to the load control devices for controlling an electrical load, the input devices may communicate directly with the load control devices for controlling the electrical load.

The load control system 100 may comprise a wireless adapter device 160 that may be coupled to the digital communication link 104. The wireless adapter device 160 may be configured to receive the RF signals 106. The wireless adapter device 160 may be configured to transmit a digital message to the system controller 110 via the digital communication link 104 in response to a digital message received from one of the wireless control devices via the RF signals 106. For example, the wireless adapter device 160 may re-transmit the digital messages received from the wireless control devices on the digital communication link 104.

The occupancy sensor 154 may be configured to detect occupancy and/or vacancy conditions in the space in which the load control system 100 may be installed. The occupancy sensor 154 may transmit digital messages to the system controller 110 via the RF signals 106 in response to detecting the occupancy and/or vacancy conditions. The system controller 110 may be configured to turn one or more of the lighting load 122 and/or the LED light sources 132 on and off in response to receiving an occupied command and a vacant command, respectively. The occupancy sensor 154 may operate as a vacancy sensor, such that the lighting loads are turned off in response to detecting a vacancy condition (e.g., not turned on in response to detecting an occupancy condition). Examples of RF load control systems having occupancy and vacancy sensors are described in greater detail in commonly-assigned U.S. Pat. No. 8,009,042, issued Aug. 30, 2011, entitled RADIO-FREQUENCY LIGHTING CONTROL SYSTEM WITH OCCUPANCY SENSING; U.S. Pat. No. 8,199,010, issued Jun. 12, 2012, entitled METHOD AND APPARATUS FOR CONFIGURING A WIRELESS SENSOR; and U.S. Pat. No. 8,228,184, issued Jul. 24, 2012, entitled BATTERY-POWERED OCCUPANCY SENSOR, the entire disclosures of which are hereby incorporated by reference.

The daylight sensor 156 may be configured to measure a total light intensity in the space in which the load control system is installed. The daylight sensor 156 may transmit digital messages including the measured light intensity to the system controller 110 via the RF signals 106. The digital messages may be used to control an electrical load (e.g., the intensity of lighting load 122, the motorized window shades 140 for controlling the level of the covering material, the intensity of the LED light sources 132) via one or more control load control devices (e.g., the dimmer switch 120, the electronic drive unit 142, the LED driver 130). Examples of RF load control systems having daylight sensors are described in greater detail in commonly-assigned U.S. Pat. No. 8,410,706, issued Apr. 2, 2013, entitled METHOD OF CALIBRATING A DAYLIGHT SENSOR; and U.S. Pat. No. 8,451,116, issued May 28, 2013, entitled WIRELESS BATTERY-POWERED DAYLIGHT SENSOR, the entire disclosures of which are hereby incorporated by reference.

The shadow sensor 158 may be configured to measure an exterior light intensity coming from outside the space in which the load control system 100 may be installed. The shadow sensor 158 may be mounted on a façade of a building, such as the exterior or interior of a window, to measure the exterior natural light intensity depending upon the location of the sun in sky. The shadow sensor 158 may detect when direct sunlight is directly shining into the shadow sensor 158, is reflected onto the shadow sensor 158, or is blocked by external means, such as clouds or a building, and may send digital messages indicating the measured light intensity. The shadow sensor 158 may transmit digital messages including the measured light intensity to the system controller 110 via the RF signals 106. The digital messages may be used to control an electrical load (e.g., the intensity of lighting load 122, the motorized window shades 140 for controlling the level of the covering material, and/or the intensity of the LED light sources 132) via one or more control load control devices (e.g., the dimmer switch 120, the electronic drive unit 142, and/or the LED driver 130). The shadow sensor 158 may also be referred to as a window sensor, a cloudy-day sensor, or a sun sensor.

The load control system 100 may comprise other types of input device, such as: temperature sensors; humidity sensors; radiometers; pressure sensors; smoke detectors; carbon monoxide detectors; air quality sensors; motion sensors; security sensors; proximity sensors; fixture sensors; partition sensors; keypads; kinetic- or solar-powered remote controls; key fobs; cell phones; smart phones; tablets; personal digital assistants; personal computers; laptops; timeclocks; audio-visual controls; safety devices; power monitoring devices (such as power meters, energy meters, utility submeters, utility rate meters); central control transmitters; residential, commercial, or industrial controllers; or any combination of these input devices. These input devices may transmit digital messages to the system controller 110 via the RF signals 106. The digital messages may be used to control an electrical load (e.g., the intensity of lighting load 122, the motorized window shades 140 for controlling the level of the covering material, and/or the intensity of the LED light sources 132) via one or more control load control devices (e.g., the dimmer switch 120, the electronic drive unit 142, and/or the LED driver 130).

The system controller 110 may be configured to control the load control devices (e.g., the dimmer switch 120, the LED drivers 130, and/or the motorized roller shades 140) according to a timeclock schedule. The timeclock schedule may be stored in a memory in the system controller. The timeclock schedule may include a number of timeclock events. The timeclock events may have an event time and a corresponding command or preset. The system controller 110 may be configured to keep track of the present time and/or day. The system controller 110 may transmit the appropriate command or preset at the respective event time of each timeclock event. An example of a load control system for controlling one or more motorized window treatments according to a timeclock schedule is described in greater detail in commonly-assigned U.S. Pat. No. 8,288,981, issued Oct. 16, 2012, entitled METHOD OF AUTOMATICALLY CONTROLLING A MOTORIZED WINDOW TREATMENT WHILE MINIMIZING OCCUPANT DISTRACTIONS, the entire disclosure of which is hereby incorporated by reference.

The load control system 100 may be part of an automated window treatment control system. The system controller 110 may control the shades according to automated window treatment control information. For example, the automated window treatment control information may include the angle of the sun, sensor information, an amount of cloud cover, and/or weather data, such as historical weather data and real-time weather data. For example, throughout course of calendar day, the system controller 110 of the automated window treatment control system may adjust the position of the window treatment fabric multiple times, based on the calculated position of the sun or sensor information. For example, the system controller 110 of the automated window treatment control system may adjust the positions of the window treatments in response to at least one light intensity measured by a sensor. The automated window treatment control system may determine the position of the window treatments in order to affect a performance metric. The automated window treatment system may command the system controller 110 to adjust the window treatments to the determined position in order to affect a performance metric. For example, the system controller 110 of the automated window treatment control system may adjust the positions of the window treatments at intervals to minimize occupant distractions. The automated window treatment control system may operate according to a timeclock schedule. Based on the timeclock schedule, the system controller 110 may change the position of the window treatments throughout a calendar day. For example, the automated window treatment control system may determine a position of a window treatment based on a calculated angle of the sun to limit a sunlight penetration distance in an interior space of a building and indicate to the system controller 110 to adjust the window treatment to the determined position. The timeclock schedule may be set to prevent the daylight penetration distance from exceeding a maximum distance into an interior space (e.g., work space, transitional space, or social space). The maximum daylight penetration distance may be set to a buffer zone, which may be a distance between the window and the user's workspace. The system controller 110 may adjust the position of the window treatments according to collected sensor information.

The system controller 110 may be operable to be coupled to a network, such as a wireless or wired local area network (LAN) via a network communication bus 162 (e.g., an Ethernet communication link), e.g., for access to the Internet. The system controller 110 may be connected to a network switch 164 (e.g., a router or Ethernet switch) via the network communication bus 162 for allowing the system controller 110 to communicate with other system controllers for controlling other electrical loads. The system controller 110 may be wirelessly connected to the network, e.g., using Wi-Fi technology. The system controller 110 may be configured to communicate via the network with one or more network devices, such as a smart phone (e.g., an iPhone® smart phone, an Android® smart phone, a Windows® smart phone, or a Blackberry® smart phone), a personal computer 166, a laptop, a tablet device, (e.g., an iPad® hand-held computing device), a Wi-Fi or wireless-communication-capable television, a server, and/or any other suitable wireless communication device (e.g., an Internet-Protocol-enabled device). The network device may be operable to transmit digital messages to the system controller 110 in one or more Internet Protocol packets. Examples of load control systems operable to communicate with network devices on a network are described in greater detail in commonly-assigned U.S. Patent Application Publication No. 2013/0030589, published Jan. 31, 2013, entitled LOAD CON- TROL DEVICE HAVING INTERNET CONNECTIVITY, the entire disclosure of which is hereby incorporated by reference.

The operation of the load control system 100 may be programmed and/or configured using the personal computer 166 or other network device. The personal computer 166 may execute a graphical user interface (GUI) configuration software for allowing a user to program how the load control system 100 may operate. The configuration software may generate load control information (e.g., a load control database) that defines the operation and/or performance of the load control system 100. For example, the load control information may include information regarding the different load control devices of the load control system (e.g., the dimmer switch 120, the LED drivers 130, and/or the motorized roller shades 140). The load control information may include information regarding associations between the load control devices and the input devices (e.g., the wired keypad device 150, the battery-powered remote control device 152, the occupancy sensor 154, the daylight sensor 156, and/or the shadow sensor 158), and/or how the load control devices may respond to input received from the input devices. Examples of configuration procedures for load control systems are described in greater detail in commonly-assigned U.S. Pat. No. 7,391,297, issued Jun. 24, 2008, entitled HANDHELD PROGRAMMER FOR LIGHTING CONTROL SYSTEM; U.S. Patent Application Publication No. 2008/0092075, published Apr. 17, 2008, entitled METHOD OF BUILDING A DATABASE OF A LIGHTING CONTROL SYSTEM; and U.S. patent application Ser. No. 13/830,237, filed Mar. 14, 2013, entitled COMMISSIONING LOAD CONTROL SYSTEMS, the entire disclosure of which is hereby incorporated by reference.

The system controller 110 may be configured to automatically control the motorized window treatments (e.g., the motorized roller shades 140). The motorized window treatments may be controlled to save energy and/or improve the comfort of the occupants of the building in which the load control system 100 may be installed. For example, the system controller 110 may be configured to automatically control the motorized roller shades 140 in response to a timeclock schedule, the daylight sensor 156, and/or the shadow sensor 158. The roller shades 140 may be manually controlled by the wired keypad device 150 and/or the battery-powered remote control device 152.

Figure 2:
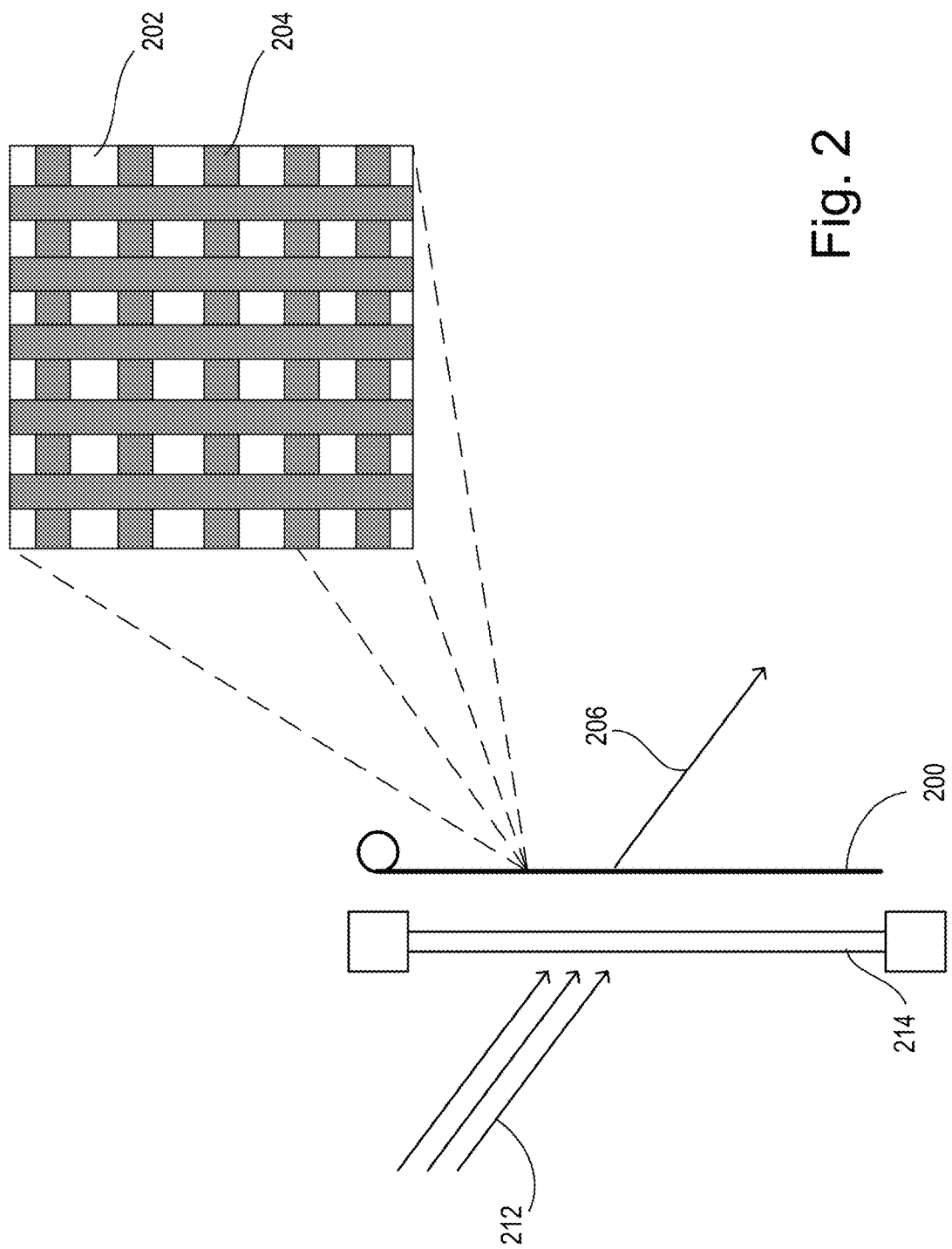
FIG. 2 is a simplified block diagram that illustrates various characteristics of a window treatment.

The covering material or fabric of the window treatments may be characterized by an openness factor, a visible light transmittance ($T_{V\text{-}FABRIC}$), a solar absorptance ($A_S$), a solar transmittance ($T_S$), a solar reflectance ($R_S$), a solar heat gain coefficient ($SHGC_S$), and/or combined solar heat gain coefficient ($SHGC_{FABRIC\text{-}GLASS}$). FIG. 2 is a diagram illustrating the various characteristics of a covering material or fabric 200. As illustrated in FIG. 2, the fabric 200 may include an amount of open space 202 and an amount of fabric 204. The openness factor may indicate the amount of open space 202 in the fabric 200. The openness factor may define the ratio of open space 202 to fabric material 204 in the fabric 200. For example, an openness factor of 10% may indicate that 10% of the shade fabric is open space. The openness factor may be a nominal factor. A nominal factor may be an approximate factor that may be used when a measured openness factor is unavailable for the fabric. The openness factor may be a measured openness factor. A measured openness factor may be a single measurement of the openness of a fabric. The openness factor may be a mean openness factor. A mean openness factor may be an average of multiple measurements of openness for the fabric.

FIG. 2 illustrates characteristics of the covering material or fabric 200. As shown in FIG. 2, natural light 212 may be received at a window 214 and may meet the window covering material or fabric 200. The visible light transmittance of the fabric $T_{V\text{-}FABRIC}$ may indicate an amount of transmitted natural light 206 that may be allowed through the fabric 200. The color and/or the openness of the fabric 200 may affect the visible light transmittance of the fabric $T_{V\text{-}FABRIC}$. For example, a more open weave and/or a lighter color for the fabric 200 may allow more visible light transmittance of the fabric $T_{V\text{-}FABRIC}$ than a more closed weave and/or darker color for the fabric 200. The solar absorptance $A_S$ may indicate an amount of solar energy that may be absorbed by the fabric 200. The solar transmittance $T_S$ may indicate an amount of solar energy that may be transmitted through the fabric 200. The solar reflectance $R_S$ may indicate an amount of solar energy that may be reflected by the fabric 200. The fabric 200 may be made of a reflective material that may increase the reflective characteristics of the fabric 200. In an example, the visible light transmittance of the fabric $T_{V\text{-}FABRIC}$, the solar absorptance $A_S$, the solar transmittance $T_S$, and/or the solar reflectance $R_S$ may each be defined as a percentage of the natural light 212 that meets the fabric 200. The solar heat gain $HG_S$ may indicate the combined solar reflectance of the glass and the covering material of fabric 200. The solar heat gain coefficient may be calculated as a percentage of the radiant heat that gets through the glass compared to the radiant heat that strikes the glass. For example, the solar heat gain may be the fraction or percentage of radiant heat that transmits through the glass or fabric. Similarly, a combined solar heat gain coefficient may take into account glass properties and fabric properties to represent the combined solar heat gain coefficient of the glass and fabric when used together.

The openness factor and/or the visible light transmittance of the fabric $T_{V\text{-}FABRIC}$ may affect the energy savings of the load control system and/or the comfort of the occupants. For example, a fabric 200 having a higher openness factor may allow more of the natural light 212 to pass through. This higher openness factor may provide more energy savings for the load control system 100 since the lighting loads may be dimmed or turned off. A high visible light transmittance of the fabric $T_{V\text{-}FABRIC}$ may lead to conditions of high daylight glare.

The fabric of the window treatments of the load control system 100 may be selected using a fabric selection software. This selection may be performed prior to purchase and/or installation of the load control system, for example.

Figure 3:
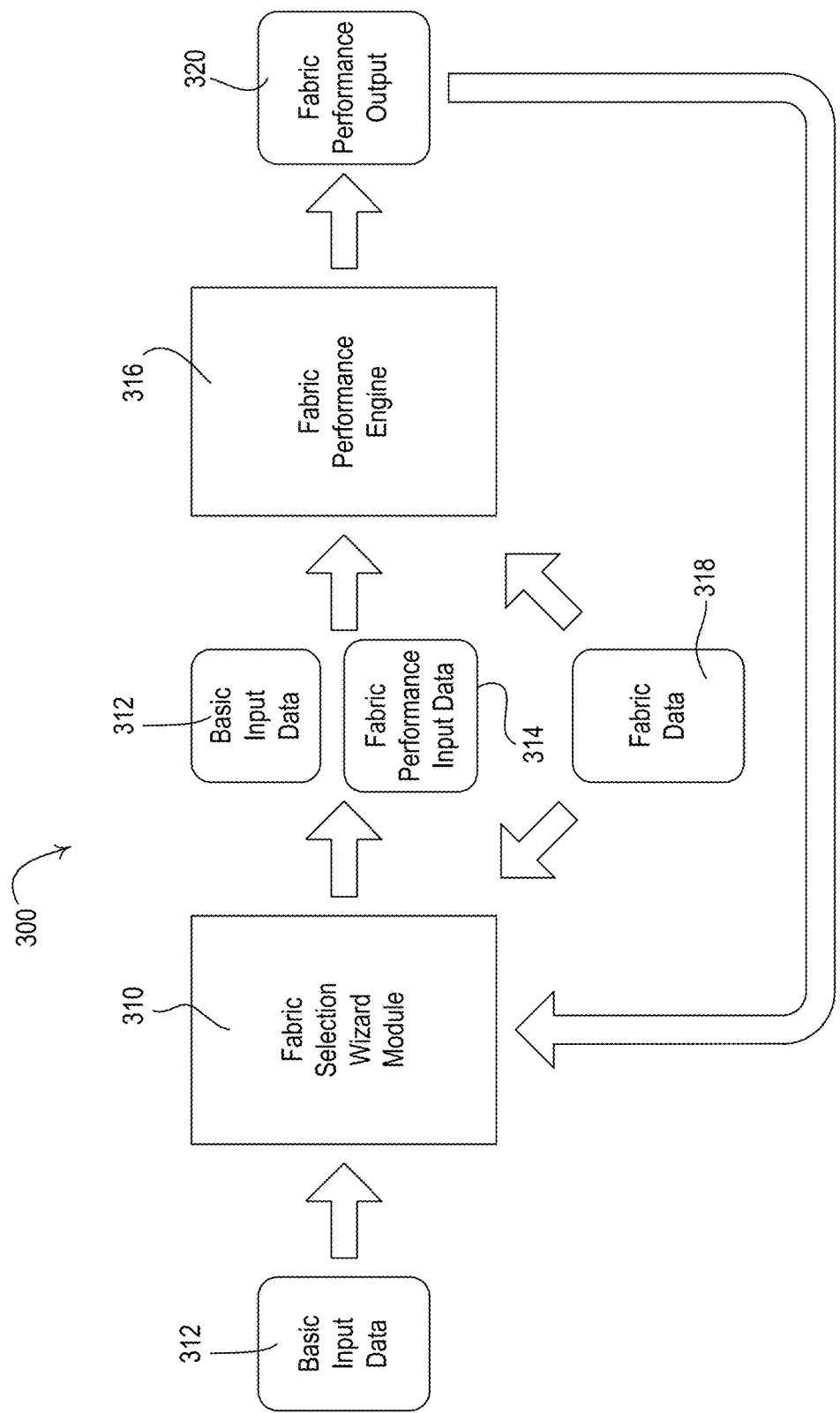
FIG. 3 is a diagram of an example architecture of a fabric selection tool that may be used to select a fabric for a window treatment.

FIG. 3 is a diagram of an example architecture of a fabric selection tool 300 that may provide an automated means for selecting a fabric (or fabrics) for one or more window treatments that may be installed in an interior or exterior space of a building. The fabric selection tool 300 may be implemented as software and/or hardware in one or more computing devices. For example, the fabric selection tool 300 may be implemented in a single computing device or distributed across multiple computing devices. The fabric selection tool 300, or portions thereof, may be executed, from memory, by a processor of a computing device.

The fabric selection tool 300 may comprise a fabric selection wizard module 310. The fabric selection wizard module 310 may obtain data as input to a fabric performance engine 316. The fabric performance engine 316 may determine the performance of different covering materials and/or fabrics based on the basic input data 312 and/or the fabric performance input data 314. The fabric performance engine 316 may output a fabric performance output 320 (e.g., a fabric performance output matrix). The fabric performance output 320 may indicate predicted performance metrics of the fabrics in various load control environments (e.g., a building, an office, a home, etc.). The fabric selection wizard module 310 may analyze the predicted performance metrics from the fabric performance output 320 and may provide recommendations for fabrics that may provide energy savings and/or comfort to occupants (e.g., by reducing the possibility of glare from natural light) as compared to other fabrics.

The fabric selection wizard module 310 may comprise software and/or hardware. For example, the fabric selection wizard module 310 may comprise a user interface (e.g., a web-based or local graphical user interface (GUI)) that may receive information from a user of a network device. The fabric selection wizard module 310 may obtain data from other sources, such as a local or remote memory storage, input devices in the load control system, load control devices in the load control system, and/or other remote sources. The fabric selection wizard module 310 may reside locally on a network device and/or on one or more remote devices that may be accessed by the network device (e.g., the system controller 110). The functionality of the fabric selection wizard module 310 may reside on a single device or be distributed across multiple devices. For example, the fabric selection wizard module 310 may be accessed via a web browser running on the network device and displayed on a visual display of the network device. The network device may be a personal computer, a laptop, a tablet, a smart phone, and/or other suitable network device having a visual display or capable of communicating with a visual display.

The fabric performance engine 316 may comprise software and/or hardware for calculating the performance of covering materials and/or fabrics. The fabric performance engine 316 may receive input data from the fabric selection wizard module 310. The fabric performance engine 316 may obtain data from other sources, such as a local or remote memory storage, input devices in the load control system, load control devices in the load control system, and/or other remote sources. The fabric performance engine 316 may reside locally on a network device and/or on one or more remote devices (e.g., the system controller 110). The device or devices on which the fabric performance engine 316 resides may be the same as or different from the device or devices on which the fabric selection wizard module 310 may reside.

The fabric selection wizard module 310 may collect basic input data 312. The basic input data 312 may comprise information regarding a building in which window treatments may be installed. The basic input data 312 may comprise environmental characteristics associated with the building or a location in the building in which the window treatments may be installed. For example, the basic input data 312 may comprise information identifying a location of the building, an orientation of the building, a façade or façades of the building on the inside of which the window treatments may be located, buffer zones between windows and occupants' work spaces (e.g., desk, computer screen, etc.), a size and/or tint of the windows that the window treatments may be covering, a glass type of the windows, a space type (e.g., functional area, transition area, social area, etc.), a room color, depth of room in which the recommended fabric is to be installed, whether a façade is protected from direct sun (e.g., due to a building or other structure), and/or automated window treatment control information. The basic input data 312 may be manually entered by a user and/or received from another source, such as a remote computing device. Basic input data 312 may be received for one or more façades.

The fabric selection wizard module 310 may compute fabric performance input data 314 that may be used by the fabric performance engine 316 to determine the performance of fabrics. The computed fabric performance input data 314 may be computed based on the basic input data 312 and/or other input data that may be received from a user or from one or more remote external devices (e.g., network devices, remote computing devices, input devices, load control devices, etc.). As the computed fabric performance input data 314 may be computed based on the basic input data 312, the computed fabric performance input data 314 may comprise environmental characteristics associated with the building or the location in the building in which the window treatments may be installed. The computed fabric performance input data 314 may comprise, for example, a latitude and/or a longitude of the building, an amount of time the building receives daylight (e.g., a number of sunny hours per day, month, or year for the building), a window-to-wall ratio (WWR), a visible light transmittance of the glass of the windows ($T_{V\text{-}GLASS}$), a daylight glare probability value, a maximum daylight glare probability value, an orientation that indicates a building façade (e.g., northern façade), and/or a fabric part number that indicates a unique number associated with the fabric.

The fabric performance wizard module 310 may receive predicted performance metric values, summary scores, information based on the summary scores, information based on the predicted performance metric values, basic input data 312, input data, computed fabric performance input data 314, output data, and/or output fabric performance data. The fabric performance wizard module 310 may calculate scores based on predicted performance metric values, information based on the predicted performance metric values, basic input data 312, input data, computed fabric performance input data 314, output data, and/or output fabric performance data. The fabric performance wizard module 310 may display predicted performance metric values, summary scores, information based on the summary scores, information based on the predicted performance metric values, basic input data 312, input data, computed fabric performance input data 314, output data, and/or output fabric performance data.

The window-to-wall ratio (WWR) indicates the area of a perimeter wall that is occupied by glass in a window. A larger window size may allow a greater daylight intensity into the room and may cause the shades to be closed more often. For example, the window-to-wall ratio may indicate a ratio (e.g., percentage) of the area of the glass in a window that occupies the space in the perimeter wall to the remaining area of the perimeter wall. The areas may be based on the height and width of the window and perimeter wall.

The daylight glare probability value may indicate the predicted amount of daylight glare or a predicted maximum daylight glare intensity over a period of time (e.g., total hours of predicted daylight glare or maximum daylight glare intensity at a location in a year). The maximum daylight glare probability value may indicate a maximum threshold for the daylight glare probability value. The daylight glare probability value and the maximum daylight glare probability value may be indicated as a percentage or ratio of a maximum daylight glare intensity. The maximum daylight glare probability value may be equal to or compared against industry standards for daylight glare probability. For example, the maximum daylight glare probability value may be set to a 35% maximum intensity, which may be the level at which an occupant may begin to recognize glare, or 45%, which may be the level at which an occupant may begin to be bothered by glare.

If one or more types of the computed fabric performance input data 314 and/or the basic input data 312 are not provided, the fabric selection wizard module 310 may provide a default value. For example, if the visible light transmittance of the glass of the windows $T_{V\text{-}GLASS}$ and/or the glass type is not provided in the basic input data 312, the fabric selection wizard 310 may provide a default visible light transmittance of the glass and/or glass type, respectively.

The daylight glare probability value and the maximum daylight glare probability value may be compared to control the daylight glare probability or to determine if the daylight glare probability has exceeded a predefined maximum threshold. The daylight glare probability value may be affected by location characteristics. For example, the daylight glare probability value may be determined based on a total number of hours of annual sunshine at a climate zone at a given location or latitude. While the daylight glare probability value may be indicated herein as a ratio or percentage of the maximum daylight glare intensity, the daylight glare probability value may also be indicated as a total number of hours of daylight glare or the total number of hours of daylight glare over a predefined value. The maximum daylight glare probability value may indicate a predefined maximum threshold for the amount of hours of daylight glare (e.g., where the daylight glare probability value indicates a total amount of hours of sunshine) or a maximum threshold for daylight glare intensity (e.g., where the daylight glare probability value indicates a total amount of hours of sunshine). While the maximum daylight glare probability value may be indicated herein as a ratio or percentage, the maximum daylight glare probability value may also be indicated as a maximum threshold number of hours of daylight glare or the maximum total number of hours of daylight glare over a predefined value. The maximum daylight glare probability value may change based on space type, location, etc.

The computed fabric performance input data 314 may be determined as a function of the basic input data 312. For example, the latitude and/or longitude may be determined as a function of the location indicated in the basic input data 312. The latitude and longitude may be output from a location map function or a lookup function that receives the location as input. The lookup function may be used to lookup a location in a lookup table and provide the latitude and longitude or provide the latitude and longitude of the closest location in the lookup table to the entered location. Equations 1 and 2 provide example lookup functions for looking up a latitude and a longitude, respectively, based on a location.

$$\text{LAT=Lookup(Location)} \qquad \text{Equation 1:}$$

$$\text{LON=Lookup(Location)} \qquad \text{Equation 2:}$$

The location map function may provide the latitude and longitude of a location on a map from a lookup table or otherwise determine the latitude and longitude of the location on a map based on the latitude and longitude of the closest locations in the lookup table (e.g., using triangulation). Equations 3 and 4 provide example location map functions for determining a latitude and a longitude, respectively, based on a location.

$$\text{LAT=Location\_map(Location)} \qquad \text{Equation 3:}$$

$$\text{LON=Location\_map(Location)} \qquad \text{Equation 4:}$$

The window-to-wall ratio may be determined as a function of the window size (e.g., height and width) in the basic input data 312. For example, the window-to-wall ratio may be output from a lookup function that receives the window size as input. Equation 5 provides an example lookup function for determining a window-to-wall ratio based on the window size.

$$\text{WWR=Lookup(WindowSize)} \qquad \text{Equation 5:}$$

The visible light transmittance of the glass of the windows $T_{V\text{-}GLASS}$ may be determined as a function of the glass type in the basic input data 312. For example, the visible light transmittance of the glass of the windows $T_{V\text{-}GLASS}$ may be output from a lookup function that receives the glass type as input. Equation 6 provides an example lookup function for determining the visible light transmittance of the glass of the windows $T_{V\text{-}GLASS}$ based on the glass type.

$$T_{V\text{-}GLASS}=\text{Lookup(GlassType)} \qquad \text{Equation 6:}$$

The daylight glare probability value and/or the maximum daylight glare probability value may be determined as a function of the space type in the basic input data 312. For example, the daylight glare probability value and/or the maximum daylight glare probability value may be output from a lookup function that receives the space type as input. Equations 7 and 8 provide example lookup functions for determining the maximum daylight glare probability value and the daylight glare probability value, respectively, based on the space type.

$$\text{MaxDGPValue=Lookup(SpaceType)} \qquad \text{Equation 7:}$$

$$\text{DGPValue=Lookup(SpaceType)} \qquad \text{Equation 8:}$$

The amount of time the building receives daylight may be calculated based on the location in the basic input data 312, such as the latitude and longitude of the location. For example, the amount of time the building receives daylight may be output from a lookup function that receives the location or latitude and longitude as input. Equation 9 provides an example lookup function for determining the number of hours the building receives daylight based on the location.

$$\text{SunnyHours=Lookup(Location)} \qquad \text{Equation 9:}$$

The amount of time the building receives daylight may also be calculated based on a weighted average of multiple other locations within proximity to a given location. For example, the distance between a building and multiple other locations may be determined. The amount of time the building receives daylight may be weighted, for example, according to the distance from each location and the amount of daylight received at each location (e.g., weighted average of daylight received at three closest cities).

The orientation of a façade may be determined based on the facade and the building rotation to determine the direction the façade is oriented. Each orientation of the building (e.g., north, south, east, west, northeast, northwest, southeast, southwest, etc.) may be assigned a value. The building orientation may be selected by the user.

FIG. 4 shows an example of an input table 400 that may store computed fabric performance input data 314 and/or basic input data 312. The input table 400 may include location information 402, façade orientation information 404, buffer zone information 406, window size information 408, glass type information 410, space type information 412, and/or room color information 414.

The location information 402 may identify a latitude 416 and longitude 418 at various locations and/or the amount of daylight 420 received at each location. The façade orientation information 404 may identify the selectable façades of a building 422 and/or an orientation for each façade 424. The buffer zone information 406 may identify the types of buffer zones for workspaces in the building and/or the distance of a workspace from the window. The window size information may identify window types 426 and/or a window-to-wall ratio 428 for the window types 426. The glass type information 410 may identify the selectable types of glass 430 and/or the visible light transmittance $T_{V-GLASS}$ 432 of the types of glass. The types of glass 430 may identify a number of panes in the glass and/or an amount of tint in the glass. The space type information 412 may identify a selectable type of space 434, a maximum daylight glare probability value 436 for the selectable types of space 434, and/or a daylight glare probability value 438 for the selectable types of space 434. The room color information 414 may identify selectable shades of room colors or the actual room colors themselves.

The input table 400 may be used to determine the computed fabric performance input data 314 based on the basic input data 312. While FIG. 4 shows certain types of input information, the types of information in the input table 400 are not limited to the input information shown. Additionally, while the input table 400 shows the input information in the form of a table, similar information may be stored in formats other than a table.

Referring back to FIG. 3, the fabric performance engine 316 may use the basic input data 312, the computed fabric performance input data 314, and/or the fabric data 318 to generate the fabric performance output 320. The fabric performance engine 316 may access fabric data 318 (e.g., a fabric database) to retrieve data identifying a plurality of different types of fabric. The fabric performance engine 316 may use the fabric data for evaluating performance of the identified fabrics based on the basic input data 312 and/or the computed fabric performance input data 314. The fabric data 318 may include, for one or more types of fabric, a unique identifier, a family name, an openness factor, a visible light transmittance of the fabric $T_{V-FABRIC}$ for one or more sides (e.g., a front side and a reverse side), a color group for one or more sides, and/or a view clarity rating for one or more sides.

The color group of the fabric may indicate a solid color, a combination of multiple colors (e.g., a striped pattern), or a design (e.g., an image). The color groups may be within the same family of colors, combination of colors, and/or design. For example, the beige shades may be in one group and the grey shades may be in another. In another example, vertical striped shades may be in a different group than horizontal striped shades.

The view clarity rating may indicate an amount (e.g., percentage) of visibility available through the fabric. The view clarity rating may be based on one or more other types of information in the fabric data 318. For example, the view clarity rating may be based on the openness factor, the difference between the visible light transmittance of the fabric $T_{V-FABRIC}$ and the openness factor, and/or the color group. A greater view clarity rating may result from a higher openness factor, darker color group, and/or a lower difference between the visible light transmittance of the fabric $T_{V-FABRIC}$ and the openness factor.

The identifier may indicate the family name of which the identified fabric is a part, the color group, the openness factor, and/or the view clarity rating. The visible light transmittance of the fabric $T_{V-FABRIC}$ may be a function of the color group and/or the openness factor. The fabric data 318 may include multiple fabrics that have the same color group different openness factors and/or transmittances, such that the potential energy savings and/or daylight glare probability of each of the fabrics may differ. Each of these fabrics may be used for different façades in a building to keep the same shade colors, patterns, and/or designs in a room or floor of a building, while also allowing a fabric having different characteristics other than color to optimize comfort to an occupant and/or energy usage.

Using the basic input data 312, computed fabric performance input data 314, and/or the fabric data 318, the fabric performance engine 316 may generate performance metrics regarding the predicted performance of the window treatments and/or shades that may be installed in the building. The performance metrics may be included in the fabric performance output 320. The fabric performance output 320 may comprise a fabric output matrix. The fabric output matrix that may include one or more fabrics and the corresponding performance for each fabric. For example, the performances metrics of the fabric performance output 320 may include a daylight glare probability value, a maximum daylight glare probability value, a spatial daylight autonomy value, a view clarity rating (e.g., from the fabric data 318), and/or a view rating for each fabric.

The spatial daylight autonomy value may indicate an amount (e.g., percentage) of floor space where daylight alone may provide light over a period of time. For example, the spatial daylight autonomy value may indicate a percentage of floor space where daylight alone provides 300 lux or more for at least half of the work hours in a year. The spatial daylight autonomy value may be affected by the openness factor and/or the visible light transmittance $T_{V-FABRIC}$. A higher openness factor and/or visible light transmittance $T_{V-FABRIC}$ may increase the spatial daylight autonomy value.

The daylight glare probability value may be affected by the openness factor and/or the visible light transmittance $T_{V-FABRIC}$. A higher openness factor and/or visible light transmittance $T_{V-FABRIC}$ may increase the daylight glare probability value. The fabric color may affect the daylight glare probability value and/or the spatial daylight autonomy value. A lighter color fabric may increase the daylight glare probability value and/or the spatial daylight autonomy value.

The view rating may indicate an amount (e.g., percentage) of a window that may be unobstructed by window treatment material. For example, the view rating may indicate a window shade level (e.g., amount of window that is covered or not covered by the window shade). The view rating may be determined based on the basic input data 312 and/or the computed fabric performance input data 314. For example, the view rating may be higher for a location that receives less daylight or daylight glare and is able to keep the shades open at a higher level for a greater amount of time giving an occupant a greater view.

The view rating may be determined based on the control type. The control type may be a manual or automated control type. The level of the shades may be determined from the predicted automated control and/or manual control of the shades.

The view rating may be based on the view clarity rating. For example, the fabrics that have a greater view clarity rating may have a lower view rating. This may be because the shades with a greater view rating may have a greater openness factor, visible light transmittance $T_{V-FABRIC}$, and/or a lighter color group, which may cause the shades to be lowered due to the amount of daylight that may be allowed in the space. The lower view rating may indicate the shades may be at a lower level to limit glare, thus obstructing the view. The fabrics at a façade angle and/or a building orientation that receive more daylight and/or a greater maximum daylight intensity level may be given a lower view rating, for example, because of the amount of light that may be allowed into the space.

The fabrics that may be used in a space that has a shorter buffer zone, and/or a lower window-to-wall ratio, may be given a higher view rating as the occupant may have a larger view when closer to a bigger window. These fabrics, however, may receive a lower view rating, or such view ratings may be mitigated, when the shades are lowered due to an increased amount of daylight. For example, a larger window size may allow a greater daylight intensity in the room and may cause the shades to be closed more often. When the glass type and/or the visible light transmittance of the glass $T_{V\text{-}GLASS}$ allows more visible light through, the fabrics may receive a higher view rating as a better view may be perceived through the glass. These fabrics, however, may receive lower view ratings, or such view ratings may be mitigated, when the shades are lowered due to the increased amount of daylight.

The performances metrics of the fabric performance output 320 may be generated for automated and/or manual control for each fabric. The performance metrics may be different for automated control of the fabric than for manual control. The performance metrics for manual shade control may be generated based on an assumption that the shades are kept in a single state during use. The shade state may be a fully-closed state or a position between the fully-closed state and a fully-opened state (e.g., partially-open, state). The performance metrics for manual shade control may be generated based on a predicted manual usage of the shades by an occupant. The predicted manual usage may be based on input data (e.g., basic input data 312 and/or computed fabric performance input data 314) and/or other data that indicates various thresholds at which an occupant may move their shades. For example, in a location and/or orientation that has a higher daylight glare probability value, occupants may close the shades to prevent glare more often than occupants at locations with a lower daylight glare probability value. The performance metrics for automated shade control may be generated based on a predicted automated control of the shades. Examples of methods for automated shade control on which the automated control of the shades may be predicted are described in greater detail in commonly-assigned U.S. Pat. No. 8,288,981, issued Oct. 16, 2012, entitled METHOD OF AUTOMATICALLY CONTROLLING A MOTORIZED WINDOW TREATMENT WHILE MINIMIZING OCCUPANT DISTRACTIONS, the entire disclosure of which is hereby incorporated by reference.

The fabric performance engine 316 may provide the performance metrics regarding the predicted performance of the window treatments back to the fabric selection wizard module 310. The fabric selection wizard module 310 may establish (e.g., receive) the performance metrics regarding the predicted performance of the window treatments for each of the plurality of different fabrics of the fabric data 318. The fabric selection wizard module 310 may receive the fabric performance output 320 and may analyze the data from the fabric performance output 320 to provide recommendations of one or more fabrics that may provide energy savings and/or maximize the comfort of occupants (e.g., by reducing the possibility of daylight glare). For example, the fabric selection wizard module 310 may rank fabrics having a low daylight glare probability value, a high spatial daylight autonomy value, and/or a high view rating above other fabrics. The fabric selection wizard module 310 may be configured to display the recommendations on a user interface to be viewed by a user.

FIGS. 5A-5I show example displays of a fabric selection input screen 500. The fabric selection input screen 500 may be displayed by the fabric selection tool 300 illustrated in FIG. 3 and may be used to collect the basic input data 312 for the fabric selection tool 300. In an example, the input screen 500 may be displayed by the fabric selection wizard module 310, which may receive the basic input data 312 via the input screen 500.

As shown in FIGS. 5A-5H, the fabric selection input screen 500 may comprise a pre-selected fabric input section 510, a site info input section 520, an interior layout input section 530, a façade properties input section 550, a shade certifications input section 570, and/or a recommended fabrics button 580. The different sections may be separated into different portions of the fabric selection input screen 500, such as an upper portion 502 (shown in FIGS. 5A-5E) and a lower portion 504 (shown in FIGS. 5F and 5G), or the sections may be included in the same portion of the fabric selection input screen 500. One or more of the sections may be selected to display windows and/or options that may include additional information for the section.

Figure 5A:
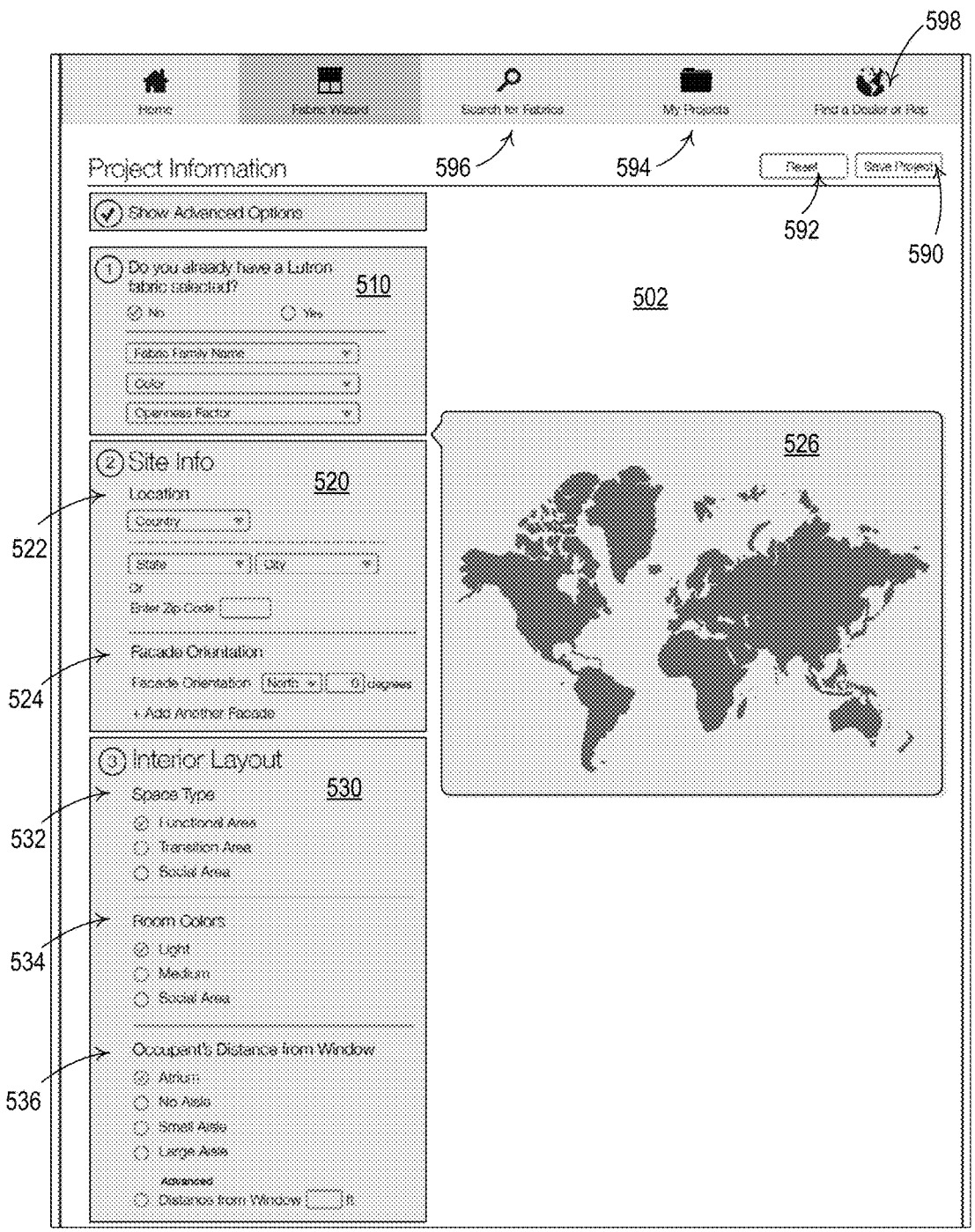
FIGS. 5A-5I show example displays of the fabric selection input screen of a fabric selection wizard module.

Referring to FIG. 5A, the fabric selection input screen 500 may comprise the pre-selected fabric input section 510, the site info input section 520, and/or the interior layout input section 530. The user may indicate whether the user has pre-selected a fabric to use or not in the pre-selected fabric input section 510. The pre-selected fabric may be indicated by fabric family name, color or color family, an openness factor, and/or other fabric information, which may be stored in the fabric data 318 for example.

In the site info input section 520, the user may select the location 522 and/or the façade orientation 524. The location may be indicated by the country, state, city, and/or zip code of the building in which the window treatments may be installed. The façade orientation 524 may be entered for one or more façades of the building. The user may select the orientations from a set of pre-determined orientations that may be provided (e.g., from north, south, east, west, northeast, northwest, southeast, southwest). Each of the orientations may be associated with a façade angle (e.g., north is 0°, south is 180°, etc.). The user may also, or alternatively, be able to enter the specific orientation angle for each façade.

A location window 526 may be displayed in the fabric selection input screen 500 to illustrate the site location. The location window 526 may be displayed next to the site info input section 520 as shown in FIG. 5A. For example, the location window 526 may be displayed while the user is entering the location information. The location window 526 may be displayed in the form of a map location and/or geographic coordinates. The location window 526 may display the selected location of the building as feedback to the user. The user may also, or alternatively, be able to select the location from the location window 526. For example, the location window 526 may display a number of countries, states, and/or cities that the user may select to identify a location of a building of the closest location to the building.

Figure 5B:
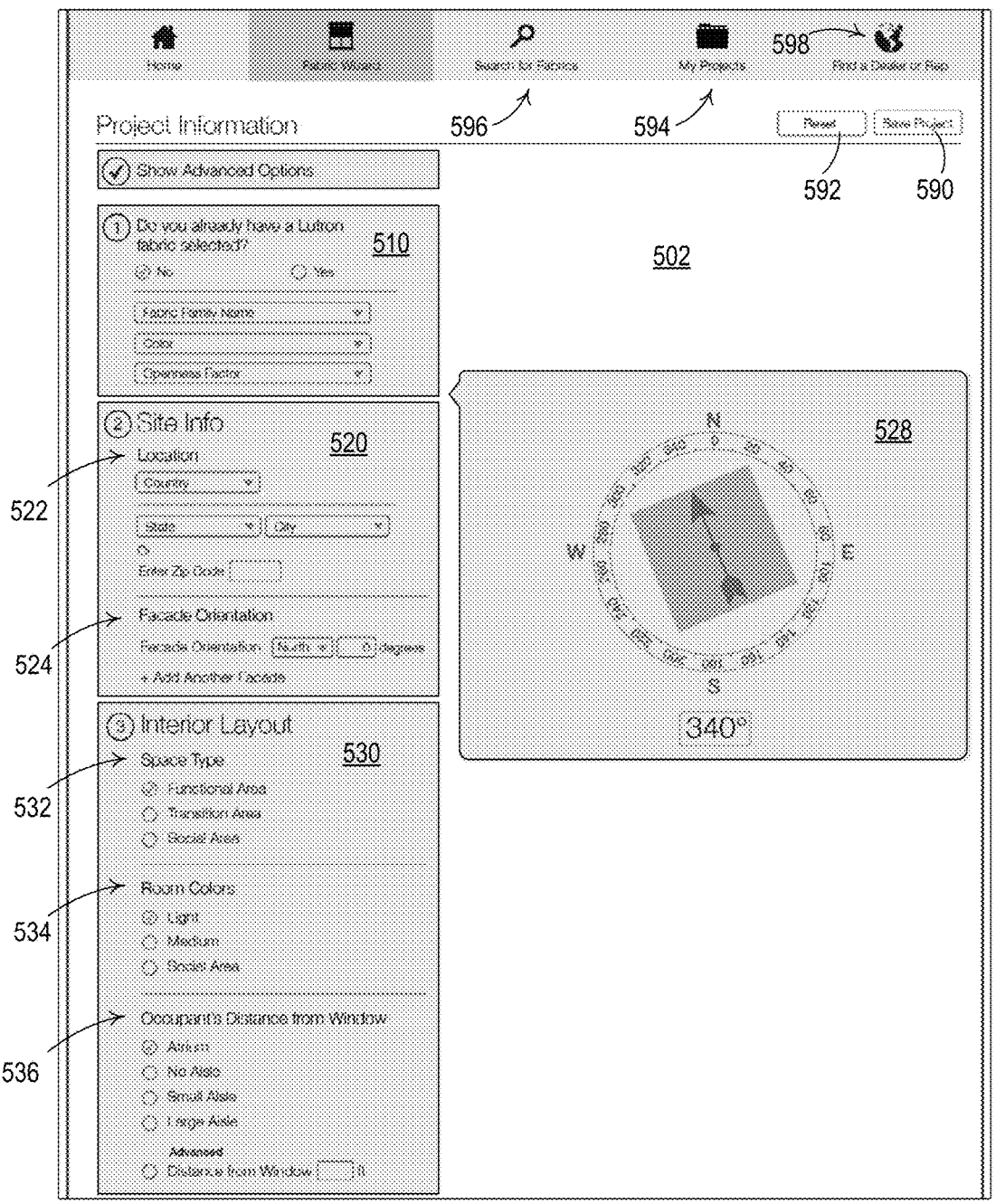

FIG. 5B depicts an example of a compass window 528 that may be displayed in the fabric selection input screen 500 to illustrate the façade angle. The compass window 528 may be displayed while a user may be selecting the façade orientation. The compass window 528 may be displayed next to the site info section 520. The compass window 528 may provide feedback to the user of the selected façade angle. The user may also, or alternatively, be able to select the orientation angle for each façade from the compass window 528. The façade angle indicated in the compass window 528 may be within a range covered by a façade angle identified in the façade orientation 524.

Figure 5C:
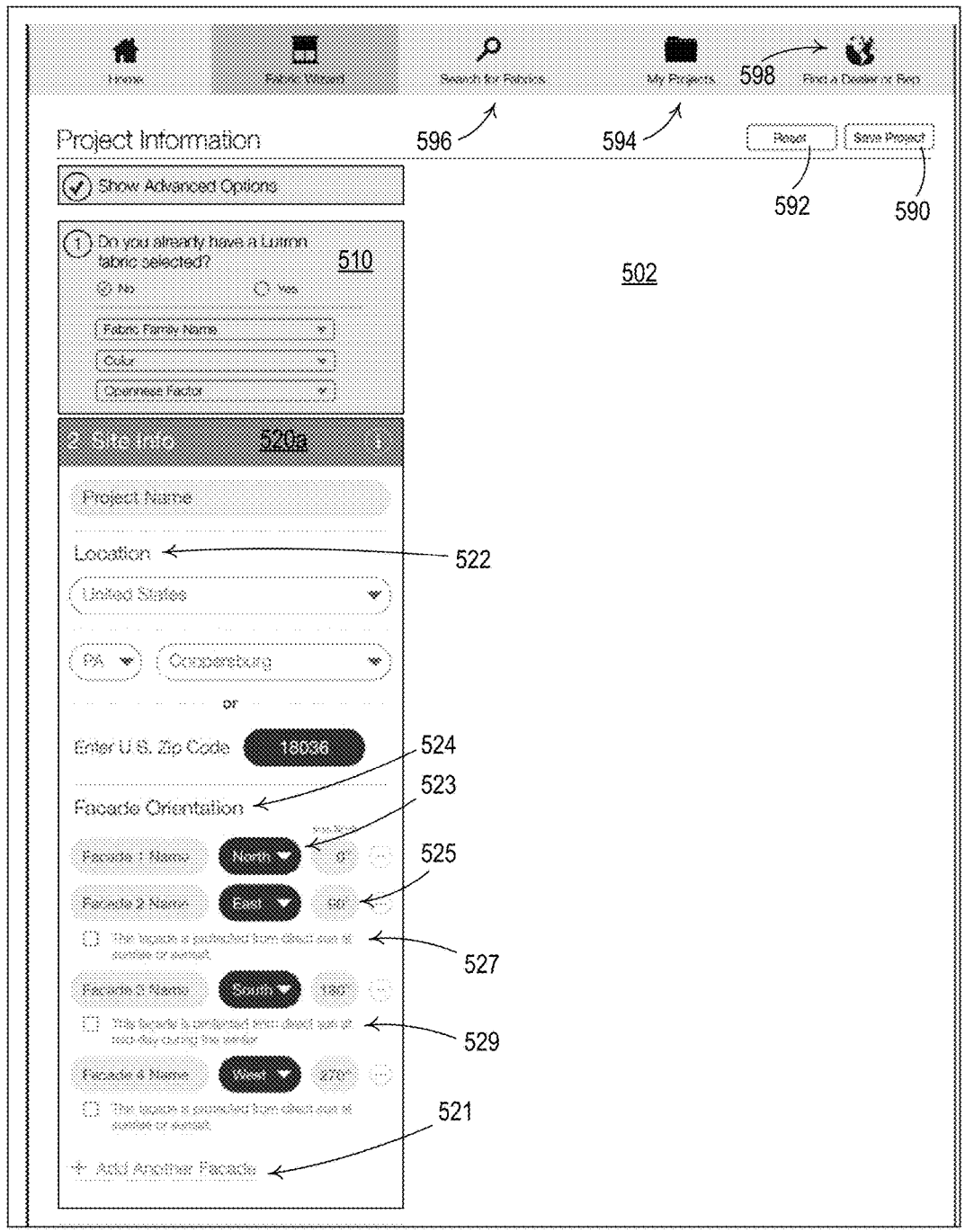

FIG. 5C depicts another example of a site info section 520a that may be displayed in the fabric selection input screen 500. As shown in FIG. 5C, the site info input section 520a may allow for other information to be tracked for the façade orientation 524. The user may select the orientation for each façade from a set of pre-determined orientations 523 that may be provided (e.g., from north, south, east, west, northeast, northwest, southeast, southwest). Each of the orientations may be associated with a façade angle (e.g., north is 0°, south is 180°, etc.) or a range of façade angles. The user may enter the specific orientation angle 525 for each façade. The user may also specify a façade name for each façade that may identify the façade to the user, such as the direction of the façade or a street name along which a façade may be located, for example.

As shown in FIG. 5C, the user may indicate whether a façade is protected from direct sun (e.g., due to a building or other structure). The user may select one or more of the direct sun protection indicators 527, 529 to indicate that the façade is protected from direct sun. The direct sun protection indicators may be provided based on the orientation of a façade. For example, if the façade is facing north, a façade protection indicator may be omitted from being displayed, as the northern façade may not receive direct sun in the location over the course of a day. As illustrated by the direct sun protection indicators 527 and 529, different indicators may be provided based on the orientation of the façade. For example, if the façade is facing east or west (e.g., including northeast, southeast, northwest, or southwest) an indicator 527 may be selected to identify that the façade is protected from direct sun at sunrise or sunset. Though the direct sun protection indicator 527 may be used as a common indicator for building orientations to the east or the west, different indicators may be provided that correspond to the east and west orientations to identify that the façade is protected at sunrise and sunset, respectively. If the façade is facing south (e.g., including southeast or southwest) an indicator 529 may be selected to identify that the façade is protected from direct sun at mid-day during the winter, or the summer depending on the building location.

The user may provide additional façades of the building for being characterized using the façade addition function 521. The user may add any number of façades of the building that shades may be installed. For example, the user may add the number of façades to match the number of façades of the building.

Figure 5D:
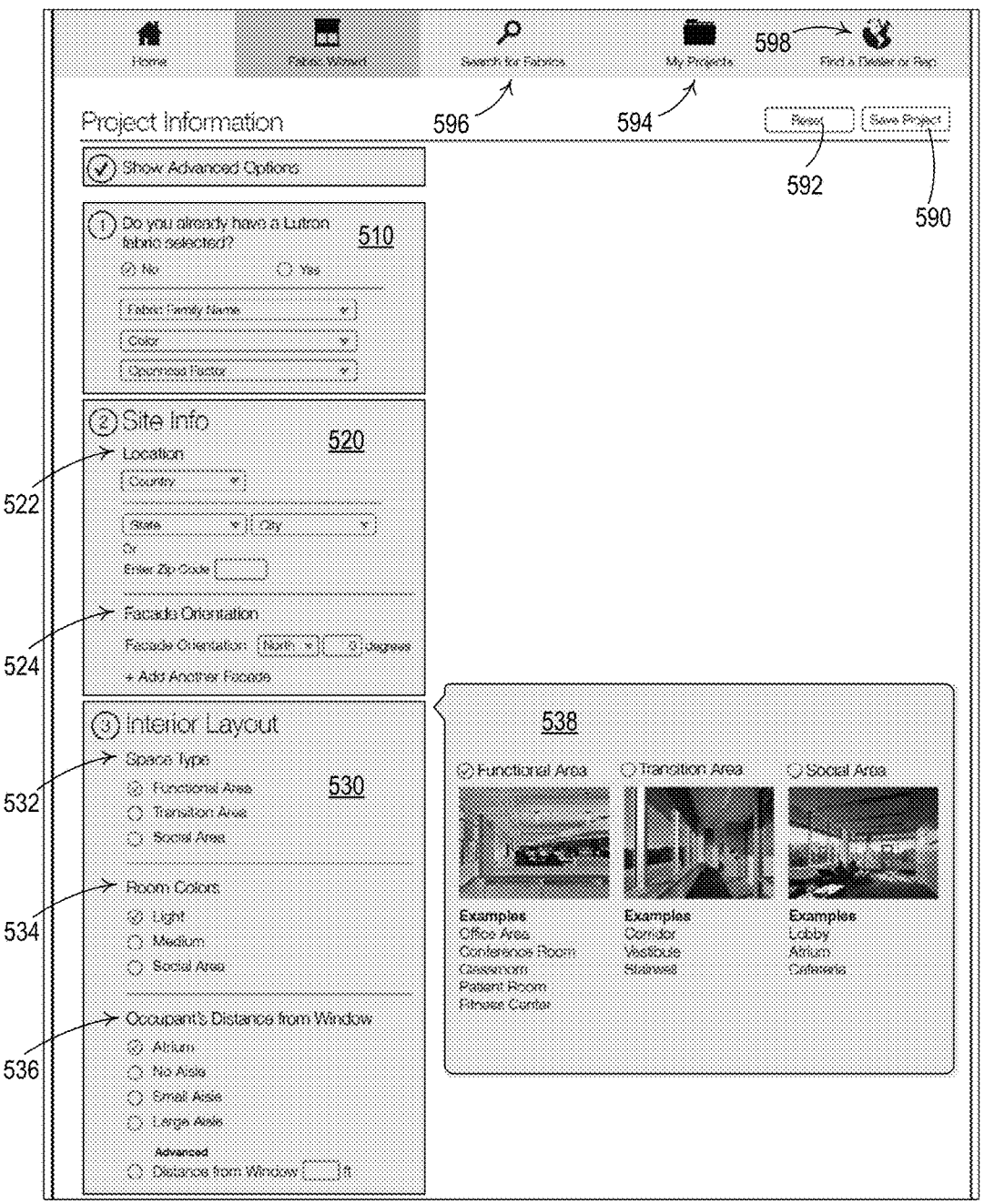
Figure 5E:
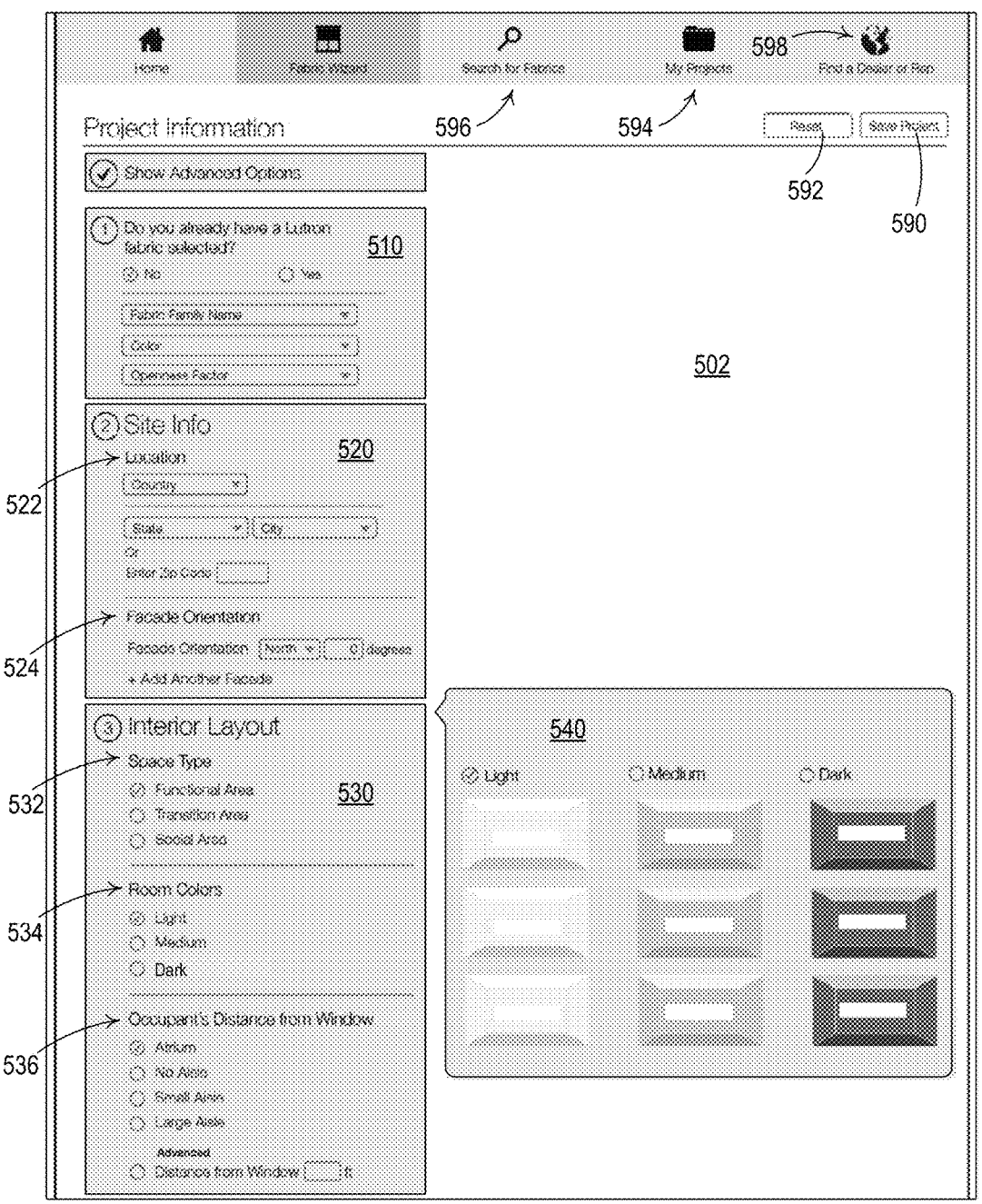
Figure 5F:
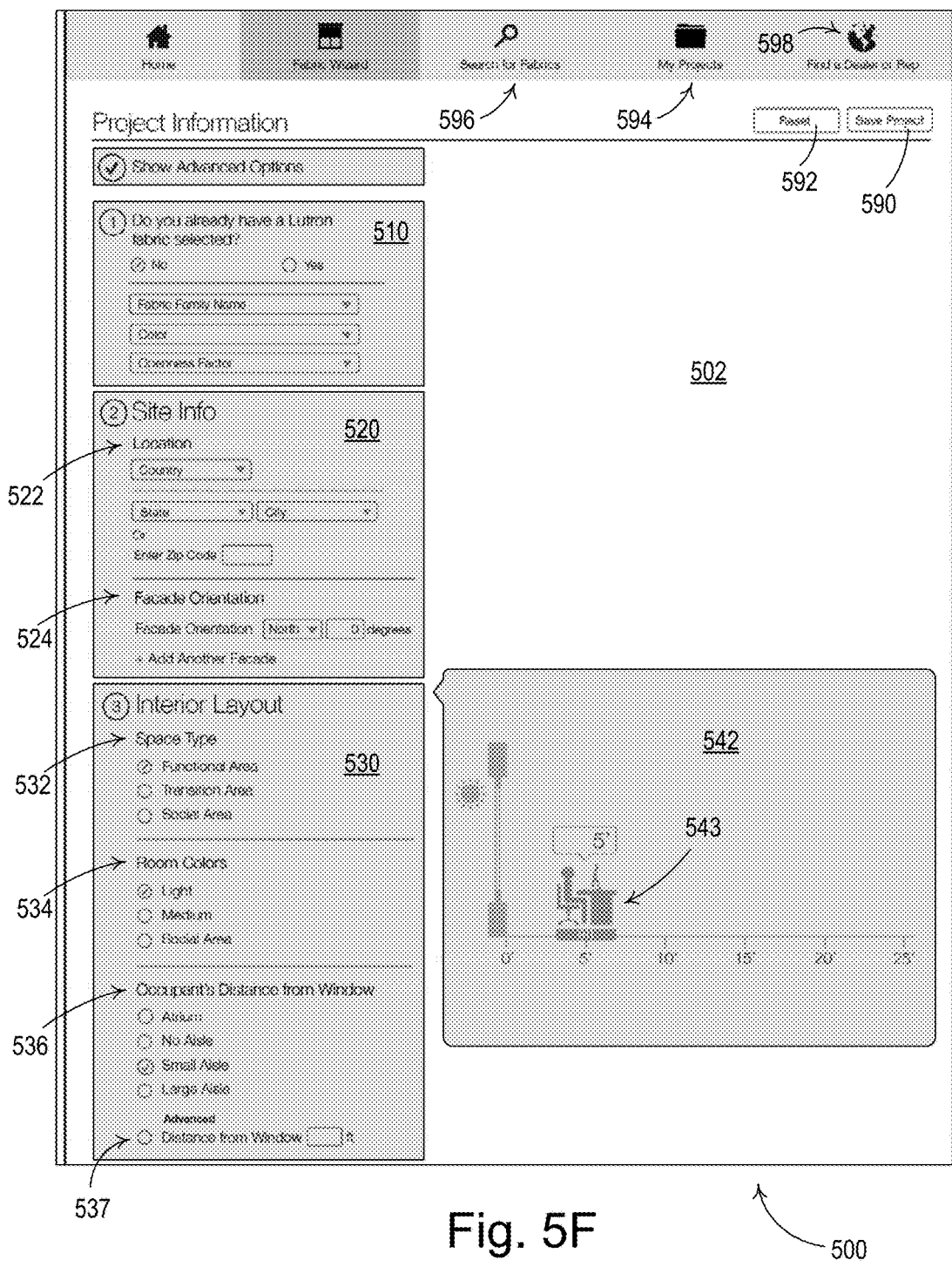

As shown in FIGS. 5D-5F, the user may select the space type 532, room colors 534, and/or an occupant's distance from a window 536, for example, using the interior layout input section 530. The space type 532 may indicate the general use of an area, such as that a space is a functional area, a transition area, and/or a social area. The space type may also, or alternatively, indicate individual rooms, such as an office, a kitchen, a living room, a bedroom and/or the like. FIG. 5D depicts an example of a space type window 538 that may be displayed in the fabric selection input screen 500 to illustrate the space types. The space type window 538 may be displayed while a user may be selecting the space type 532. The space type window 538 may be displayed next to the interior layout input section 530. The space type window 538 may illustrate examples of the options for the space type 532. The space type window 538 may display examples of the selected space type 532 of the building as feedback to the user. The user may also, or alternatively, be able to select the space type 532 from the space type window 538. For example, the user may select the space type 532 as a functional area, a transitional area, or a social area. Examples of the functional area may include an office area, a conference room, a classroom, a patient room, a fitness center, and/or other functional spaces. Transitional areas may include corridors, vestibules, stairwells, and/or other transitional spaces that may be passed through by a user for a short time. Social areas may include lobbies, atriums, cafeterias, and/or other social gathering areas. While the space type window 538 provides more general descriptions of space types with examples of more specific space types, the space type window 538 may allow for selection of the more specific space types.

The fabric selection wizard module 310 may use the selected space type 532 to determine a maximum daylight glare probability value and/or the daylight glare probability value. For example, the fabric selection wizard module 310 may set the maximum daylight glare probability value to 40% for a transitional area, to 35% for a functional area, and/or to 40% for a social area.

The room colors 534 may indicate the shade of the room colors, such as light, medium, and/or dark. The room colors 534 may also, or alternatively, include the room colors themselves, such as red, yellow, green, and/or the like. FIG. 5E depicts an example of a room colors window 540 that may be displayed in the fabric selection input screen 500 to illustrate the room colors 534. The room colors window 540 may be displayed while a user may be selecting the room colors 534. The room colors window 540 may be displayed next to the interior layout input section 530. The room colors window 540 may illustrate examples of the options for room colors 534. The room colors window 540 may display examples of the selected room colors 534 of the building as feedback to the user. The user may also, or alternatively, be able to select the room colors 534 from the room colors window 540. For example, the user may select the room colors 534 from predefined color options, such as light, medium, and/or dark. The room colors window 540 may allow the user to select more specific room colors or options. The room colors 534 may include patterns and/or more specific color options, such as red, yellow, blue, etc. The room colors 534 may include the actual colors of rooms in the building.

The occupant's distance from a window 536 may indicate the distance of the occupant's work space from the window. The occupant's distance from a window 536 may be entered specifically or based on one or more predefined distances. The predefined distances may be identified by the distance type between the occupant and the window. For example, the user may select the occupant's distance from the window from the options: atrium, no aisle, small aisle, and/or large aisle. The fabric selection wizard module 310 may use the selected occupant's distance from the window to determine a buffer zone distance for the building, one or more façades of the building, or one or more rooms of the building. As an example, the buffer zone distance may be two feet for no aisle, five feet for small aisle, and/or eight feet for large aisle. Other predefined buffer zone distances may also be implemented.

FIG. 5F depicts an example of a buffer zone window 542 that may be displayed in the fabric selection input screen 500 to illustrate the occupant's distance from the window 536. The buffer zone window 542 may be displayed while a user may be selecting the occupant's distance from the window 536. The buffer zone window 542 may be displayed next to the interior layout input section 530. The buffer zone window 542 may illustrate examples of the options for the occupant's distance from the window 536. The buffer zone window 542 may display examples of the selected occupant's distance from the window 536 or the defined occupant's distance from the window 537 as feedback to the user. The user may also, or alternatively, be able to select the occupant's distance from the window 536 from the buffer zone window 542. For example, the user may select from predefined distance options, such as atrium, no aisle, small aisle, large aisle, etc. The user may also select or enter an actual distance in the distance buffer zone window 542 (e.g., on the slide bar in buffer zone window 542).

As shown in FIG. 5F, a user may input information using text (e.g., in the form of a dropdown menu, as shown in the pre-selected fabric input section 510, a text box, as shown in the field to define occupant's distance from the window 537, etc.), visual representation (e.g., as shown in the buffer zone slide window 542), a radio button (e.g., as shown in interior layout input section 530), and/or another input function. The text input information may be predefined in a dropdown list, may be set by a network operator, and/or may be set by a user. Additionally, the text input information may include number, letters or other characters. The user may input data using the visual representation by adjusting the visual representation to a predefined position. For example, the user may move the visual representation 543 to a predefined distance left or right to indicate the buffer zone.

Figure 5G:
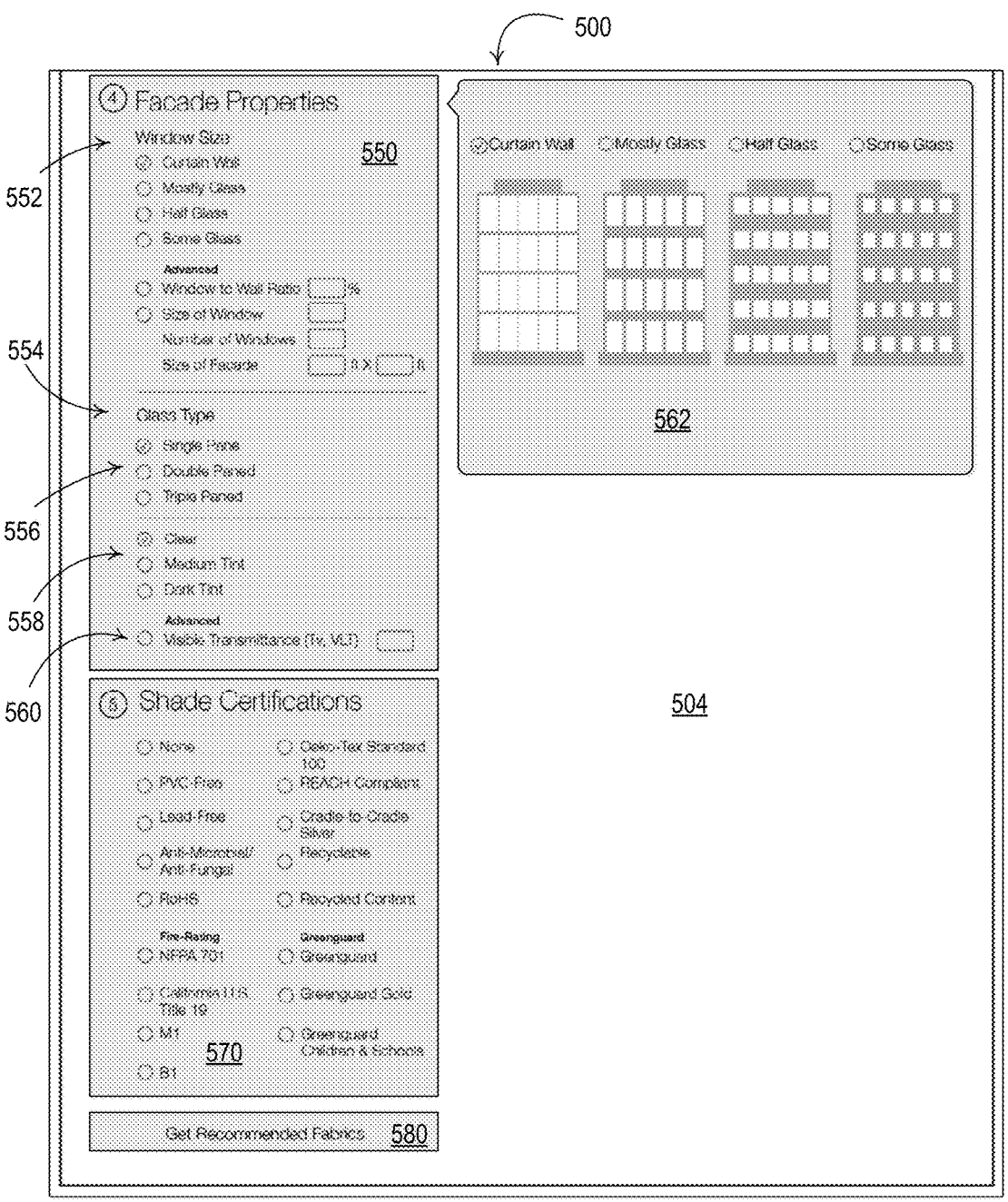

Referring to FIG. 5G, the fabric selection input screen 500 may comprise the façade properties input section 550, the shade certifications input section 570, and/or the recommended fabrics button 580. In the façade properties input section 550, the user may select a window size 552 and/or a glass type 554. The information input in the façade properties input section 550 may be input for each façade or for a single façade that may be representative of the other façades of the building.

The window size 552 may be indicated by a number of predefined window sizes. The window size 552 may be input specifically. The predefined window sizes may approximate the window size 552. The window size 552 may be based on how much of a wall may be occupied by the window, such as a curtain wall window, a mostly glass wall (e.g., greater than half), a half glass wall, a wall that has some glass (e.g., less than half), and/or the like. The actual window size may also, or alternatively, be entered. For example, a user may enter the window-to-wall ratio, the size of the window, the number of windows in the building, and/or the size of a façade that includes the windows. The window-to-wall ratio may be determined (e.g., at the fabric selection wizard module 310) based on the size of a window, the number of windows, and the size of the façade.

As shown in FIG. 5G, a window size window 562 may be displayed in the fabric selection input screen 500 to illustrate the window size 552. The window size window 562 may be displayed while a user may be selecting the window size 552. The window size window 562 may be displayed next to the façade properties section 550. The window size window 562 may illustrate example representations of the predefined window sizes. The window size window 562 may illustrate the specific window size entered by the user. The window size window 562 may display example representations of the window size 552 as feedback to the user. The user may also, or alternatively, be able to select the window size 552 from the window size window 562. The fabric selection wizard module 310 may use the selected window size 552 to determine a window-to-wall ratio for the building, one or more façades of the building, or one or more rooms of the building.

The glass type 554 may include a number of panes 556 in a window in the façade, a tint of the glass 558, and/or a visible transmittance of the glass $T_{V\text{-}GLASS}$ 560. The tint of the glass 558 may be indicated by predefined levels, such as clear, medium tint, dark tint, etc. The tint of the glass 558 may be indicated more specifically, such as by using a percentage of tint. The visible light transmittance of the glass $T_{V\text{-}GLASS}$ 560 may indicate an amount of visible light transmittance that may be allowed through the glass. The visible light transmittance of the glass $T_{V\text{-}GLASS}$ 560 may be based on the number of panes in the window 556. The visible light transmittance of the glass $T_{V\text{-}GLASS}$ 560 may be based on the amount of tint of the glass 558. The visible light transmittance of the glass $T_{V\text{-}GLASS}$ 560 may be indicated as a specific amount (e.g., percentage) or in predefined levels.

Figure 5H:
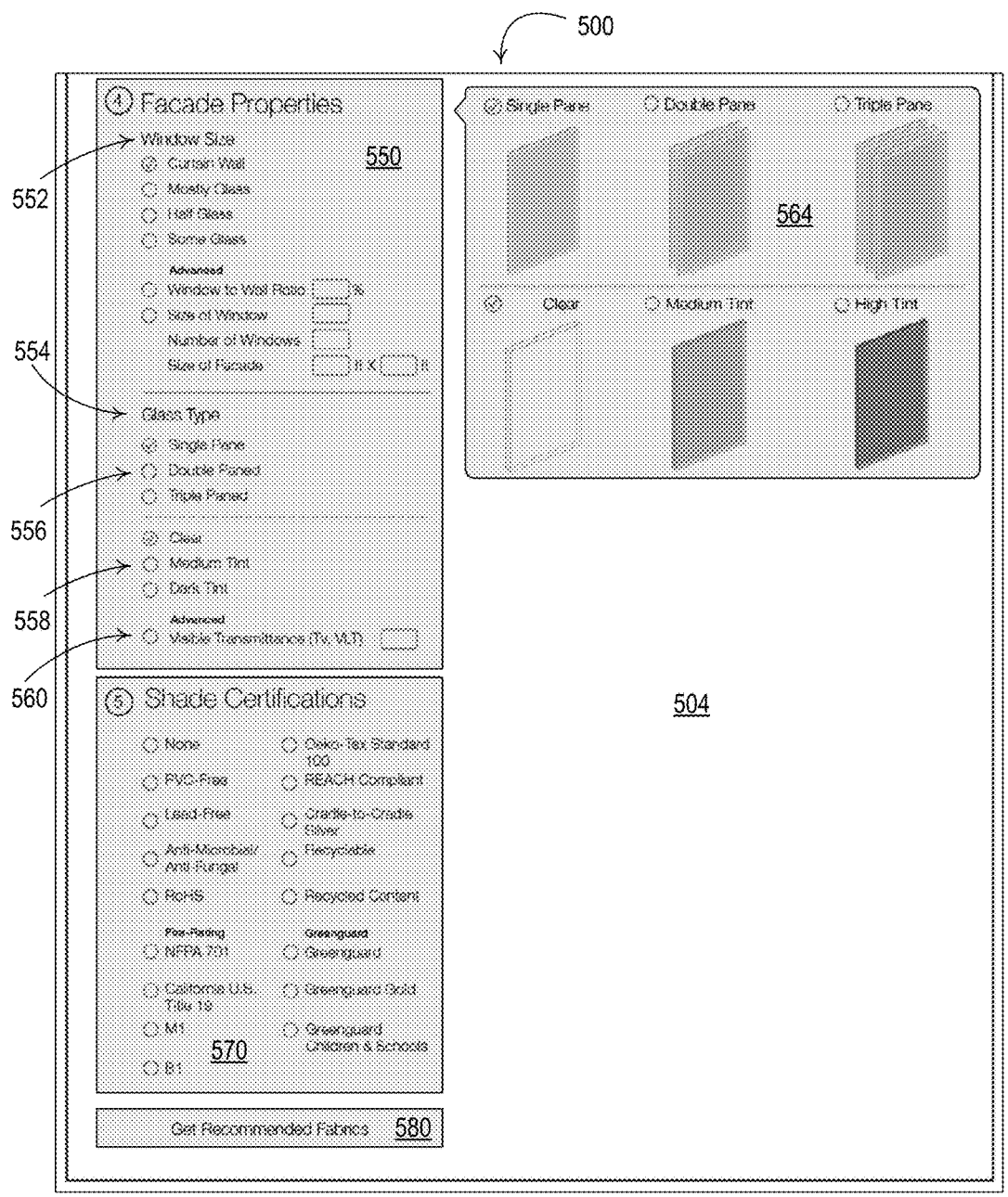

FIG. 5H depicts an example of a glass type window 564 that may be displayed in the fabric selection input screen 500 to illustrate the glass type 554. The glass type window 564 may be displayed while a user may be selecting the glass type 554. The glass type window 564 may be displayed next to the façade properties section 550. The glass type window 564 may illustrate example representations of the number of panes in the window 556, the tint of the glass 558, and/or the visible light transmittance of the glass $T_{V\text{-}GLASS}$ 560 (not shown in FIG. 5H). The glass type window 564 may display example representations of the number of panes in the window 556, the tint 558, and/or the visible light transmittance of the glass $T_{V\text{-}GLASS}$ 560 as feedback to the user. The user may also, or alternatively, be able to select the number of panes in the window 556, the tint of the glass 558, and/or the visible light transmittance of the glass $T_{V\text{-}GLASS}$ 560 from the glass type window 564.

The fabric selection wizard module 310 may use the selected glass type 554 for the windows to determine the visible light transmittance of the glass $T_{V\text{-}GLASS}$ 560. For example, the fabric selection wizard module 310 may use the number of panes in a window in the façade 556 and/or a tint of the glass 558 to determine the visible light transmittance of the glass $T_{V\text{-}GLASS}$ 560. The fabric selection wizard module 310 may use the number of panes in a window in the façade 556, the tint of the glass 558, and/or the visible light transmittance of the glass $T_{V\text{-}GLASS}$ 560 to determine the visible light transmittance of the fabric $T_{V\text{-}FABRIC}$ for the window treatments that may be installed in the building, one or more façades of the building, or one or more rooms of the building.

The user may indicate one or more types of certifications of which shade fabrics of interest may be classified in the shade certifications input section 570. The fabric selection wizard module 310 may use the input from the shade certifications input section 570 to filter out shades without the indicated certifications for recommendation. The shade certifications in the shade certifications input section 570 may include a polyvinyl chloride (PVC)-free certification, a lead-free certification, an anti-microbial/anti-fungal certification, a restriction of hazardous substance (RoHS) certification, an Oeko-Tex Standard 100 certification, a Registration, Evaluation, Authorization and Restriction of Chemicals (REACH) certification, a cradle-to-cradle silver certification, a recyclable material certification, and/or a recycled content certification (e.g., indicating fabric is made of recycled content). The shade certifications may include fire ratings, such as the national fire protection association (NFPA) 701 certification, the California U.S. Title 19 certification, an M1 certification, and/or a B1 certification. The shade certifications may include Greenguard certifications, such as the Greenguard certification, the Greenguard Gold certification, and/or the Greenguard Children and Schools certification.

The user may actuate the recommended fabrics button 580 to enter the data on the fabric selection input screen 500 as basic input data 312 into the fabric selection wizard module 310 and/or the fabric performance engine 316. If one or more of the sections in the fabric selection input screen 500 are missing input data, the fabric selection input screen 500 may indicate that data is missing. The fabric selection wizard module 310 and/or the fabric performance engine 316 may determine fabric selection recommendations when data is missing by using default values for missing data or by using a zero or null value for the missing data that may not be considered by the fabric selection wizard module 310 and/or the fabric performance engine 316.

Figure 5I:
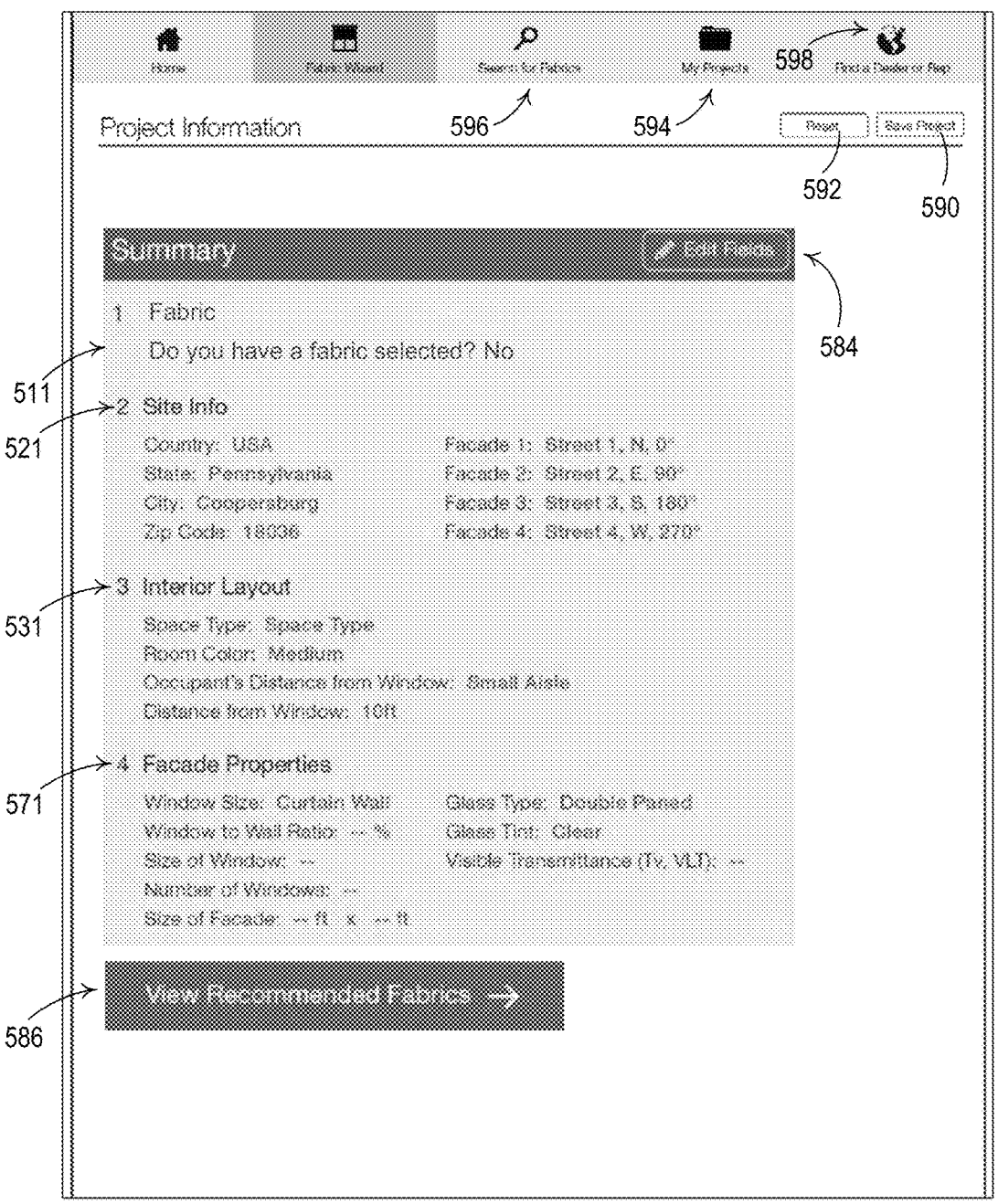

As shown in FIG. 5I, the fabric selection wizard module 310 may display a summary 582 of the information input by the user and/or default values provided by the fabric selection wizard module 310. The summary 582 may be displayed when the user selects the recommended fabrics button 580 prior to retrieving the recommended fabrics. The summary 582 may display pre-selected fabric information 511 identifying whether a fabric was selected in the pre-selected fabric input section 510, site information 521 identified in the site info input section 520 or 520a, interior layout information 531 identified in the interior layout input section 530, façade properties information 551 identified in the façade properties input section 550, shade certifications input information 571 (not shown) identified in the shade certifications input section 570, and/or other input information or default values provided by the fabric selection wizard module 310. The summary 582 may allow the user to edit and/or add information using the edit fields button 584. The edit fields button 584 may take the user to the fabric selection input screen 500, or identified sections therein, or allow the user to edit and/or add information in the summary 582 directly. The user may view the recommended fabrics by selecting the recommended fabrics button 586. Upon selection of the recommended fabrics button 586 or recommended fabrics button 580, the input information 310 may be used to generate the fabric performance output 320 and display the fabric performance output 320, via the fabric selection wizard module 310, to the user.

As shown in FIGS. 5A-5F and 5I, the fabric input selection screen 500 may allow a user to save project parameters using the save project button 590, reset the project parameters using the reset button 592, access saved projects using the projects tab 594, search for specific fabrics using the fabric search tab 596, and/or order fabrics samples or a fabric sample design kit based on the selected parameters using the dealer tab 598. The fabric selection wizard module 310 may save the project parameters to memory upon receiving the save project button 590, reset the project parameters upon selection of the reset button 592, retrieve saved projects upon selection of the projects tab 594, provide a text box or other search criteria to allow a user to search for fabrics upon selection of the fabric search tab 596, retrieve fabrics meeting the search criteria submitted by the user, provide a page for the user to order fabric samples or fabric sample design kits from select dealers upon selection of the dealer tab 598, and/or submit an order for fabric samples or fabric sample design kits to select dealers upon submission by the user.

The fabric selection wizard module 310 may also allow a user to save recommended or preferred fabrics and/or download or print fabric reports (e.g., fabrics specifications, summaries of recommended or preferred fabrics, technical reports for submittal documents, etc.). The user may take one or more of the reports to a window treatment dealer to order the window treatments having the desired fabric. The fabric selection wizard module 310 may provide a screen for ordering window treatments having one of the recommended fabric combinations.

Figure 6:
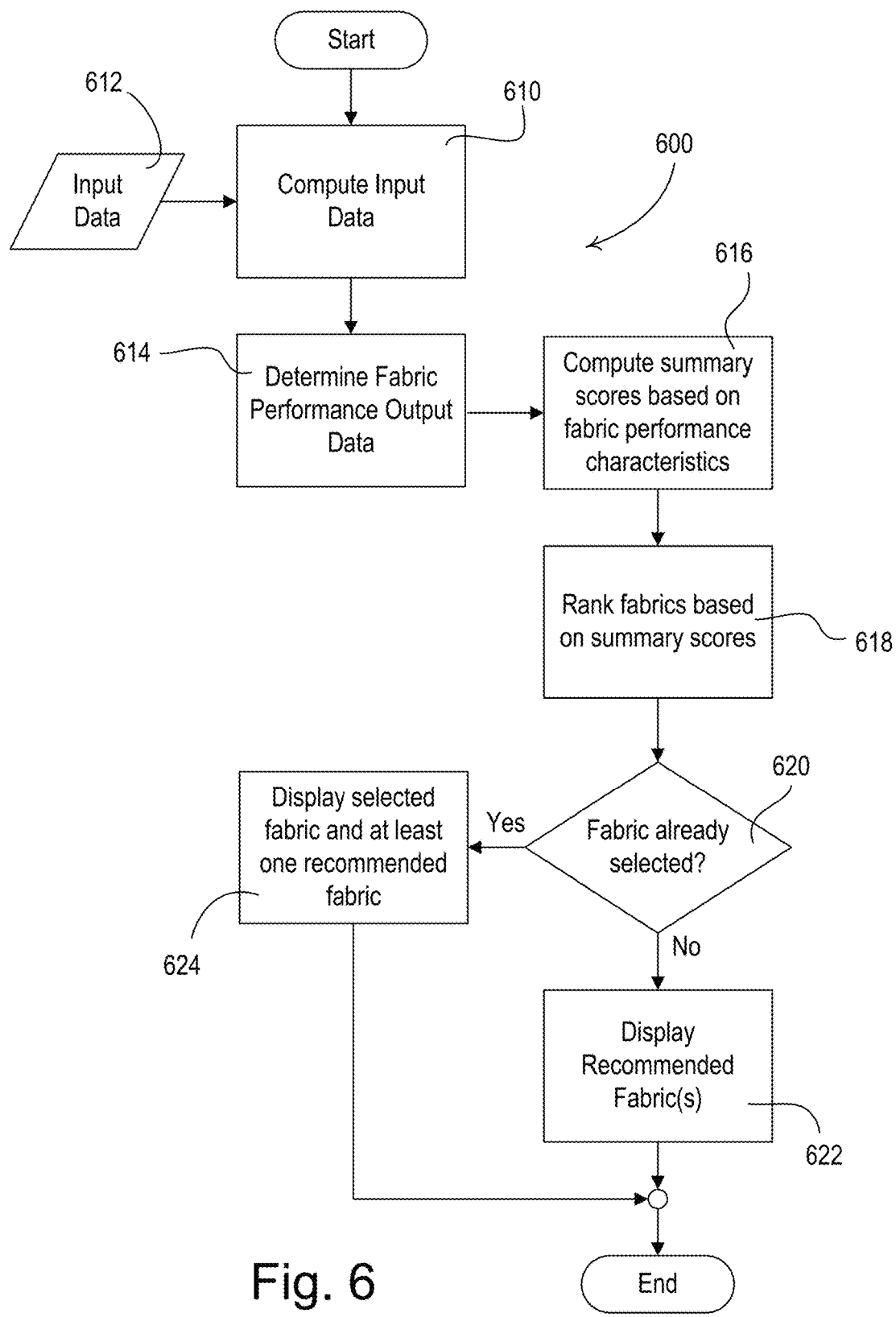
FIG. 6 is a simplified flowchart of a fabric selection procedure for selecting a fabric for a window treatment.

FIG. 6 is a simplified flowchart of a fabric selection procedure 600. The fabric selection procedure 600 may be executed by a fabric selection tool, such as the fabric selection tool 300 shown in FIG. 3, for example. At 610, the fabric selection wizard module 310 may collect basic input data 612 (e.g., the basic input data 312 illustrated in FIG. 3) and may compute the fabric performance input data 314 in response to the collected basic input data 612. The fabric selection wizard module 310 may display a fabric selection input screen (e.g., on the web browser or other application) for collecting the basic input data 612 from a user. At 610, the fabric selection wizard 310 may compute the fabric performance input data 314 based on the basic input data 612.

The computed fabric performance input data 314 may be used for determining fabric performance data at 614. The fabric performance engine 316 may receive the computed fabric performance input data 314. The fabric performance engine 316 may use the computed fabric performance input data 314 to calculate the fabric performance output 320. For example, the fabric performance engine 316 may analyze one or more fabrics in the fabric data 318 according to the computed fabric performance input data 314 to generate the fabric performance output 320. The calculated fabric performance output 320 may include the daylight glare probability value, the maximum daylight glare probability value, the spatial daylight autonomy value, and/or the view rating. The fabric performance output 320 of each fabric may be calculated as a function of the computed fabric performance input data 314 and/or the fabric data 318 (e.g., the fabric openness factor (OF), the visible light transmittance of the fabric $T_{V\text{-}FABRIC}$, the fabric color group, the control type, etc.). Example functions for calculating variables in the fabric performance output 320 are indicated in Equations 10 to 13 below.

$$\text{DGPValue(FabricID)}=f(\text{Input};\text{OF};T_{V\text{-}FABRIC};\text{Color-Group};\text{ControlType}) \qquad \text{Equation 10:}$$

$$\text{sDA(FabricID)}=f(\text{Input};\text{OF};T_{V\text{-}FABRIC};\text{ColorGroup};\text{ControlType}) \qquad \text{Equation 11:}$$

$$\text{MaxDGPValue(FabricID)}=f(\text{Input}) \qquad \text{Equation 12:}$$

$$\text{ViewRating(FabricID)}=f(\text{Input};\text{ControlType}) \qquad \text{Equation 13:}$$

The view rating may provide the average height that bottom of shade may be above the floor (e.g., in inches). For example, if a view rating value is 74, then on average, bottom of the fabric of the window treatment is 74 inches above floor. The view rating may also be quantified as the average percent of window unobstructed by a window treatment across a year. The average percent may be calculated by taking the daily average of window unobstructed by a window treatment during daylight hours for each day in a calendar year.

As illustrated in Equations 10 to 13, the calculated fabric performance output 320 for a given fabric may include the daylight glare probability value (e.g., as shown in Equation 10), a spatial daylight autonomy value (e.g., as shown in Equation 11), a maximum daylight glare probability value (e.g., as shown in Equation 12), a view rating (e.g., as shown in Equation 13), and/or a view clarity rating value. The fabric performance output 320 for a given fabric may be affected by input data (e.g., the basic input data 612 and/or the computed fabric performance input data 314), the fabric data 318 (e.g., openness factor, $T_{V\text{-}FABRIC}$, and/or color group), and/or the type of control that may be used for controlling the window treatment (e.g., automated or manual control). The functions illustrated in Equations 10 to 13 may determine the respective values for a given fabric, which may be input as a fabric identifier, for example.

As illustrated in Equations 10 and 11, the resulting daylight glare probability value and/or the spatial daylight autonomy value of a fabric may be affected by the basic input data 612, the computed fabric performance input data 314, and/or the fabric data 318. The daylight glare probability value and/or the spatial daylight autonomy value may be higher for fabrics that have a greater openness factor, greater visible light transmittance $T_{V\text{-}FABRIC}$, or lighter color group at a location (e.g., a latitude and longitude) that receives more daylight or a greater maximum daylight intensity level. The fabrics with a greater openness factor, greater visible light transmittance $T_{V\text{-}FABRIC}$, or lighter color group may receive a higher score for the daylight glare probability value or the spatial daylight autonomy value when used at a façade angle or a building orientation that receives more daylight or a greater maximum daylight intensity level.

As illustrated in Equations 10-12, the resulting daylight glare probability value, the spatial daylight autonomy value, and/or the maximum daylight glare probability value of a fabric may be affected by the basic input data 612, the computed fabric performance input data 314, and/or the fabric data 318. The fabrics with a greater openness factor, greater visible light transmittance $T_{V\text{-}FABRIC}$, or lighter color group may receive a higher score for the daylight glare probability value, for the maximum daylight glare probability value, and/or for the spatial daylight autonomy value when used in a space that has a shorter buffer zone or a lower window-to-wall ratio. The fabrics with a greater openness factor, greater visible light transmittance $T_{V\text{-}FABRIC}$, or lighter color group may receive a higher score for the daylight glare probability value, for the maximum daylight glare probability value, and/or for the spatial daylight autonomy value when the glass type or visible light transmittance of the glass $T_{V\text{-}GLASS}$ allows more visible light through the glass. The fabrics with a greater openness factor, visible light transmittance $T_{V\text{-}FABRIC}$, or lighter color group may receive a higher score for the daylight glare probability value, for the maximum daylight glare probability value, and/or for the spatial daylight autonomy value when the space type receives more visible light, the maximum amount of daylight glare at a space is higher, the amount of time the space receives daylight glare is higher, or the room colors are lighter. As described above, the increased score for the variables in Equations 10-12 may be used indicate an increased amount of daylight or daylight glare. Other scoring systems may also be used.

As illustrated in Equations 12 and 13, the maximum daylight glare probability value and/or the view rating for a fabric may be affected by the basic input data 612 and/or the computed fabric performance input data 314. For example, the view rating may differ based on space type. In a space type for which the view is less important, such as a transition area for example, the view rating may be lower because the view may be less important to an occupant. In a space type for which the view may be more important, such as a social area or a functional area for example, the view rating may be higher because the view may be more important to an occupant. The maximum daylight glare probability value may also differ based on space type. In a space type for which the amount of glare may be perceived for a shorter period of time by the occupant, such as a transition area for example, the maximum daylight glare probability value may be greater because it may be less noticeable or bothersome to the occupant. In a space type for which the amount of glare may be perceived for a longer period of time by an occupant, such as a social area or a functional area, the maximum daylight glare probability value may be lower because it may be more noticeable or bothersome to the occupant. The fabrics that receive a greater daylight glare probability value may have a higher view rating. This may be because the shades allow more light to pass through, thus increasing the view. Similarly, the fabrics that are used at a façade angle and/or a building orientation that receives more daylight and/or a greater maximum daylight intensity level may receive a lower view rating due to the lower shade level limiting the glare. The fabrics that may be used in a space that has a shorter buffer zone, and/or a lower window-to-wall ratio may receive a lower view rating, as the user may have a smaller view when closer to a bigger window. When the glass type and/or the visible light transmittance of the glass $T_{V\text{-}GLASS}$ allow more visible light through, the fabrics may receive a higher view rating as a better view may be perceived. These fabrics, however, may receive a lower view score, or such scores may be mitigated, when the shades are lowered due to the increased amount of daylight. As described above, the increased score for the variables in Equations 12 and 13 may be used indicate an increased maximum daylight glare probability value and view, respectively, but other scoring systems may be used.

The daylight glare probability value and/or the maximum daylight glare probability value may be calculated based on the originally received basic input data 612. For example, the basic input data 612 may be passed through the fabric selection wizard module 310 as an input for the fabric performance engine 316 without additional calculations being performed. The daylight glare probability value and/or the spatial daylight autonomy value may be calculated based on how an identified fabric in the fabric data 318 performs under the conditions indicated in the basic input data 612 and/or the computed fabric performance input data 314. The maximum daylight glare probability value and/or the view rating may be based on the basic input data 612 and/or the computed fabric performance input data 314. The daylight glare probability value, the spatial daylight autonomy value, the maximum daylight glare probability value, and/or the view rating may each be determined based on a manual or automated control of the shades, as described herein.

As described above, window treatments having the fabrics in the fabric data 318 may perform differently based on the basic input data 612 and/or the computed fabric performance input data 314. The fabric performance output 320 may include the performance metrics for each fabric in the fabric data 318 or a subset of the fabrics in the fabric data 318. The subset of fabrics may be based on input data on which the fabrics in the fabric data 318 may be filtered, such as fabrics with an identified openness factor, visible light transmittance $T_{V\text{-}FABRIC}$, color or color group, view clarity rating, certification, and/or the like.

A given fabric may generate a different amount of daylight glare and/or a different spatial daylight autonomy rating depending upon the installation location in the building (e.g., the façade on which the window treatment is installed). The fabric performance engine 316 may analyze each fabric of the fabric data 318 at the different façades. The analysis may be performed based on the orientation angle of each façade. The fabric performance engine 316 may include performance metrics in the fabric performance output 320 regarding each of the façades along which the window treatments may be installed.

At 614, the fabric performance engine 316 may analyze each fabric of the fabric data 318 based on automated and/or manual control. The fabrics in the fabric data 318 may perform differently under automated (e.g., motorized) control than under manual control. Automated (e.g., motorized) control of the window treatments may provide for increased energy savings and/or comfort for the occupants. The fabric performance engine 316 may include performance information in the fabric performance output 320 that indicates the performance of the fabric when the fabric is in a window treatment performing under automated and/or manual control.

At 614, the fabric selection wizard module 310 may choose the performance characteristics from the fabric performance output 320 that may be relevant to the configurations of the building in which the window treatment may be installed. For example, the fabric performance engine 316 may provide the fabric performance output 320 to the fabric selection wizard module 310 that conforms to the environment in which the window treatment may be installed (e.g., location, façade orientation, buffer zone, window size, glass type, space type, window-to-wall ratio, the visible light transmittance of the glass $T_{V\text{-}GLASS}$, etc.). In another example, the fabric performance engine 316 may provide fabric performance output 320 that includes performance data for various environments (e.g., location, façade orientation, buffer zone, window size, glass type, space type, window-to-wall ratio, the visible light transmittance of the glass $T_{V\text{-}GLASS}$, etc.) to the fabric selection wizard module 310. The fabric selection wizard module 310 may select the data in the fabric performance output 320 that conforms to the environment in which the window treatment may be installed. The environment in which the window treatment may be installed may be determined based on the basic input data 612 and/or the computed fabric performance input data 314.

Since the fabric data 318 may include multiple fabrics within the same family and color group, but other different characteristics (e.g., openness factors and/or transmittances), the fabric selection wizard module 310 may analyze the performance metrics for the fabrics having a given family and/or color group across the different façades of the building. The fabric selection wizard module 310 may generate a combination matrix that has an entry for each unique combination of fabrics that may exist on the multiple façades of the building at 614. Each unique combination of fabrics may have the same family and/or color group. For example, if the building has four façades, each entry of the combination matrix may have four identifiers (e.g., a fabric for each of the four façades). The identifiers indicate fabrics having the same family and/or color group, but possibly differing openness factors and transmittances.

For each entry in the combination matrix, the fabric selection wizard module 310 may calculate a combined daylight glare probability value, a combined spatial daylight autonomy value, a combined maximum daylight glare probability value, and/or a combined view rating for the four identifiers in that entry of the combination matrix. The combined daylight glare probability value may be an average of the daylight glare probability value for each façade. The combined daylight glare probability value may be based on the worst case daylight glare probability value across the façades. The combined spatial daylight autonomy value may be an average of the spatial daylight autonomy value for each façade. The combined spatial daylight autonomy value may be based on the worst case spatial daylight autonomy value across the façades. The combined maximum daylight glare probability value may be an average of the maximum daylight glare probability value for each façade. The combined maximum daylight glare probability value may be based on the worst case daylight glare probability value across the façades. The combined view rating may be an average of the view rating for each façade. The combined view rating maybe based on the worst case view rating across the façades. The fabric selection wizard module 310 may store the combined daylight glare probability value, the combined spatial daylight autonomy value, and/or the combined view rating in each entry of the combination matrix.

At 616, the fabric selection wizard module 310 may compute one or more summary scores based on the entries in the fabric performance output 320. For example, the fabric selection wizard module 310 may compute a glare score, a daylight score, and/or a view score. The fabric selection wizard module 310 may also compute a direct glare score for one or more fabrics in the fabric performance output 320. The glare score, the daylight score, and/or the view score may be calculated based on a combined score for the building that may be stored in the combination matrix. The glare score may be calculated based on the combined daylight glare probability value for each fabric in the combination matrix. The daylight score may be calculated based on the combined spatial daylight autonomy value for each fabric in the combination matrix. The daylight score may be the same and/or may be used interchangeably with the daylight score. The view score may be calculated based on the combined view rating and/or view clarity rating. The glare score, the daylight score, and/or the view score may be calculated for automated and/or manual window treatments.

In another example, the summary scores may be calculated for each façade. Similarly, predicted performance metrics may be calculated for each façade. The summary scores may also be calculated for multiple facades. Similarly, predicted performance metrics may be calculated for multiple façades. The scores for the façades may be calculated using each fabric. Fabric set scores may be calculated, for example, for different sets of fabrics for multiple facades. The fabric set score may indicate a performance of a set of fabrics when each fabric is used in a window treatment on a different façade of the building. Each fabric in a set of fabrics may have characteristics that are the same of different. For example, the fabrics in a set of fabrics may be of the same family or color group. If the same fabric or fabric family, color group, color and/or openness factor are used for the facades, the scores across the facades may be calculated, for example, when combining multiple facades. A fabric family may comprise a plurality of fabrics with the same material, same texture, or same manufacturer. A color group may comprise a plurality of fabrics with varying shades of a same color or a plurality of fabrics with a combination of colors including at least one color that is the same color. If the same fabric color is used for the facades, an openness factor (e.g., the best openness factor) may be selected by each façade, and the summary scores may be calculated across the facades, for example, when combining multiple facades.

The glare score may indicate a predicted amount of glare resulting in a building from use of the at least one fabric in the window treatment. The fabric selection wizard module 310 may set the glare score at a relatively higher level if the daylight glare probability value for the entry in the fabric performance output 320 is lower than a predefined high level threshold. The high level threshold may be the maximum daylight glare probability value. The fabric selection wizard module 310 may set the glare score at a relatively lower level if the daylight glare probability value for the entry in the fabric performance output 320 is equal to or greater than a predefined low level threshold. The fabric selection wizard module 310 may set the glare score at a level between the high level and the low level, for example, if the daylight glare probability value for the entry in the fabric performance output 320 is between the high level and low level thresholds.

In an example in which the daylight glare probability value indicates a number of hours of daylight glare over a period of time, the fabric selection wizard module 310 may set the glare score equal to 100% if the average daylight glare probability value for the entry in the combination matrix is at zero hours. The fabric selection wizard module 310 may set the glare score equal to 50% if the average daylight glare probability value is less than or equal to the allowed annual hours of potential glare (e.g., from the basic input data 612 and/or the computed fabric performance input data 314). The fabric selection wizard module 310 may set the glare score equal to zero if the average daylight glare probability value is greater than the allowed annual hours of potential glare.

The glare score may also, or alternatively, be a function of the maximum daylight glare probability value from the basic input data 612 and/or the computed fabric performance input data 314 computed at 610. For example, the fabric selection wizard module 310 may set the glare score equal to 100 if the daylight glare probability value is less than the maximum daylight glare probability value. If the daylight glare probability value is greater than the maximum daylight glare probability value, but is less than the maximum daylight glare probability value plus ten percent, then the fabric selection wizard module 310 may set the glare score as illustrated in Equation 14.

$$\text{GlareScore(FabricID)}=100-(\text{DGPValue(FabricID)}-\text{MaxDGPValue(FabricID)})*1000 \quad \text{Equation 14:}$$

If the daylight glare probability value is greater than or equal to the maximum daylight glare probability value, then the fabric selection wizard module 310 may set the glare score to zero indicating a poor glare score.

The glare score may be calculated based on the daylight glare probability value for each façade of a building. The glare score may be based on the daylight glare probability value, the average daylight glare probability value, the hours a daylight glare probability value is exceeded annually, and/or the maximum daylight glare probability value. The maximum daylight glare probability value may be based on an industry recommended value for the daylight glare probability value of a fabric. The daylight glare probability value and/or maximum daylight glare probability values may be space specific. For example, daylight glare probability value and/or maximum daylight glare probability values may change depending upon whether the space is a work space, a transitional space, or a social space. For example, a 30% daylight glare probability value is optimal for a work space, while a 35% daylight glare probability value is optimal for a social space or a transitional space. The glare score may indicate the visual discomfort that is perceived when a high intensity of diffuse light is transmitted through a fabric. The glare score may indicate the visual discomfort that is perceived when a high intensity of diffuse light is transmitted through a fabric.

Using a calculated glare score, the fabric selection wizard module 310 may calculate a direct glare score. A direct glare score may indicate the reduction in glare based on the fabric. The direct glare score may be based on the glare score and/or the direct glare adjustment score. The direct glare adjustment score may be based on the maximum direct visual transmittance of a fabric (Direct $T_{V\text{-}MAX}$). The Direct $T_{V\text{-}MAX}$ may be a variable indicating when the sun is at its lowest angle relative to the façade. The Direct $T_{V\text{-}MAX}$ variable may be a calculated according to Equation 15, and may be a function of the openness factor of the fabric and the input.

$$\text{Direct } T_{V\text{-}MAX}=f(\text{Input};OF) \quad \text{Equation 15:}$$

The Direct $T_{V\text{-}MAX}$ may increase as the openness factor of the fabric increases. The input in the Direct $T_{V\text{-}MAX}$ variable may include the visual transmittance of the glass, the orientation of façade and/or latitude and longitude of the façade. Based on the inputs, the angle of the sun may be determined relative to the façade. Using the angle of the sun relative to the building and the light transmitted through the glass and the fabric at that angle, the percentage of sun rays that pass through the fabric and glass may be determined. The direct glare adjustment score may also be based on a maximum visual transmittance direct ($MAX(T_{V\text{-}DIRECT})$) variable of the fabric. The $MAX(T_{V\text{-}DIRECT})$ variable may be a modifier for the Direct $T_{V\text{-}MAX}$ variable based on the space type (e.g., work space, transitional space, social space). The $MAX(T_{V\text{-}DIRECT})$ may indicate the ideal limit for direct sun glare such that the average occupant perceives no visual discomfort. Using the Direct $T_{V\text{-}MAX}$ and $MAX(T_{V\text{-}DIRECT})$, the direct glare adjustment score may be calculated. For example, an equation for calculating the direct glare adjustment score may be illustrated in Equation 16 below.

$$\text{Direct Glare Adjustment Score}=(\text{Direct } T_{V\text{-}MAX}(\text{fabric})-MAX(T_{V\text{-}DIRECT})*50 \quad \text{Equation 16:}$$

The direct glare adjustment score may indicate the reduction in overall glare score to account for glare from direct view of the sun orb. The factor of 50 represents a scaling factor. For example, since the $MAX(T_{V\text{-}DIRECT})$ changes with space type, in a work space, the $MAX(T_{V\text{-}DIRECT})$ may be equal to 1. The Direct $T_{V\text{-}MAX}$ may be between 1 to 3, with 1 being the best and 3 being the worst, to ideally obtain a zero glare adjustment score. In a transitional space or social space, however, the $MAX(T_{V\text{-}DIRECT})$ may be equal to 2. The Direct $T_{V\text{-}MAX}$ may be between 2 to 4, with 2 being the best and 4 being the worst, to ideally obtain a zero glare adjustment score.

The direct glare score may indicate the reduction in glare based on metrics computed for closed shades for maximal glare control, or metrics computed based on automated shades. The fabric selection wizard module 310 may calculate the direct glare score based on the glare score and the direct glare adjustment. For example, an equation for calculating the direct glare score may be illustrated in Equation 17 below.

$$\text{Direct Glare Score}=\text{Glare Score}-\text{Direct Glare Adjustment} \quad \text{Equation 17:}$$

The glare score for each façade may be combined (e.g., averaged or based on the lowest glare score for each façade) to determine the glare score for the building. For example, an equation for calculating the glare combined score is illustrated in Equation 18 below.

$$\text{GlareCombined} = (\Sigma(\text{Direct Glare Score})_1 + \ldots + (\text{Direct Glare Score})_n)/n \qquad \text{Equation 18:}$$

The combined glare score may be calculated using the average direct glare scores for each facade or the worst calculated direct glare scores for each façade. In Equation 18, the average of the direct glare scores is computed, such that n equals the total number of glare summary scores, which is equal to the number of facades.

The daylight score may be calculated based on the spatial daylight autonomy value for each façade of the building. To compute the daylight scores, the fabric selection wizard module 310 may set the daylight scores based on the spatial daylight autonomy value of the fabrics. The daylight scores for each fabric may be determined based on the glare score for the fabric. The fabric selection wizard module 310 may determine the fabric that has the highest spatial daylight autonomy value of the fabric when combined with a glare score. For example, the fabrics with the highest daylight scores having a glare score of 100% may be assigned a daylight score of 100%. As the spatial daylight autonomy value decreases for the fabrics at each glare score, the daylight score also decreases. The daylight scores may similarly decrease as the glare scores decrease, for example, when values other than 100% for the glare score are used.

The fabric selection wizard module 310 may set the daylight scores for the other fabric combinations by normalizing the spatial daylight autonomy ratings as compared to the spatial daylight autonomy rating of the fabric combination having the daylight score of 100%. For example, the fabric selection wizard module 310 may set the daylight score of each other fabric combination equal to the spatial daylight autonomy rating of that combination divided by the spatial daylight autonomy rating of the fabric combination having the daylight score of 100%. The fabric selection wizard module 310 may limit the daylight scores to 100% or less.

TABLE 1 illustrates an example for calculating the daylight score based on the glare score and the spatial daylight autonomy value.

TABLE 1

| sDA | Glare Score | Daylight Score |
|---|---|---|
| 60% | 66% | 100% |
| 50% | 66% | 100% |
| 40% | 100% | 100% |
| 30% | 100% | 75% |
| 20% | 33% | 50% |
| 10% | 66% | 25% |

As shown in TABLE 1, the spatial daylight autonomy values that are associated with the highest glare score (e.g., a glare score of 100%) may set the upper limit for the daylight score. In the example shown in TABLE 1, the shade fabric having a 40% spatial daylight autonomy value may receive the upper limit for the daylight score (e.g., daylight score of 100%). In TABLE 1, the spatial daylight autonomy values above the spatial daylight autonomy that is determined to be the upper limit may receive the highest daylight score (e.g., 100%), regardless of glare score. The spatial daylight autonomy values below the upper limit may receive a fraction of the highest daylight score, regardless of glare score. For example, in TABLE 1, as the spatial daylight autonomy value moves down by 10%, the daylight score moves down by 25%. In other examples, the daylight score may change by different amounts relative to the spatial daylight autonomy value, or the spatial daylight autonomy value and the glare score may each be considered to determine each daylight score. For example, the spatial daylight autonomy value and the glare score may be added or averaged to determine each daylight score.

The fabric selection wizard module 310 may calculate the daylight score based on the automated spatial daylight autonomy value for each façade of the building. The daylight score may indicate a predicted amount of daylight resulting in the interior space from use of the fabric in the window treatment. The fabric selection wizard module 310 may calculate the summary daylight score based on the spatial daylight autonomy limit value. The spatial daylight autonomy limit value may be the maximum spatial daylight autonomy value for the fabrics with a glare summary score higher than zero. An example equation for calculating the daylight autonomy summary score is illustrated in Equation 19 below.

$$\text{Daylight Score} = sDA/sDA_{LIMIT} \qquad \text{Equation 19:}$$

The daylight score for each façade may be combined (e.g., averaged or based on the lowest daylight score for each façade) to determine the daylight score for the building. For example, an equation for calculating the daylight combined score is illustrated in Equation 20 below.

$$\text{DaylightCombined} = (\Sigma(sDA/sDA_{LIMIT})_1 + \ldots + (sDA/sDA_{LIMIT})_n)/n \qquad \text{Equation 20:}$$

In Equation 20, the average of the daylight summary scores is computed, such that n equals the total number of daylight summary scores, which is equal to the number of facades.

The view scores for each fabric may be determined based on the glare score for the fabric. The view score may indicate an occupant's predicted amount of view out of the at least one window when the window treatment is installed. The fabric selection wizard module 310 may determine the fabric that has the highest view preservation rating when combined with a glare score. For example, the fabrics with the highest view scores having a glare score of 100% may be assigned a view score of 100%. As the view preservation rating decreases for the fabrics at each glare score, the view score may also decrease. The view scores may similarly decrease as the glare scores decrease when values other than 100% for the glare score are used.

TABLE 2 illustrates an example for calculating the view score based on the glare score and the view preservation rating.

TABLE 2

| View Preservation | Glare Score | View Score |
|---|---|---|
| 80% | 66% | 100% |
| 60% | 100% | 100% |
| 45% | 66% | 75% |
| 35% | 100% | 58% |
| 30% | 33% | 50% |
| 15% | 66% | 25% |

As shown in TABLE 2, the view preservation ratings that are associated with the highest glare score (e.g., a glare score of 100%) may set the upper limit for the view score. In the example shown in TABLE 2, the shade fabric having a 60% view preservation rating may receive the upper limit for the view score (e.g., view score of 100%). In TABLE 2, the view preservation values above the view preservation value that is determined to be the upper limit may receive the highest view score (e.g., 100%), regardless of glare score. The view preservation ratings below the upper limit may receive a fraction of the highest view score, regardless of glare score. As the view preservation rating moves down, the view score may move down according to a predetermined percentage. In other examples, the view score may change by different amounts relative to the view preservation rating, or the view preservation rating and the glare score may each be considered to determine each view score. For example, the view preservation rating and the glare score may be added or averaged to determine each view score.

The fabric selection wizard module 310 may set the view scores for the other fabric combinations by normalizing the view preservation ratings as compared to the view preservation rating of the fabric combination having the view score of 100%. For example, the fabric selection wizard module 310 may set the view score of each other fabric combination equal to the view preservation rating of that combination divided by the view preservation rating of the fabric combination having the view score of 100%. The fabric selection wizard module 310 may limit the view scores to 100% or less.

The view score may be calculated based on the view rating and/or view clarity rating for each façade of the building. The view score for each façade may be combined (e.g., averaged or based on the lowest view score for each façade) to determine the view score for the building. The view preservation rating may be calculated based on an automated view. To compute the view preservation rating, the fabric selection wizard module 310 may use the percent openness of the fabric, the view score, and the view limit score. The percent openness of the fabric may be calculated based on the typical shade position and the WWR. For example, an equation for calculating the percent openness of the fabric is illustrated in Equation 21 below.

$$\% \text{ Open(Fabric)} = (\text{TypicalShadePosition(Fabric)} - \text{WindowHeight})/(\text{WWR(Fabric)} - \text{CeilingHeight}) \quad \text{Equation 21:}$$

As illustrated in Equation 21, the percent openness of a fabric may be affected by the typical shade position of the fabric as well as the WWR for the fabric. The typical shade position may be determined by averaging the shade position measured during every daylight hour in a calendar year. In Equation 21, the ceiling height may be estimated (e.g., an estimated height of 120 inches). Based on the actual height of the ceiling, the ceiling height variable may change to represent the actual height of the ceiling. Similarly, in Equation 21, the distance between the floor and the bottom of the window may be estimated (e.g., an estimated height of 30 inches). Based on the actual distance between the floor and the bottom of the window, the window height variable may change to represent the actual distance between the floor and bottom of the window.

The view score may also, or alternatively, be calculated based on a view preservation rating. The view preservation rating may be a combination of the view rating and the clarity rating. To compute the view scores, the fabric selection wizard module 310 may use the view rating, the view clarity rating, and/or the view preservation rating. For example, the fabric selection wizard module 310 may calculate the view preservation rating based on a combination of the view rating and the view clarity. The view preservation rating may indicate a total amount of a window view that may be preserved when a window treatment is used. For example, the view preservation rating may be 100% when a window treatment is fully open (e.g., same as the view rating) and may be 10% when the window treatment is fully closed (e.g., the same as the view clarity rating). The 10% rating when fully closed may indicate that the fabric allows a small amount of view to the outdoors even when closed due to the openness factor. Specifically, 10% may indicate that a typical person would see 10% as well through the fabric as without it there. The view preservation rating may be based on the combined view rating and the combined view clarity rating for a building, or the view preservation rating may be determined for each façade. The fabric selection wizard module 310 may calculate the view rating based on the percent openness of the fabric and the view clarity score for the fabric. For example, an equation for calculating the view rating of the fabric is illustrated in Equation 22 below.

$$\text{ViewRating(Fabric)} = \% \text{ Open(Fabric)} + (1 - \% \text{ Open(Fabric)}) * \text{ViewClarity(Fabric)} \quad \text{Equation 22:}$$

As illustrated in Equation 22, the view rating for the fabric may be affected based on the percent openness score and the view clarity. The view rating score may be used interchangeably with the view score, and vice versa.

The view clarity rating may indicate the amount of visibility available through a fabric. For example, an equation for calculating the view clarity rating of the fabric is illustrated in Equation 23 below.

$$V_{Cf} = 1.36 * (OF)^{0.51} + 0.68 * (OF/T_{V\text{-}FABRIC})^{1.19} - 0.18 \quad \text{Equation 23:}$$

The view limit rating may be calculated based on the view rating and the glare summary scores for the fabrics. For example, an equation for calculating the view limit rating is illustrated in Equation 24 below.

$$\text{ViewLimitRating} = \text{MAX}(\text{View Score The Fabrics with Direct Glare Score} > 0) \quad \text{Equation 24:}$$

The view limit rating value may indicate the maximum spatial daylight autonomy value for the fabrics with a glare summary score higher than zero. The view limit rating value may be the highest value that can be obtained without resulting in a high perceived glare. As shown in Equation 25, the view limit rating may change based on the fabrics selected, as well as the direct glare score for the fabrics. Using Equations 21-24, the fabric selection wizard module 310 may calculate the view score. For example, an equation for calculating the view score is illustrated in Equation 25 below.

$$\text{View Score} = \text{ViewRating(Fabric)}/\text{ViewLimitRating} \quad \text{Equation 25:}$$

The view score for each façade may be combined (e.g., averaged or based on the lowest view score for each façade) to determine the view score for the building. For example, an equation for calculating the view combined score is illustrated in Equation 26 below.

$$\text{ViewCombined} = (\Sigma(\text{ViewPreservSum(Fabric)})_1 + \ldots + (\text{ViewPreservSum(Fabric)})_n)/n \quad \text{Equation 26:}$$

In Equation 26, the average of the view scores is computed, such that n equals the total number of view preservation summary scores, which is equal to the number of facades.

The fabric selection wizard module 310 may assign each of the fabric combinations of the combination matrix an overall rating based on the glare score and/or the daylight score of the respective fabric combination. The overall rating may comprise, for example, a star rating between five and zero stars, with five stars being the best rating. For example, the fabric selection wizard module 310 may assign the overall ratings to a fabric combination as follows:

5.0 Stars if Glare Score=100% & Daylight Score≥90%;
4.5 Stars if Glare Score=100% & Daylight Score≥80%;
4.0 Stars if Glare Score=100% & Daylight Score≥70%;

3.5 Stars if Glare Score=100% & Daylight Score≥50%;
3.0 Stars if Glare Score=100% & Daylight Score<50%;
2.5 Stars if Glare Score=50% & Daylight Score≥90%;
2.0 Stars if Glare Score=50% & Daylight Score≥80%;
1.5 Stars if Glare Score=50% & Daylight Score≥70%;
1.0 Stars if Glare Score=50% & Daylight Score≥50%;
0.5 Stars if Glare Score=50% & Daylight Score<50%; and
0 Stars if Glare Score=0%.

In another example, the fabric selection wizard module 310 may assign the overall ratings to a fabric combination using a glare score and/or a daylight-view score of each fabric combination. The daylight-view score may indicate the daylight score, the view score, or a combination thereof. The daylight-view score may be based on the space type. For example, when the space type is a functional area, the daylight-view score may be an average of the daylight score and the view score. When the space type is a transition area, the daylight-view score may be equal to the daylight score. When the space type is a social area, the daylight-view score may be equal to the view score. For example, the fabric selection wizard module 310 may assign the overall ratings to a fabric combination using the daylight-view score as follows:

5.0 Stars if Glare Score=100% & Daylight-View Score≥90%;
4.5 Stars if Glare Score=100% & Daylight-View Score≥80%;
4.0 Stars if Glare Score=100% & Daylight-View Score≥70%;
3.5 Stars if Glare Score=100% & Daylight-View Score<70%;
3.0 Stars if Glare Score>66% & Daylight-View Score≥90%;
2.5 Stars if Glare Score>66% & Daylight-View Score≥80%;
2.0 Stars if Glare Score>66% & Daylight-View Score≥70%;
1.5 Stars if Glare Score>66% & Daylight-View Score<70%;
1.0 Stars if Glare Score>33% & Daylight-View Score≥90%;
0.5 Stars if Glare Score>33% & Daylight-View Score<90%; and
otherwise, 0 Stars.

In another example, the fabric selection wizard module 310 may assign the overall ratings to a fabric combination using a glare score and/or a daylight/view score of each fabric combination. The daylight/view score may be based on the space type. For example, when the space type is a functional area, the daylight/view score may be an average of the daylight score and the view score. When the space type is a transition area, the daylight/view score may be equal to two-thirds of the daylight score added to one-third of the view score. When the space type is a social area, the daylight/view score may be equal to one-third of the daylight score added to two-thirds of the view score. For example, the fabric selection wizard module 310 may assign the overall ratings to a fabric combination using the daylight/view score as follows:

5.0 Stars if Glare Score=75% & Daylight/View Score=MAX(Best);
4.5 Stars if Glare Score=75% & Daylight/View Score≥90%*MAX(Best);
4.0 Stars if Glare Score=75% & Daylight/View Score≥80%*MAX(Best);
3.5 Stars if Glare Score=75% & Daylight/View Score<70%*MAX(Best);
3.0 Stars if Glare Score>75% & Daylight/View Score≥70%*MAX(Best);
2.5 Stars if Glare Score>50% & Daylight/View Score≥MAX(Good);
2.0 Stars if Glare Score>50% & Daylight/View Score≥90%*MAX(Good);
1.5 Stars if Glare Score>50% & Daylight/View Score<70%*MAX(Good);
1.0 Stars if Glare Score>50% & Daylight/View Score≥70%*MAX(Good);
0.5 Stars if Glare Score>25% & Daylight/View Score Not Applicable
0 Stars if Glare Score<25% & Daylight/View Score Not Applicable Five to three stars may indicate that the fabric is in the Best range, while 2.5-1 star may indicate a fabric is in the Good range. The daylight and view score may be a function of the maximum daylight and view score in the associated range (e.g., Best, Good). While scores of 1-100 percent and stars from 0-5 are used herein, other similar scoring systems may be used.

Referring again to FIG. 6, at 618, the fabric selection wizard module 310 may rank the fabric combinations based upon the overall ratings. If there are multiple fabric combinations having the same overall rating, the fabric selection wizard module 310 may rank higher the fabric combinations having the higher spatial daylight autonomy ratings. Additionally, or alternatively, the fabric selection wizard module 310 may compute a view score based on the view rating for each entry in the combination matrix. The fabric selection wizard module 310 may rank the combinations based upon one or more of the glare score, the daylight score, and/or the view score at step 618. For example, the fabric selection wizard module 310 may rank the fabrics according to glare score and then either of the view score and/or the daylight score next. The fabrics with a higher glare score may have a higher rank and then the view score and/or the daylight score may be used to distinguish between fabrics having the same glare score. The fabric section wizard module 310 may rank the combinations based upon the extent to which one or more of the glare score, the daylight score and/or the view score satisfy predefined window treatment recommendation criteria. The predefined window treatment recommendation criteria may be criteria that affect the amount of energy and/or comfort for an occupant in a load control environment. The predefined window-treatment recommendation criteria may be criteria for window treatments against which the performance of a window treatment may be compared. For example, the predefined window-treatment recommendation criteria may be threshold levels for the predefined predicted performance metrics and/or summary scores. The predefined window treatment recommendation criteria may be system and/or user defined. For example, the system and/or the user may select a threshold value for one or more predefined window-treatment recommendation criteria.

If the user has not pre-selected a fabric at step 620 (e.g., using the pre-selected fabric input section 510 of the fabric selection input screen 500 shown in FIGS. 5A-5E), the fabric selection wizard module 310 may display one or more of the recommended (e.g., highest ranked) fabric combinations at step 622. Also, or alternatively, the fabric section wizard module may display the extent to which one or more of the recommended fabric combinations satisfy the predefined window treatment recommendation criteria.

If the user has pre-selected a fabric at step 620 (e.g., using the pre-selected fabric input section 510 of the fabric selection input screen 500 shown in FIGS. 5A-5E), the fabric selection wizard software 310 may display another fabric selection output screen (not shown) at step 624. The alternate fabric selection output screen may show the performance metrics of the pre-selected fabric alongside the performance metrics of at least one of the recommended fabric combinations. A user of the fabric selection wizard module 310 may compare the performance of the pre-selected fabric with at least one of the recommended fabrics.

With regard to the recommended fabric, the fabric characteristics may vary. The variation in fabric characteristics may affect the environment in which the window treatment may be installed. The openness factor and/or the visible light transmittance of a fabric $T_{V\text{-}FABRIC}$ may affect the daylight glare probability value. For example, a fabric with a 5% openness factor and a 13% visible light transmittance of a fabric $T_{V\text{-}FABRIC}$ may have a 20% daylight glare probability value. As the openness factor and/or the visible light transmittance of a fabric $T_{V\text{-}FABRIC}$ increase or decrease, the daylight glare probability value may also increase or decrease, respectively. An occupant of a room may begin to observe daylight glare at about a 35% glare level. The daylight glare may begin to be uncomfortable to the occupant at about a 45% glare level. As a result, a fabric may be manufactured that causes a daylight glare probability value of less than 35%, such as a 33% daylight glare probability value for example. The openness factor and/or the visible light transmittance of a fabric $T_{V\text{-}FABRIC}$ may affect the daylight glare probability value. A fabric may be used that prevents the daylight glare probability from reaching the 35% daylight glare probability value, or at least a 45% daylight glare probability value, to avoid making the occupant uncomfortable.

Though fabrics may be recommended that may have less than a 35% or a 45% daylight glare probability value, the openness factor of the fabric may vary. The variation of the openness factor of the fabric may cause the visible light transmittance of a fabric $T_{V\text{-}FABRIC}$ and the daylight glare probability value to also vary. For example, a 1% change in the openness factor of the fabric may cause up to about a 10% change in the daylight glare probability value. To prevent the daylight glare probability value from raising above a level of 35% or 45%, the recommended fabrics may be manufactured within a tolerance for openness and/or the recommended fabrics may have a lower maximum daylight glare probability value to offset the variance in openness. For example, the fabric's tolerance for openness may be less than 1% for fabrics that are recommended with less than a 35% daylight glare probability value to prevent the daylight glare probability value from raising to 45% due to variance in openness. The fabric's tolerance for openness may be 0.5% or less to prevent the daylight glare probability value from coming within 5% of the 45% daylight glare probability value. The openness tolerance may be more critical for fabrics with a lower openness. As a result, the openness tolerance may be selected based on the change in daylight glare probability value for fabrics with a lower openness (e.g., 1%-5%).

Fabric recommendations may limit the openness factor and/or the visible light transmittance $T_{V\text{-}FABRIC}$ to prevent a daylight glare probability value from reaching a predefined comfort limit or maximum daylight glare probability value (e.g., a 35% maximum daylight glare probability value). For example, a set of input parameters may lead to a recommended fabric with a rated openness of 3% and a visible light transmittance $T_{V\text{-}FABRIC}$ of 6%. To prevent the occupant from perceiving glare, the fabric tolerance may be set to +/−0.5%. An example of tolerances and the maximum daylight glare probability values that may result from those tolerances is provided below in TABLE 3.

TABLE 3

| Tolerance | Max DGP |
| --- | --- |
| Rated Fabric | 32.6% |
| +0.5% openness | 37.4% |
| +1% openness | 42.2% |
| +1.5% openness | 47.1% |
| +2.0% openness | 51.9% |

Recommended fabric may be restricted in openness factor and/or visible light transmittance $T_{V\text{-}FABRIC}$, for example, to prevent the daylight glare probability value from raising above a level of 35% or 45%. For example, the openness on a recommended fabric may be restricted to between 1% and 10%, the openness tolerance may be restricted to 0.5% or less, and the visible light transmittance $T_{V\text{-}FABRIC}$ may be restricted to between 1% and 30%, which may result in a daylight glare probability value of approximately 15% to approximately 35%. If the correct limits are selected for the openness factor, the $T_{V\text{-}FABRIC}$, and/or the tolerance, the resulting daylight glare probability value will be 15% to 35%. The resulting daylight glare probability value will depend on the level of restriction of the openness factor, the $T_{V\text{-}FABRIC}$, and/or the tolerance. The maximum daylight glare probability value for a recommended fabric may also, or alternatively, be less than 35% to prevent the openness variance from reaching a noticeable or uncomfortable level for the occupant. For example, the maximum daylight glare probability value for a recommended fabric may be about 33%.

Figure 7A:
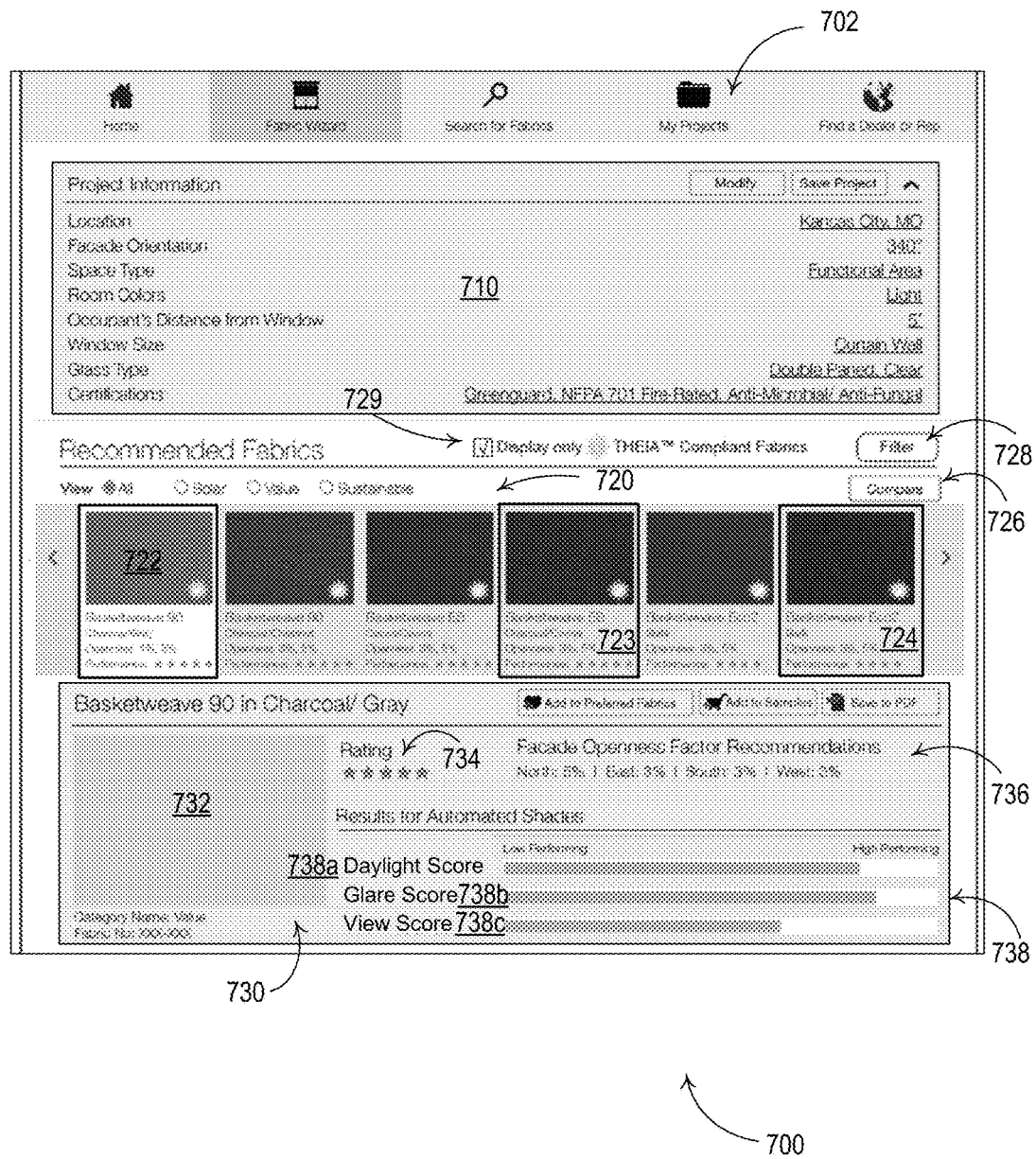
FIGS. 7A-7G show example displays of the fabric selection output screen of a fabric selection wizard module.
Figure 7B:
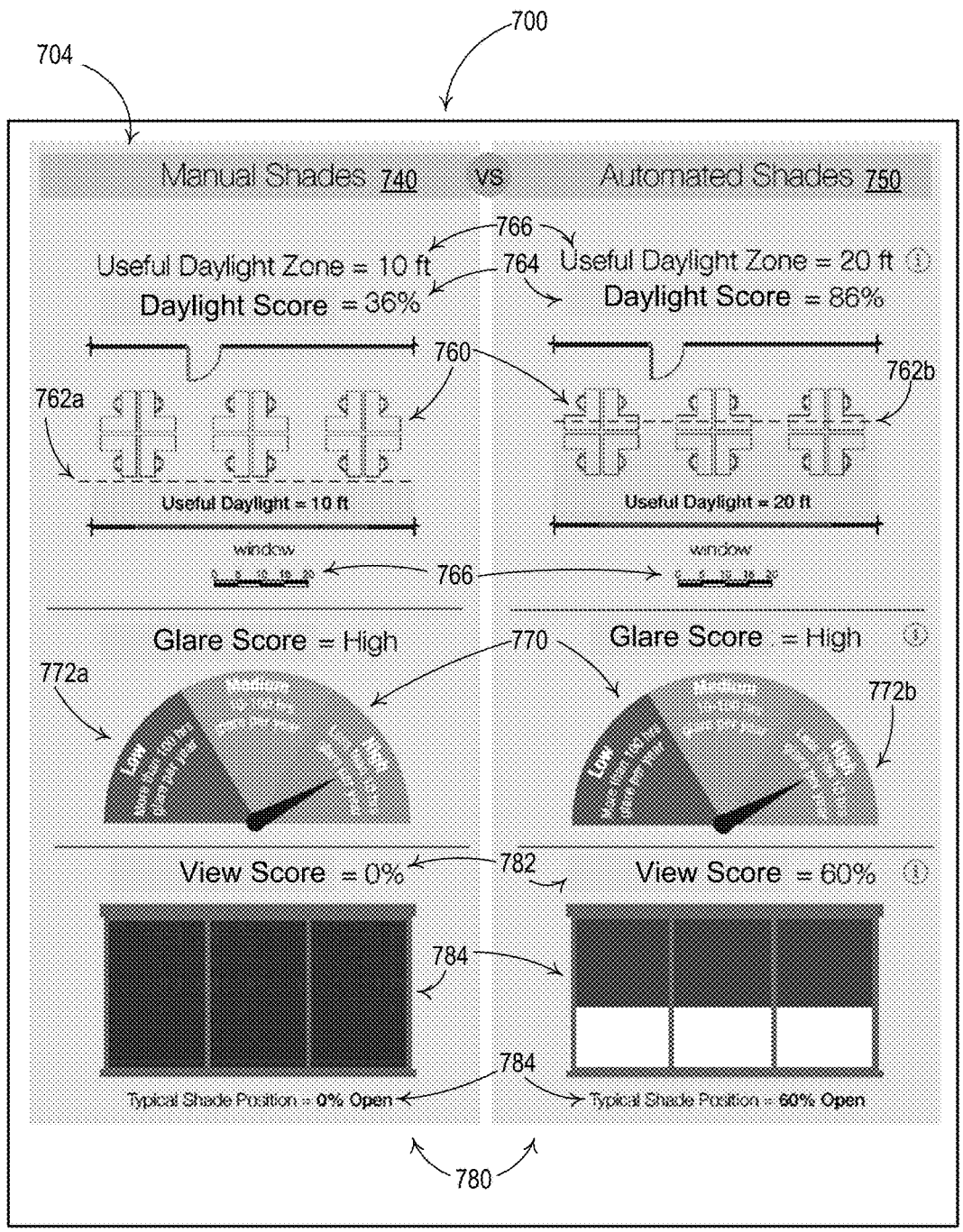

FIGS. 7A-7G show example displays of a fabric selection output screen 700 that may display recommended fabrics and/or fabric combinations. For example, the fabric selection wizard module 310 may display a fabric selection output screen 700, or portions thereof, through a web browser or other application for displaying the recommended fabric combinations. As shown in FIGS. 7A and 7B, the fabric selection output screen 700 may comprise a project information section 710, a recommended fabrics list section 720, a selected recommended fabric information section 730, a manual shades comparison section 740, and/or a motorized shades comparison section 750. The fabric selection output screen 700 may comprise one or more portions, such as an upper portion 702 (shown in FIG. 7A) and/or a lower portion 704 (shown in FIG. 7B-7G).

The project information section 710 of the fabric selection output screen 700 may list information regarding the project for the building in which the window treatments may be installed, e.g., the basic input data 312 received by the fabric selection input screen 500 shown in FIGS. 5A-5I. The recommended fabrics list section 720 may list the recommended fabrics and/or fabric combinations. For example, the recommended fabrics in the recommended fabrics list section 720 may include the highest ranking fabric combinations. The recommended fabrics in the recommended fabric list 720 may be computed based on measure scores providing the highest ranking objective fabric combinations or based on subjective variables. The subjective variable may be user input based on desired levels for glare, daylight, view, solar control, etc. The subjective variables may be based on user priorities, such as a user preferring glare to be weighted more heavily than view. The recommendations may be filtered, such as by value, sustainability, rank, solar energy allowed, etc. The selected recommended fabric information section 730 may provide information regarding a selected recommended fabric combination 722 of the recommended fabrics list section 720. A user may scroll through a plurality of selected recommended fabric combinations (e.g., selected recommended fabric combination 722) in the selected recommended fabric list section 720. The user may scroll through the plurality of selected recommended fabric combinations in any direction, such as left to right, up and down, etc. The selected recommended fabric combination 722 may list an image or representation of the fabric, the fabric type, the rating of the fabric (e.g., zero to five stars), the openness ratings or percentages, and/or other information. The representation of the fabric may indicate the shade of the fabric and/or the texture of the fabric.

The selected recommended fabric information section 730 may include an image 732 or other representation of the selected recommended fabric combination 722, such that the user may make decisions on which fabric to purchase based on the aesthetic appearance of the fabric. The selected recommended fabric information section 730 may include a ranking 734 of the selected recommended fabric combination 722, an openness factor 736 for the selected recommended fabric combination 722, and/or performance scores 738 for the selected recommended fabric combination 722. As indicated in FIG. 7A, the openness factor 736 may be provided for one or more façade orientations. The performance scores 738 may include the fabric performance output 320 on which the fabric ranking 734 may be based. FIG. 7A shows the daylight score of the selected recommended fabric combination 722, the glare score (e.g., visual comfort) of the selected recommended fabric combination 722, and the view score of the selected recommended fabric combination 722, but other types of fabric performance output 320 may be provided. For example, the direct glare score may be shown as a fabric performance output 320.

Referring to FIG. 7B, the manual shades comparison section 740 and the motorized shades comparison section 750 may each list the performance metrics from the fabric performance output 320 that are based the manual control and automated control, respectively, for the selected recommended fabric combination 722 of the recommended fabrics list section 720. A user of the fabric selection wizard module 310 may be able to compare the performance of the selected recommended fabric combination 722 using manual and automated control. The user may be able to understand the savings and advantages of automated control over manual control. The manual shades comparison section 740 and the motorized shades comparison section 750 may each list the performance scores for the selected fabric 722 under manual and automated control, which may include a daylight score section 760, a glare score section 770, and/or a view score section 780.

The daylight score section 760 may display the useful daylight zone 766 and a daylight score 764. The useful daylight zone may identify a distance into a room from the window that includes an amount of useful daylight. The useful daylight zone may be calculated using the spatial daylight autonomy value and the depth of the room (e.g., 40 feet). An example equation for calculating the useful daylight zone may be illustrated in Equation 27 below.

$$\text{Useful Daylight Zone} = sDA * (\text{RoomDepth}) \quad \text{Equation 27:}$$

The daylight score section 760 may display a representation of a room depicting the useful daylight in the room associated with the selected recommended fabric for manual shades and automated shades. For example, in FIG. 7B, the manual shades 740 show useful daylight zone of 10 feet, with a useful daylight zone marker 762a depicting the position in the room to which the useful daylight will extend. In FIG. 7B, the automated shades 750 show useful daylight zone of 20 feet, with a useful daylight zone marker 762b depicting the position in the room to which the useful daylight will extend. The space between the markers 762a, 762b and the window may be shaded and the shading may become lighter the further the distance from the window. The daylight score section 760 may include a map scale 766 that may be used to indicate and measure the relative distance of the useful daylight zone markers 762a, 762b.

Figure 7C:
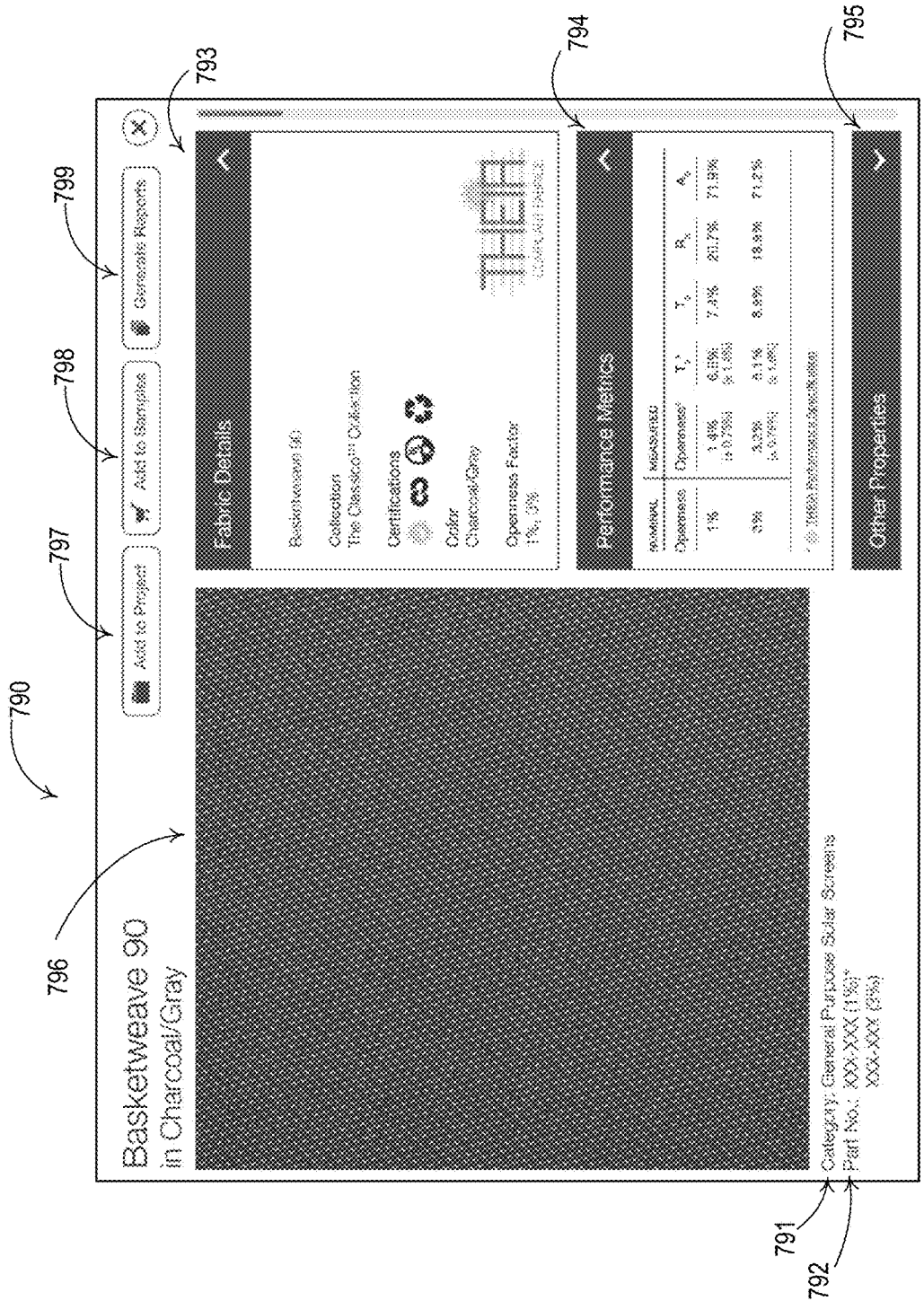
Figure 7D:
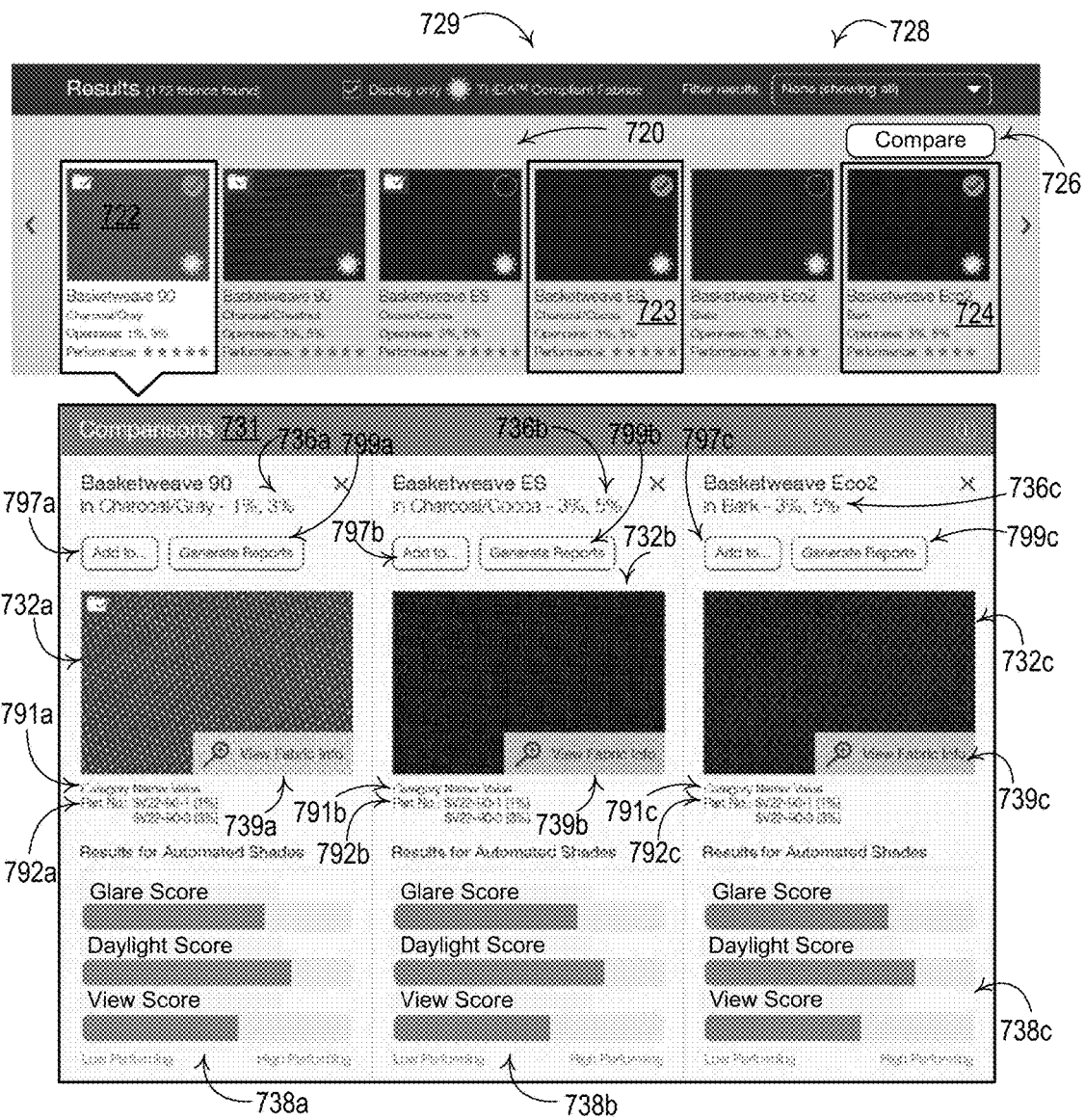
Figure 7E:
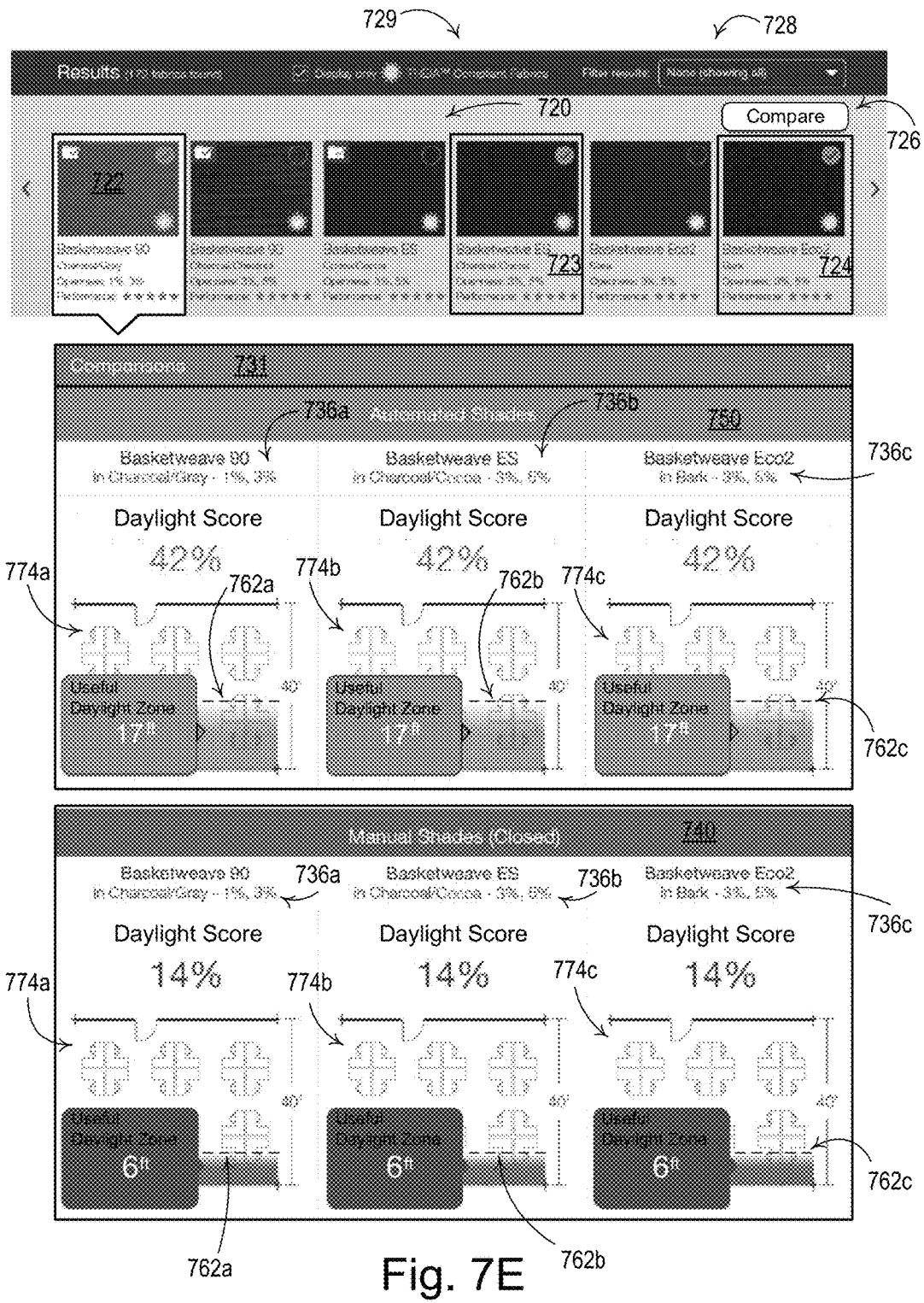
Figure 7F:
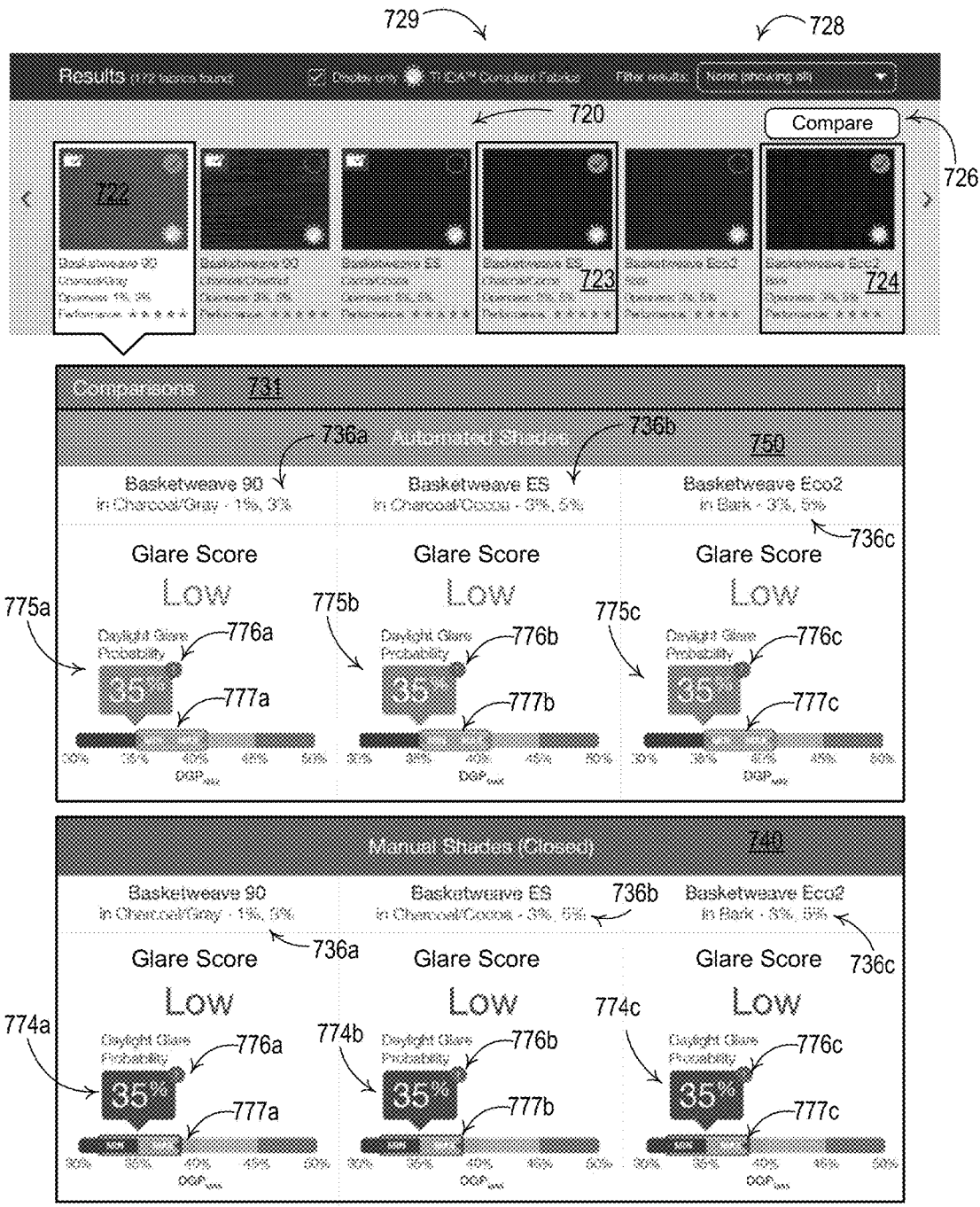

The glare score section 770 may include a representation of the glare score level for the manual shades 740 and automated shades 750. The glare score section 770 may be based on the glare score. As shown in FIG. 7B, the glare score level representation may include a meter 772a that indicates the level of visual comfort for the manual shades comparison section 740 and a meter 772b that indicates the level of visual comfort for the motorized shades comparison section 750. The meter 772a, 772b includes equal sections indicating low, medium, and high levels of glare score, with a pointer aimed at the glare score level associated with the selected recommended fabric for manual shades and automated shades. Low glare score may be indicated when the glare score is a relatively low, such as a glare score that is based on a daylight glare probability value of more than one hundred hours of glare per year. Medium glare score may be indicated when the glare score is between the low and high thresholds, such as a glare score that is based on a daylight glare probability value between ten and one hundred hours of glare per year. High glare score may be indicated when the glare score is relatively high, such as when the glare score is less than ten hours of glare per year. Though the glare score representation is identified as a meter, the glare score representation may be depicted in another form, such as a glare score bar or graph. The glare score section 770 may also, or alternatively, depict the daylight glare probability (e.g., as shown in FIG. 7F) and/or glare score. The glare score and/or visual comfort section 770 may also provide an option to expand an information box that may explain the consequences or potential results of the daylight glare probability value, and/or glare score.

The view score section 780 may include a view score 782, a visual representation 784 of the shade level, and/or the typical shade position 786. The visual representation 784 of the shade level may show the typical shade position 786, from which the view score 782 may be based. The view score section 780 may include a view clarity through the fabric (not shown) and/or other information for both the manual shades 740 and automated shades 750.

Referring back to FIG. 7A, a user may actuate a filter button 728. The filters button may include a drop down list or menu including various filters to apply to the recommended fabric combinations displayed in the recommended fabrics list 720. For example, the filters may include, but are not limited to, color, saved fabrics, thermal reflectance, solar reflectance and/or certifications, such as PVC Free, GREENGUARD Certified, Recyclable, Recyclable Content, and/or Cradle to Cradle Certified. The filter may be used to filter out or include reflective shades that have a solar reflectance above a predefined threshold, for example.

The user may actuate the button 729, or a similar function, to display THEIA™ Compliant fabrics. As shown in FIG. 7A, the button 729 is actuated and THEIA™ Compliant Fabrics are displayed in the recommended fabrics list section 720. Similar functions may be included in the fabric selection output screen 700 for other fabric filters.

The user may enlarge a recommended fabric combination and/or show additional information regarding the fabric combination displayed in the recommended fabrics list 720. For example, FIG. 7C shows the enlarged recommended fabric combination section 790 for the recommended fabric combination 722. The enlarged recommended fabric combination section 790 may include the category 791, the part number 792, the fabric details 793, the performance metrics 794, other properties of the fabric 795, a visual representation of the fabric 796, and/or other information. The fabric details 793 may include the family name for the fabric, the collection name, the certifications, the color, the openness factor, whether the fabric is THEIA™ compliant, and/or other information. The performance metrics may include nominal and measured performance metrics. Nominal metrics, for example, are the numbers provided directly from a fabric manufacturer with little validation of their measurement process, and may be considered "approximate". Measured performance metrics include validation of measurement procedures and may include tolerance values for performance metrics. For example, the performance metrics may list the nominal and measured openness, the measured visible light transmittance ($T_{V\text{-}FABRIC}$), a solar absorptance ($A_S$), a solar transmittance ($T_S$), a solar reflectance ($R_S$), solar heat gain coefficient SHGC (not shown), and/or combined solar heat gain coefficient ($SHGC_{FABRIC\text{-}GLASS}$) (not shown). The performance metrics may also list a maximum and a minimum for the nominal and measured openness, the measured visible light transmittance ($T_{V\text{-}FABRIC}$), the solar absorptance ($A_S$), the solar transmittance ($T_S$), the solar reflectance ($R_S$), the solar heat gain coefficient (SHGC), and/or the combined solar heat gain coefficient ($SHGC_{FABRIC\text{-}GLASS}$). The enlarged recommended fabric combination section 790 may also include an add to project button 797, an add to samples button 798, and a generate report button 799. The user may actuate the add to project button 797 to add the enlarged recommended fabric combination to a project. If a user is working on more than one project, the user may be able to select a project to which the enlarged recommended fabric combination will be added. The user may actuate the add to samples button 798 to add the enlarged recommended fabric combination to a request for a sample. The user may actuate the generate report button 799 to initiate the generation of a report regarding the enlarged recommended fabric combination, or to request a report regarding the enlarged recommended fabric combination.

Figure 7G:
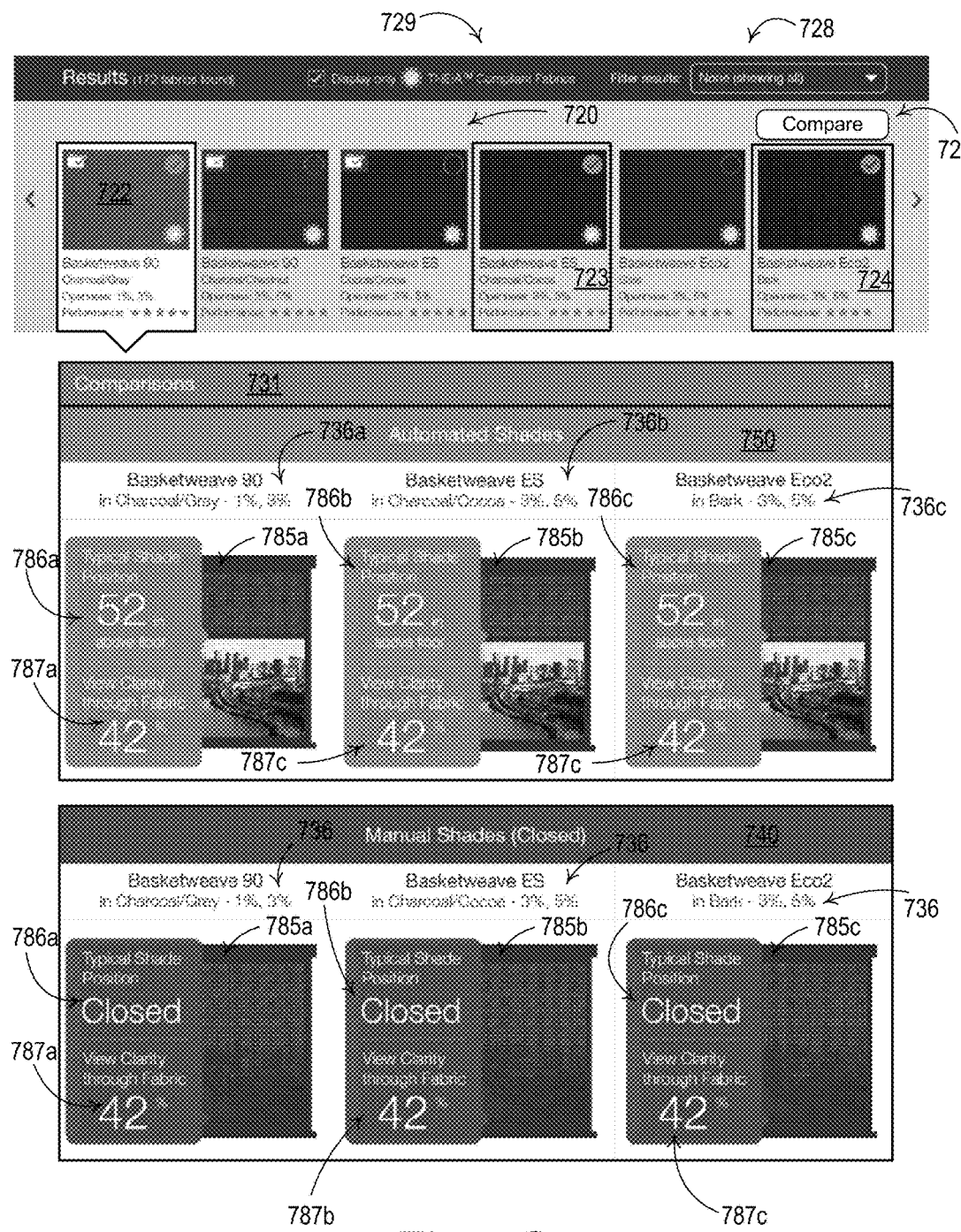

Referring again to FIG. 7A, a user may select one or more fabrics from the recommended fabrics list section 720. For example, the user may select recommended fabric combination 722, recommended fabric combination 723, and recommended fabric combination 724. The user may actuate the compare button 726. The fabric selection wizard module 310 may display a comparison of the selected recommended fabric information 731 for the selected recommended fabric combinations 722, 723, and 724, as shown in FIGS. 7D-7G. The comparison of the selected recommended fabric information 731 may compare the fabric information 730 (e.g., as shown in FIG. 7D), the manual control and automated control daylight score 760 (e.g., as shown in FIG. 7E), the manual control and automated control glare score or visual comfort 770 (e.g., as shown in FIG. 7F), and/or the manual control and automated control view score 780 (e.g., as shown in FIG. 7G) for the selected recommended fabric combinations 722, 723, and 724.

As shown in FIG. 7D, the comparison of the selected recommended fabric information 731 may include a representation 732a, 732b, and 732c (e.g., an image) of the selected recommended fabric combinations 722, 723 and 724, respectively, such that the user may compare the selected recommended fabric combinations 722, 723 and 724 to make decisions on which fabric to purchase based on the aesthetic appearance of the fabric. The comparison of the selected recommended fabric information 731 may include an openness factor 736a, 736b, and 736c for the respective selected recommended fabric combinations 722, 723, and 724. The comparison of the selected recommended fabric information 731 may include performance or summary scores 738a, 738b, and 738c for the respective selected recommended fabric combinations 722, 723, and 724. As indicated in FIG. 7A, the openness factor 736 may be provided for one or more façade orientations. The performance or summary scores 738a, 738b, and 738c may include the daylight score of the respective selected recommended fabric combinations 722, 723, and 724, the glare score of the respective selected recommended fabric combinations 722, 723, and 724, and/or the view score of the respective selected recommended fabric combinations 722, 723, and 724.

The comparison of the selected recommended fabric information 731, may include the categories 791a, 791b, 791c and part numbers 792a, 792b, 792c for the respective selected recommended fabric combinations 722, 723, 724. The comparison of the selected recommended fabric information 731 may provide the user the option to add one or more of the selected recommended fabric combinations 722, 723, or 724 to a project or to a sample request by actuation of the respective request buttons 797a, 797b, or 797c. The comparison of the selected recommended fabric information 731 may provide the user the option to generate a report one or more of the selected recommended fabric combinations 722, 723, or 724 upon actuation of the respective report generating buttons 799a, 799b, or 799c. The comparison of the selected recommended fabric information 731 may allow the user to view the fabric information for one or more of the selected recommended fabric combinations 722, 723, or 724 by actuating a respective view fabric info button 739a, 739b, or 739c. If a user actuates the view fabric info button 739a, 739b, or 739c, the user may be taken to an enlarged recommended fabric combination section 790 for the corresponding fabric, for example, as shown in FIG. 7C.

FIG. 7E depicts another example for illustrating information in the manual shades comparison section 740 and the motorized shades comparison section 750. As shown in FIG. 7E, the comparison of the selected recommended fabric information 731 may display the useful daylight zone and a percent daylight score for each of the selected recommended fabric combinations 722, 723, 724. The daylight score section 760 may display a representation of a room depicting the useful daylight in the room 774a, 774b, or 774c associated with the selected recommended fabric 722, 723, or 724 respectively for manual shades and automated shades. For example, in FIG. 7E, the manual shades 740 show useful daylight zone of 6 feet for each of the selected recommended fabric combinations 722, 723, 724, with a useful daylight zone marker 762a, 762b, 762c depicting the position in the room to which the useful daylight will extend for each of the selected recommended fabric combinations 722, 723, 724, respectively. In FIG. 7E, the automated shades 750 show useful daylight zone of 17 feet for each of the selected recommended fabric combinations 722, 723, 724, with a useful daylight zone marker 762a, 762b, 762c depicting the position in the room to which the useful daylight will extend for each of the selected recommended fabric combinations 722, 723, 724, respectively.

FIG. 7F depicts another example for illustrating information in the manual shades comparison section 740 and the motorized shades comparison section 750. As shown in FIG. 7F, the comparison of the selected recommended fabric information 731 may include a representation of the glare score, daylight score, and/or view score for both the manual shades 740 and automated shades 750. For example, as shown in FIG. 7F, the daylight glare probability 775a, 775b, or 775c for the selected recommended fabric combinations 722, 723, 724, respectively, may be depicted using a bar indicating the numbered percentage of the daylight glare probability for both the automated control shades 750 and manually controlled shades 740. In FIG. 7F, the bar depicts a range from 30% to 50%, though any range or percentage may be indicated. A value from 0-35% is considered low glare, a value from 35%-40% is considered medium glare, a value from 40%-45% is considered high glare, and a value from 45%-100% is considered critical glare. The bar may include a tolerance indicator 777a, 777b, 777c that indicates a daylight glare probability range. The bar may represent a glare tolerance range. The tolerance range calculates the daylight glare probability for a fabric using the worst case values for the daylight glare intensity and the best case values for the daylight glare intensity. In the glare score and/or visual comfort section 770 of the comparison of the selected recommended fabric information 731, an information box button 776a, 776b, or 776c may be associated with a glare scores for the selected recommended fabric combinations 722, 723, 724, respectively. If the user actuates the information box button 776a, 776b, or 776c, an information box (not shown) explaining the consequences or potential results of the daylight glare probability, and/or glare score may be displayed. For example, the information box may be a warning that the glare score is using direct glare score. The warning may not be present, for example, if a building is blocking sunlight from the façade. In the manual control and automated control glare score or visual comfort section 770, the comparison of the selected recommended fabric information 731, may also, or alternatively, include a visual comfort level representation (e.g., as shown in FIG. 7B) for each of the selected recommended fabric combinations 722, 723, 724. In the manual control and automated control glare score and/or visual comfort section 770, the comparison of the selected recommended fabric information 731, may also, or alternatively, include an openness factor 736a, 736b, 736c for the selected recommended fabric combinations 722, 723, 724, respectively.

FIG. 7G depicts another example for illustrating information in the manual shades comparison section 740 and the motorized shades comparison section 750. As shown in FIG. 7G, the comparison of the selected recommended fabric information 731 may include a view score (not shown), a representation of the visual preservation 785a, 785b, and 785c for each of the selected recommended fabric combinations 722, 723, 724, respectively, the typical shade position 786a, 786b, or 786c for each of the selected recommended fabric combinations 722, 723, 724 respectively, view clarity through the fabric 787a, 787b, and 787c for each of the selected recommended fabric combinations 722, 723, 724 respectively, and/or other information for both the manual shades 740 and automated shades 750 for each of the selected recommended fabric combinations 722, 723, 724.

The typical shade position may be determined by averaging the shade position measured during every daylight hour in a calendar year.

Figure 8:
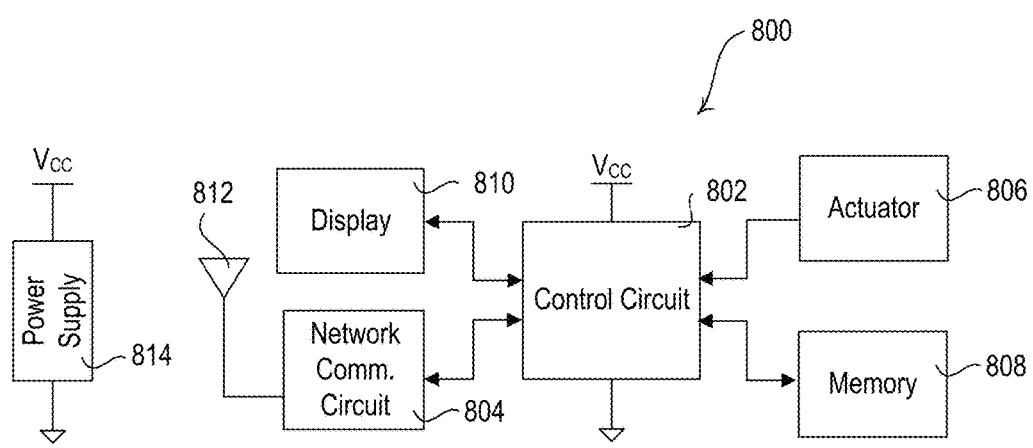
FIG. 8 is a simplified block diagram of an example network device.

FIG. 8 is a block diagram illustrating an example network device 800. The network device 800 may be a server, a personal computer, a laptop, a tablet, a smart phone, and/or other suitable network communication device (e.g., an Internet-Protocol-enabled device), for example. The network device 800 may be used to store and/or execute one or more portions of the fabric selection tool 300 shown in FIG. 3. For example, the network device 800 may perform the functions of the fabric selection wizard module 310, perform the functions of the fabric performance engine 316, store the basic input data 312, store computed fabric performance input data 314, store the fabric performance output 320, store the fabric data 318, store recommendation scores, and/or store fabric recommendations. The network device 800 may comprise a control circuit 802, which may include one or more of a processor (e.g., a microprocessor), a microcontroller, a programmable logic device (PLD), a field programmable gate array (FPGA), an application specific integrated circuit (ASIC), or any suitable processing device. The control circuit 802 may perform signal coding, data processing, power control, image processing, input/output processing, and/or any other functionality that enables the network device 800 to perform as described herein.

The control circuit 802 may store information in and/or retrieve information from the memory 808. The memory 808 may include a non-removable memory and/or a removable memory for storing computer-readable media. The non-removable memory may include random-access memory (RAM), read-only memory (ROM), a hard disk, and/or any other type of non-removable memory storage. The removable memory may include a subscriber identity module (SIM) card, a memory stick, a memory card (e.g., a digital camera memory card), and/or any other type of removable memory. The control circuit 802 may access the memory 808 for executable instructions and/or other information that may be used by the network device 800. The control circuit 802 may store the unique identifiers (e.g., serial numbers) of the control devices to which the network device 800 is associated in the memory 808. The control circuit 802 may access instructions in the memory 808 for executing the fabric selector tool, or portions thereof. The control circuit 802 may store the basic input data 312, the computed fabric performance input data 314, the fabric performance output 320, the fabric data 318, the recommendation scores, the fabric recommendations, and/or other information that may be used by the fabric selector tool in the memory 808.

The network device 800 may comprise a network communication circuit 804, which may be adapted to performed wired and/or wireless communications (e.g., with the system controller device 110 or another device over a network) on behalf of the network device 800. The network communication circuit 804 may be a wireless communication circuit, for example, including an RF transceiver coupled to an antenna 812 for transmitting and/or receiving RF signals (e.g., the RF signals 106 shown in FIG. 1). The network communication circuit 804 may communicate using Wi-Fi, a proprietary protocol (e.g., the ClearConnect® protocol), Bluetooth®, or any other RF communications. The control circuit 802 may be coupled to the network communication circuit 804 for transmitting and/or receiving digital messages via the RF signals 106, for example.

The network device may comprise an actuator 806. The control circuit 802 may be responsive to the actuator 806 for receiving a user input. For example, the control circuit 802 may be operable to receive a button press from a user on the network device 800 for making a selection or performing other functionality on the network device 800.

The network device may comprise a display 810. The control circuit 802 may be in communication with a display 810 for displaying information to a user. The communication between the display 810 and the control circuit 802 may be a two way communication, as the display 810 may include a touch screen module capable of receiving information from a user and providing such information to the control circuit 802.

The network device 800 may comprise a power supply 814 for generating a DC supply voltage $V_{CC}$ for powering the control circuit 802, the network communication circuit 804, the memory 808, the display 810, and/or other circuitry of the network device 800. The power supply 814 may be a battery or another source of power for the network device 800.

One or more of the components illustrated in the network device 800 may be similarly included in another remote computing device, such as a network server for example. The functionality of the fabric selection tool 300 may be included in the network device 800 and/or may be distributed between the network device 800 and one or more remote computing devices. For example, the fabric performance engine 316 may be executed on a remote computing device, while the fabric selection wizard module 310 may be executed by the network device 800.

Figure 9:
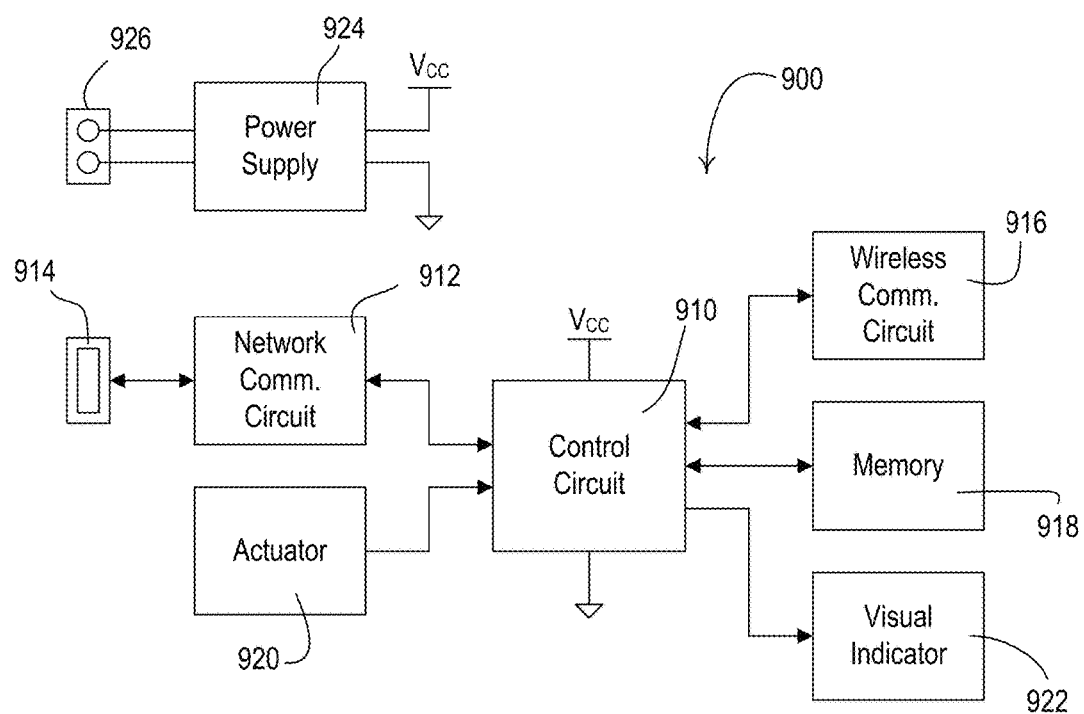
FIG. 9 is a simplified block diagram of an example wireless control device.

FIG. 9 is a simplified block diagram of an example wireless control device 900, which may be deployed as, for example, the system controller 110 of the load control system 100 shown in FIG. 1. The wireless control device 900 may comprise a control circuit 910, which may include one or more of a processor (e.g., a microprocessor), a microcontroller, a programmable logic device (PLD), a field programmable gate array (FPGA), an application specific integrated circuit (ASIC), or any suitable processing device. The control circuit 910 may perform signal coding, data processing, power control, input/output processing, and/or any other functionality that enables the wireless control device 900 to perform as described herein. The wireless control device 900 may comprise a network communication circuit 912 that may be coupled to a network connector 914 (e.g., an Ethernet jack), which may be adapted to be connected to a wired digital communication link (e.g., an Ethernet communication link) for allowing the control circuit 910 to communicate with network devices on a network. The network communication circuit 912 may be configured to be wirelessly connected to the network, e.g., using Wi-Fi technology to transmit and/or receive RF signals (e.g., the RF signals 106 shown in FIG. 1).

The wireless control device 900 may comprise a wireless communication circuit 916, for example, including an RF transceiver coupled to an antenna for transmitting and/or receiving RF signals (e.g., the RF signals 106 shown in FIG. 1). The wireless communication circuit 916 may communicate using a proprietary protocol (e.g., the ClearConnect® protocol). The control circuit 910 may be coupled to the wireless communication circuit 916 for transmitting digital messages via the RF signals 106, for example, to control the load control devices in the load control system 100 in response to digital messages received via the network communication circuit 912. The control circuit 910 may be configured to receive digital messages, for example, from the load control devices and/or the input devices.

The control circuit 910 may be responsive to an actuator 920 for receiving a user input. For example, the control circuit 910 may be operable to associate the wireless control device 900 with one or more control devices of the load control system 100 in response to actuations of the actuator 920 during a configuration procedure of the load control system 100. The wireless control device 900 may comprise additional actuators to which the control circuit 910 may be responsive.

The control circuit 910 may store information in and/or retrieve information from the memory 918. The memory 918 may include a non-removable memory and/or a removable memory for storing computer-readable media. The non-removable memory may include random-access memory (RAM), read-only memory (ROM), a hard disk, and/or any other type of non-removable memory storage. The removable memory may include a subscriber identity module (SIM) card, a memory stick, a memory card (e.g., a digital camera memory card), and/or any other type of removable memory. The control circuit 910 may access the memory 918 for executable instructions and/or other information that may be used by the wireless control device 900. The control circuit 910 may store the unique identifiers (e.g., serial numbers) of the control devices to which the wireless control device 900 is associated in the memory 918. The control circuit 910 may access instructions in the memory 918 for executing the fabric selector tool, or portions thereof. The control circuit 910 may store the basic input data 312, the computed fabric performance input data 314, the fabric performance output 320, the fabric data 318, the recommendation scores, the fabric recommendations, and/or other information that may be used by the fabric selector tool in the memory 918.

The control circuit 910 may illuminate a visual indicator 922 to provide feedback to a user of the load control system 100. For example, the control circuit 910 may blink or strobe the visual indicator 922 to indicate a fault condition. The control circuit 910 may be operable to illuminate the visual indicator 922 different colors to indicator different conditions or states of the wireless control device 900. The visual indicator 922 may be illuminated by, for example, one or more light-emitting diodes (LEDs). The wireless control device 900 may comprise more than one visual indicator.

The wireless control device 900 may comprise a power supply 924 for generating a DC supply voltage $V_{CC}$ for powering the control circuit 910, the network communication circuit 912, the wireless communication circuit 916, the memory 918, and/or other circuitry of the wireless control device 900. The power supply 924 may be coupled to a power supply connector 926 (e.g., a USB port) for receiving a supply voltage (e.g., a DC voltage) and/or for drawing current from an external power source.

One or more of the components illustrated in the wireless control device 900 may be similarly included in another computing device, such as the network device 800 or a network server for example. The functionality of the fabric selection tool 300 may be included in the wireless control device 900 and/or may be distributed between the wireless control device 900 and one or more remote computing devices. For example, the fabric performance engine 316 may be executed on the wireless control device 900, while the fabric selection wizard module 310 may be executed by the network device 800.

Although features and elements have been described in relation to particular embodiments, many other variations, modifications, and other uses are apparent from the description provided herein. For example, while various types of hardware and/or software may be described for performing various features, other hardware and/or software modules may be implemented. The disclosure herein may not be limited by the examples provided.

What is claimed is:

1. A method of selecting a recommended fabric for a window treatment to be installed in a building, the method comprising:
    computing, by at least one processor, an associated score for each fabric option of a plurality of fabric options, wherein the associated score for each fabric option is computed between a predefined high-level threshold and a predefined low-level threshold for the plurality of fabric options, wherein the associated score for each fabric option is based on a value of at least one predicted performance metric for the fabric option relative to values of the at least one predicted performance metric for the plurality of fabric options, wherein the value of the at least one predicted performance metric for each fabric option depends on characteristics of daylight entering an interior space of the building when the fabric option of the plurality of fabric options is used as the window treatment for at least one window of the building;
    determining, by the at least one processor, a recommended fabric option for the window treatment to be installed in the building based on values of the at least one predicted performance metric for the plurality of fabric options that correspond to environmental characteristics of an environment that is associated with at least one of the building or a location in the building in which the recommended fabric option is to be installed as the window treatment; and
    displaying a visual representation of the recommended fabric option and the computed associated score of the recommended fabric option on a visual display of a network device.

2. The method of claim 1, wherein displaying the visual representation comprises displaying multiple visual representations of multiple fabrics.

3. The method of claim 2, further comprising receiving an indication from a user to scroll the multiple visual representations of the multiple fabrics in a direction, and scrolling the multiple visual representations of the multiple fabrics in the indicated direction.

4. The method of claim 1, wherein displaying the visual representation includes displaying at least one of a family characteristic associated with the recommended fabric option or a color of the recommended fabric option.

5. The method of claim 1, further comprising determining at least one score for each fabric option of the plurality of fabric options based on the at least one predicted performance metric corresponding to the fabric option, wherein the at least one score comprises at least one of a glare score that indicates a predicted amount of glare resulting in the building from the use of the fabric option in the window treatment, a view score that indicates an occupant's predicted amount of view out of the at least one window when the fabric option is used in the window treatment, or a daylight score that indicates a predicted amount of daylight resulting in the interior space from the use of the fabric option in the window treatment.

6. The method of claim 1, further comprising:
    determining, based on at least one score for each fabric option of the plurality of fabric options, a ranking of the plurality of fabric options, wherein the ranking of the plurality of fabric options indicates an ascending or descending order of performance of the fabric options in the window treatment when installed in an automated window treatment control system in the environment that is associated with the at least one of the building or the location in the building; and
    displaying the ranking of the plurality of fabric options.

7. The method of claim 1, wherein the values of the at least one predicted performance metric are computed based on input data defining environmental characteristics of a plurality of environments of the building, at least one fabric characteristic for each fabric of a plurality of fabrics, and a predicted spatial daylight autonomy value of the at least one of the building or the location in the building in which the recommended fabric option is to be installed as the window treatment.

8. The method of claim 1, wherein the at least one predicted performance metric comprises at least one of a daylight glare probability, a spatial daylight autonomy, or a view preservation, and
    wherein the daylight glare probability indicates a maximum daylight glare intensity over a period of time, the spatial daylight autonomy indicates an amount of floor space in the building where daylight alone can provide light over a period of time, and the view preservation indicates an amount of the at least one window that can be unobstructed by the window treatment.

9. The method of claim 1, wherein the associated score is computed based on at least two predicted performance metrics.

10. A method of selecting a recommended fabric for a window treatment to be installed in a building, the method comprising:
    determining, by at least one processor, predicted performance metrics for each fabric of a plurality of fabrics when used with the window treatment to control daylight in a plurality of environments;
    selecting, by the at least one processor, the predicted performance metrics for the plurality of fabrics that correspond to environmental characteristics associated with at least one of the building or a location in the building in which the recommended fabric is to be installed;
    ranking, by the at least one processor, the plurality of fabrics based upon the selected predicted performance metrics that correspond to the environmental characteristics associated with the at least one of the building or the location in the building, wherein the plurality of fabrics are ranked according to glare scores that indicate a predicted amount of glare resulting in the building from use of respective ones of the plurality of fabrics in the window treatment, wherein a glare score for each fabric of the plurality of fabrics is computed between a predefined high-level threshold and a predefined low-level threshold for the plurality of fabrics, wherein the glare score for each fabric is based on a value of at least one predicted performance metric for the fabric relative to values of the at least one predicted performance metric for the plurality of fabrics; and
    displaying, based on the ranking of the plurality of fabrics, at least one of the plurality of fabrics as the recommended fabric for being installed in the building and a visual representation of a glare score corresponding to the at least one of the plurality of fabrics on a visual display of a network device.

11. The method of claim 10, wherein the predicted performance metrics comprise at least one of a daylight glare probability value that indicates a maximum daylight glare intensity over a period of time, a maximum daylight glare probability value that indicates a predefined maximum threshold for the daylight glare probability, a spatial daylight autonomy value that indicates an amount of floor space in the building where daylight alone can provide light over a period of time, a spatial daylight autonomy limit value that indicates a maximum spatial daylight autonomy value for the fabrics with a glare summary score higher than zero, a view rating value that indicates an amount of a window that can be unobstructed by the fabrics, a view limit rating value that indicates the maximum spatial daylight autonomy value for the fabrics with the glare summary score higher than zero, a view clarity value that indicates an amount of visibility available through the fabrics, a view preservation rating value that is based on a view rating of the fabrics and indicates an amount of the window that may be unobstructed by the window treatment and a view clarity rating of the fabrics that indicates the amount of visibility available through the fabrics, a direct glare score that can indicate a reduction in glare based on the fabrics, or an angle of the sun.

12. The method of claim 10, wherein the view rating is determined based on the view clarity rating of the fabrics that indicates the amount of visibility available through the fabrics.

13. The method of claim 10, wherein the environmental characteristics associated with the at least one of the building or the location in the building in which the recommended fabric is to be installed comprise at least one of the location of the building, a latitude of the building, a longitude of the building, an orientation of the building, at least one façade of the building on which the window treatment is to be installed, a buffer zone between a window in the building and an occupant's work space, a window size associated with the window in the building, a glass type associated with the window in the building, a window-to-wall ratio for a room in the building, a visible light transmittance for the window in the building, a daylight glare probability value that indicates a maximum daylight glare intensity over a period of time, a maximum daylight glare probability value that indicates a predefined maximum threshold for a daylight glare probability value, a room color, a depth of a room, or a type of space in the building in which the recommended fabric is to be installed.

14. The method of claim 13, wherein the latitude and longitude of the building are based on the location of the building, wherein the window-to-wall ratio is based on the window size, wherein the visible light transmittance for the window is based on the glass type associated with the window in the building, and wherein at least one of the daylight glare probability value or the maximum daylight glare probability value are based on the type of space in the building in which the recommended fabric is to be installed.

15. The method of claim 10, wherein the predicted performance metrics are associated with a front side and a back side of the at least one of the plurality of fabrics.

16. The method of claim 10, further comprising:
receiving the environmental characteristics as input data; and
accessing fabric data that includes fabric characteristics for the plurality of fabrics, and
wherein the predicted performance metrics for each fabric of the plurality of fabrics are determined based on the environmental characteristics and the fabric characteristics.

17. The method of claim 16, wherein the fabric characteristics for each fabric of the plurality of fabrics comprise at least one of an openness factor associated with the fabric, a visible light transmittance associated with the fabric, a color group associated with the fabric, a view clarity rating that indicates an amount of visibility available through the fabric, a solar heat gain associated with the fabric, or a combined solar heat gain associated with the fabric and a glass.

18. The method of claim 10, further comprising:
receiving the environmental characteristics as input data;
determining computed fabric performance input data based on the input data;
sending the computed fabric performance input data to a fabric performance engine; and
receiving the predicted performance metrics as fabric performance output from the fabric performance engine, wherein the predicted performance metrics are determined by receiving the computed fabric performance input data.

19. The method of claim 18, wherein the environmental characteristics comprise at least one of the location of the building, an orientation of the building, at least one façade of the building on which the window treatment is to be installed, a buffer zone between a window in the building and an occupant's work space, a window size associated with the window in the building, a glass type associated with the window in the building, a room color, a depth of a room, or a type of space in the building in which the recommended fabric is to be installed.

20. The method of claim 10, wherein the plurality of fabrics is further ranked according to at least one of a daylight score or a view score, wherein the daylight score indicates a predicted amount of daylight resulting in an interior space from a use of the fabric in the window treatment, and wherein the view score indicates an occupant's view out of a window of the building when the window treatment is installed.

21. The method of claim 20, wherein the view score is based on a view preservation rating that indicates an amount of a window view that can be preserved when the window treatment is used, wherein the view preservation rating is based on a view rating of the fabric that indicates an amount of the window that can be unobstructed by the window treatment and a view clarity rating of the fabric that indicates an amount of visibility available through the fabric.

22. The method of claim 10, wherein the environmental characteristics include data indicating a plurality of façades of the building, and wherein the predicted performance metrics comprise a predicted performance of the window treatment in the building when the window treatment is installed with the plurality of fabrics on each of the plurality of façades.

23. The method of claim 22, wherein the predicted performance metrics are based on a use of each fabric of the plurality of fabrics with the window treatment when the window treatment is installed on each façade of the plurality of façades.

24. The method of claim 10, wherein the window treatment comprises at least one of a manual window treatment or an automated window treatment, and wherein the predicted performance metrics are based on a predicted performance when the fabric is installed in the at least one of the manual window treatment or the automated window treatment.

25. The method of claim 24, wherein ranking the plurality of fabrics further comprises ranking the plurality of fabrics based on the predicted performance metrics when the fabric is installed in the at least one of the manual window treatment or the automated window treatment.

26. The method of claim 24, further comprising:
comparing predicted performance metrics of each fabric of the plurality of fabrics when installed in the automated window treatment to predicted performance metrics of the fabric when installed in the manual window treatment; and
displaying a performance metric of the recommended fabric when installed in the automated window treatment and a performance metric of the recommended fabric when installed in the manual window treatment on the visual display of the network device.

27. The method of claim 10, wherein the recommended fabric is characterized by an openness factor that indicates an amount of open space within the recommended fabric and a visible light transmittance that indicates an amount of visible light allowed to transmit through the recommended fabric, and wherein the openness factor and the visible light transmittance of the recommended fabric result in a daylight glare probability of less than 45%.

28. The method of claim 27, wherein the openness factor and the visible light transmittance of the recommended fabric result in a daylight glare probability of less than 35%.

29. The method of claim 27, wherein the recommended fabric comprises an openness tolerance of less than 1% for a variance of the openness factor.

30. The method of claim 29, wherein the openness tolerance of the recommended fabric is less than 0.5% for the variance of the openness factor.

31. The method of claim 27, wherein the openness factor is between 1% and 10%, the visible light transmittance of the fabric is between 1% and 30%, and the recommended fabric comprises an openness tolerance of equal to or less than 0.5% resulting in a daylight glare probability of between 15% and 35%.

32. A motorized window treatment system for controlling an amount of light entering a space in a building, the system comprising:
a motorized window treatment comprising a drive unit configured to adjust a covering material to control the amount of light entering the space; and
a network device comprising a processor and a display, the network device configured to:
determine, via the processor, predicted performance metrics for each fabric of a plurality of fabrics when used with the motorized window treatment to control daylight in a plurality of environments;
select, via the processor, the predicted performance metrics for the plurality of fabrics that correspond to environmental characteristics associated with at least one of the building or a location in the building in which a recommended fabric is to be installed;
rank, via the processor, the plurality of fabrics based upon the selected predicted performance metrics that correspond to the environmental characteristics associated with the at least one of the building or the location in the building, wherein the plurality of fabrics are ranked according to glare scores that indicate a predicted amount of glare resulting from use of respective ones of the plurality of fabrics in the motorized window treatment, wherein a glare score for each fabric of the plurality of fabrics is computed between a predefined high-level threshold and a predefined low-level threshold for the plurality of fabrics, wherein the glare score for each fabric is based on a value of at least one predicted performance metric for the fabric relative to values of the at least one predicted performance metric for the plurality of fabrics; and
display, via the display, at least one fabric of the plurality of fabrics as the recommended fabric for being installed in the building and a visual representation of a glare score corresponding to the at least one fabric, wherein the at least one fabric is displayed based on the ranking of the plurality of fabrics.

33. The motorized window treatment system of claim 32, wherein the network device is further configured to:
receive, via the processor, the environmental characteristics as input data; and
access, via the processor, fabric data that includes fabric characteristics for the plurality of fabrics; and
determine, via the processor, the predicted performance metrics for each fabric of the plurality of fabrics based on the environmental characteristics and the fabric characteristics.

34. The motorized window treatment system of claim 32, wherein the network device is further configured to:
receive, via the processor, the environmental characteristics as input data;
determine, via the processor, computed fabric performance input data based on the input data;
send, via the processor, the computed fabric performance input data to a fabric performance engine; and
receive, via the processor, the predicted performance metrics as fabric performance output from the fabric performance engine, wherein the predicted performance metrics are determined by receiving the computed fabric performance input data.

35. The motorized window treatment system of claim 32, wherein the network device is further configured to rank, via the processor, the plurality of fabrics according to at least one of a daylight score or a view score, wherein the daylight score indicates a predicted amount of daylight resulting in an interior space from a use of the fabric in the motorized window treatment, and wherein the view score indicates an occupant's predicted amount of view out of at least one window when the motorized window treatment is installed.

36. The motorized window treatment system of claim 32, further comprising:
a system controller configured to automatically control the drive unit of the motorized window treatment in response to at least one of a timeclock schedule or a sensor.

37. A motorized window treatment for controlling an amount of light entering a space in a building, the motorized window treatment comprising:
an electronic drive unit of the motorized window treatment configured to control the amount of light entering the space in the building; and
a fabric material, wherein the electronic drive unit is further configured to raise or lower the fabric material to control the amount of light entering the space in the building, and wherein the fabric material is characterized by an openness factor that indicates an amount of open space within the fabric material and a visible light transmittance that indicates an amount of visible light allowed to transmit through the fabric material, wherein the openness factor is between 1% and 10%, the visible light transmittance of the fabric material is between 1% and 30%, and the fabric material comprises an openness tolerance of equal to or less than 0.5%, and wherein the openness factor and the visible light transmittance of the fabric material result in a daylight glare probability of less than 45%.

38. The motorized window treatment of claim 37, wherein the fabric material comprises an openness tolerance of less than 1% for variance of the openness factor.

39. The motorized window treatment of claim 38, wherein the openness tolerance of the fabric material is less than 0.5% for the variance of the openness factor.

40. The motorized window treatment of claim 37, wherein the openness factor and the visible-light transmittance of the fabric material result in a daylight glare probability of less than 35%.

* * * * *